United States Patent
Matsumoto et al.

(10) Patent No.: US 6,794,717 B2
(45) Date of Patent: Sep. 21, 2004

(54) SEMICONDUCTOR DEVICE AND METHOD OF MANUFACTURING THE SAME

(75) Inventors: Takuji Matsumoto, Tokyo (JP);
Shigenobu Maeda, Tokyo (JP);
Toshiaki Iwamatsu, Tokyo (JP);
Takashi Ipposhi, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 09/986,004

(22) Filed: Nov. 7, 2001

(65) Prior Publication Data

US 2002/0109187 A1 Aug. 15, 2002

(30) Foreign Application Priority Data

Feb. 13, 2001 (JP) ........................................ 2001-035180

(51) Int. Cl.[7] .............................................. H01L 27/01
(52) U.S. Cl. ...................... 257/347; 257/350; 257/351; 257/371
(58) Field of Search ................................ 257/347, 350, 257/351, 371

(56) References Cited

U.S. PATENT DOCUMENTS

| | | | | |
|---|---|---|---|---|
| 4,447,823 A | * | 5/1984 | Maeguchi et al. ............. | 357/23 |
| 5,349,225 A | * | 9/1994 | Redwine et al. ............. | 257/336 |
| 5,767,549 A | | 6/1998 | Chen et al. | |
| 5,811,855 A | | 9/1998 | Tyson et al. | |
| 6,100,570 A | * | 8/2000 | Saito ........................... | 257/446 |
| 6,271,541 B2 | * | 8/2001 | Yamaguchi et al. .......... | 257/66 |
| 6,314,021 B1 | * | 11/2001 | Maeda et al. ............. | 365/185.1 |
| 6,429,505 B1 | * | 8/2002 | Kunikiyo ..................... | 257/577 |
| 6,455,894 B1 | * | 9/2002 | Matsumoto et al. ........ | 257/347 |
| 6,545,318 B1 | * | 4/2003 | Kunikiyo ..................... | 257/349 |
| 2002/0105032 A1 | * | 8/2002 | Lee et al. ..................... | 257/349 |
| 2002/0110989 A1 | * | 8/2002 | Yamaguchi et al. ........ | 438/311 |
| 2003/0206472 A1 | * | 11/2003 | Hidaka et al. ............... | 365/205 |

FOREIGN PATENT DOCUMENTS

| | | | |
|---|---|---|---|
| DE | 199 62053 | * | 7/2000 |
| EP | 962 988 | * | 12/1999 |
| EP | 1 115158 | * | 7/2002 |
| JP | 58-124243 | * | 7/1983 |
| JP | 1-268063 | * | 10/1989 |
| JP | 4-259259 | * | 9/1992 |
| JP | 8-228145 | | 3/1996 |
| JP | 11-340472 | | 12/1999 |
| JP | 2000-174283 | | 6/2000 |
| JP | 2000-243973 | | 9/2000 |
| JP | 2001-111056 | * | 4/2001 |
| JP | 2001-284599 | * | 10/2001 |
| KR | 1999-76552 | | 10/1999 |
| KR | 2000-47907 | | 7/2000 |
| KR | 2000-48319 | | 7/2000 |

OTHER PUBLICATIONS

S. Maeda, et al. Impact of 0.18um SOI CMOS Technology using Hybrid Trench Isolation with High Resistivity Substrate on Embedded RF/Analog Applications, 2000 Symposium on VLSI Technology Digest of Technical Papers, pp. 154–155.

* cited by examiner

Primary Examiner—Nathan J. Flynn
Assistant Examiner—Ahmed N. Sefer
(74) Attorney, Agent, or Firm—Oblon, Spivak, McClelland, Maier & Neustadt, P.C.

(57) ABSTRACT

It is an object to provide a semiconductor device having an SOI structure in which an electric potential of a body region in an element formation region isolated by a partial isolation region can be fixed with a high stability. A MOS transistor comprising a source region (51), a drain region (61) and an H gate electrode (71) is formed in an element formation region isolated by a partial oxide film (31). The H gate electrode (71) electrically isolates a body region (13) formed in a gate width W direction adjacently to the source region (51) and the drain region (61) from the drain region (61) and the source region (51) through "I" in a transverse direction (a vertical direction in the drawing), a central "-" functions as a gate electrode of an original MOS transistor.

11 Claims, 49 Drawing Sheets

F I G . 3
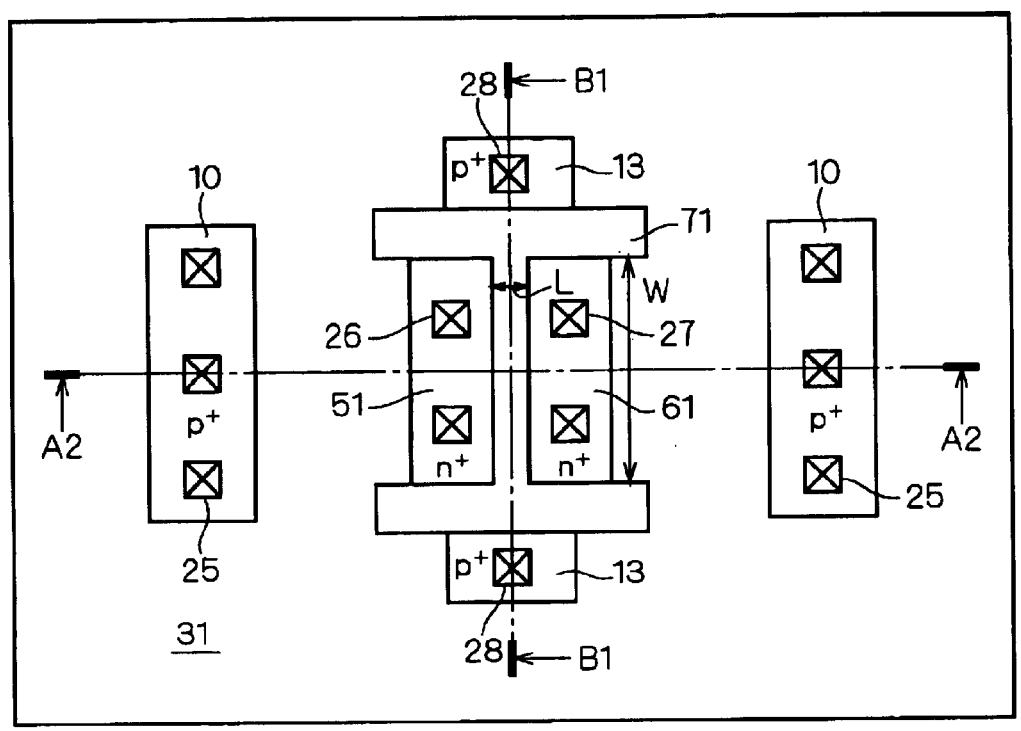

F I G . 1 0
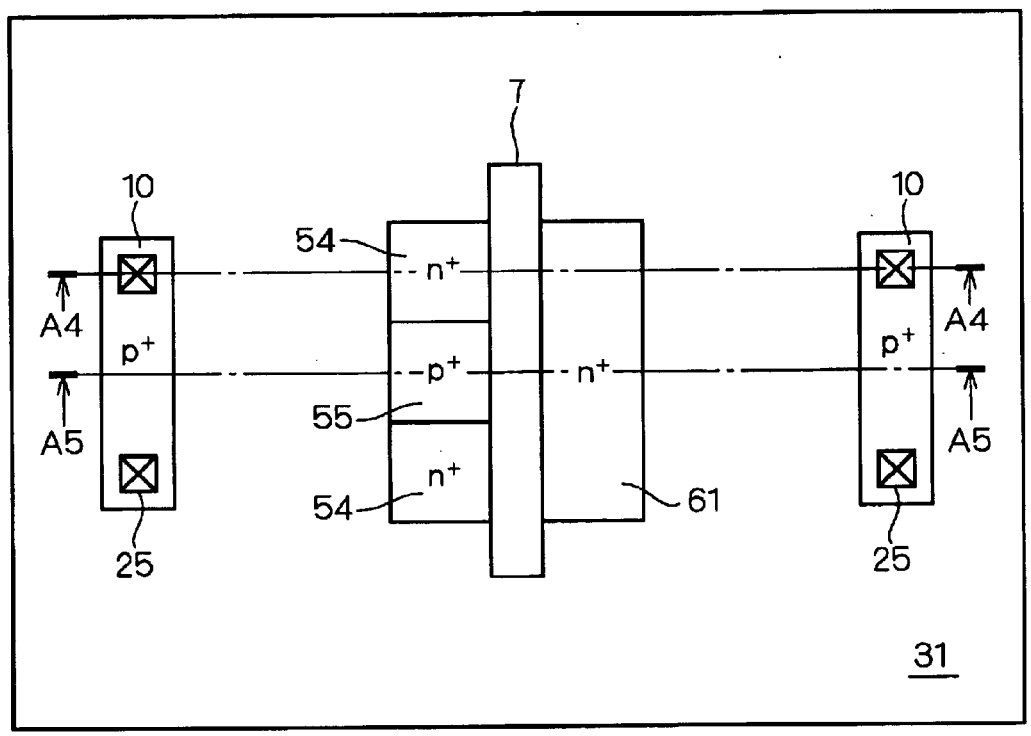

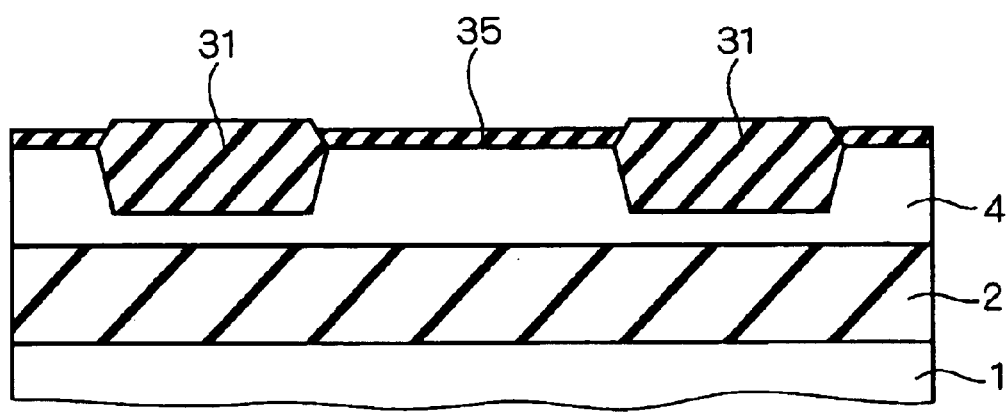
F I G . 4 2

SEMICONDUCTOR DEVICE AND METHOD OF MANUFACTURING THE SAME

BACKGROUND OF THE INVENTION

1. Field of the Invention

The present invention relates to a semiconductor device having an SOI structure and a method of manufacturing the semiconductor device.

2. Description of the Background Art

Attention has recently been paid to a semiconductor device referred to as an SOI (Silicon-On-Insulator) device to be a high-speed device having low power consumption.

The SOI device is fabricated on an SOI substrate having an SOI structure in which a buried oxide film is interposed between an SOI layer and a silicon substrate. In particular, an SOI device in which an SOI layer to be an upper silicon layer has a small thickness (up to approximately several $\mu$m) is referred to as a thin film SOI device to which attention has been paid and has been expected for application to an LSI for mobile equipment. Conventionally, an SOI element (a (semiconductor) element formed on an SOI layer having an SOI structure) penetrates through Si (silicon) of the SOI layer and is completely isolated through an oxide film for isolation formed over the buried oxide film.

The complete isolation technique is characterized by being latch up free (latch-up is not caused), and resistant to noise and the like because the element is electrically isolated completely from other elements. However, since a transistor is operated in an electrical floating state, there is a problem in that a frequency dependency is caused on a delay time and a floating-body effect, for example, a kink effect in which a hump is generated on a drain current-drain voltage characteristic or the like. In order to suppress the floating-body effect, an isolation oxide film (partial oxide film) is formed in an upper layer portion so as not to come in contact with the buried oxide film and constitutes a partial isolation region together with a part of an SOI layer in a lower layer portion and a body terminal is provided in a body region formed in a region isolated in the partial isolation region. Consequently, a partial isolation technique capable of fixing a substrate potential (body potential) through the SOI layer provided under the partial oxide film is effective. However, there is a problem in that the partial isolation technique does not have the latch up free which is the advantage of the complete isolation technique.

Therefore, there has been developed a partial isolation and complete isolation combination technique having both advantages. In the partial and complete isolation combination technique, trench depths are varied for the partial isolation and complete isolation combination. For this reason, after an oxide film of an isolation oxide film is provided and is then subjected to a CMP processing, dishing is generated in a complete isolation portion having a great trench depth differently from the partial isolation. Accordingly, there is a problem in that the shape of an important isolation edge for the reliability of a gate oxide film is varied between the partial isolation and the complete isolation. In the combination process, moreover, the isolation edge of the complete isolation is lowered so that a threshold voltage of a MOS transistor is locally dropped in an edge portion. Therefore, there is a problem in that a leakage current might be increased.

In only the conventional device, moreover, a distance from the body terminal is varied for each transistor. Therefore, there is a problem in that a body resistance is varied, resulting in a variation in a threshold voltage.

In addition, there is a problem in that a body potential cannot always be fixed with a high stability by the partial isolation technique for fixing the body potential through the SOI layer provided under the partial oxide film.

SUMMARY OF THE INVENTION

A first aspect of the present invention is directed to a semiconductor device including an SOI structure having a semiconductor substrate, a buried insulating layer and an SOI layer, comprising a MOS transistor provided in an element formation region of the SOI layer, and a partial isolation region provided in the SOI layer and serving to isolate the element formation region, the partial isolation region including a partial insulating film provided in an upper layer portion of the SOI layer and a partial insulating film lower semiconductor region to be a part of the SOI layer present in a lower layer portion of the SOI layer, the MOS transistor including source and drain regions of a first conductivity type selectively formed in the SOI layer, respectively, a gate electrode having a gate electrode main part formed through a gate oxide film on a region of the SOI layer between the source and drain regions, and a body region having a body region main part to be a region of a second conductivity type of the SOI layer between the source and drain regions and a body region potential setting portion electrically connected from the body region main part in the element formation region and capable of externally fixing an electric potential.

A second aspect of the present invention is directed to the semiconductor device according to the first aspect of the present invention, wherein the body region potential setting section includes a body region source/drain adjacent portion in a gate width direction adjacently to the source and drain regions and extended in a gate length direction from the body region main part, and the gate electrode further has a gate extension region extended in the gate length direction from an end of the gate electrode main part and formed on a part of the body region source/drain adjacent portion, and serving to electrically block the body region source/drain adjacent portion and the source and drain regions through the gate extension region.

A third aspect of the present invention is directed to the semiconductor device according to the second aspect of the present invention, wherein the body region source/drain adjacent portion includes a first body region source/drain adjacent portion extended in a first direction from the body region main part and a second body region source/drain adjacent portion extended in a second direction opposite to the first direction from the body region main part, and the gate extension region includes a first gate extension region formed on a vicinity of the first body region source/drain adjacent portion and a second gate extension region extended on the second body region source/drain adjacent portion.

A fourth aspect of the present invention is directed to the semiconductor device according to the second aspect of the present invention, wherein the body region source/drain adjacent portion includes one body region source/drain adjacent portion, and the gate extension region includes one gate extension region formed on a vicinity of the body region source/drain adjacent portion.

A fifth aspect of the present invention is directed to the semiconductor device according to the second aspect of the present invention, wherein the body region source/drain adjacent portion has a high concentration region having a higher impurity concentration of a second conductivity type than that in other regions over a region provided apart from the gate extension region by a predetermined distance.

A sixth aspect of the present invention is directed to the semiconductor device according to the second aspect of the present invention, wherein the gate extension region includes a gate extension region having an impurity concentration of the second conductivity type of $5 \times 10^{18}$ cm$^{-3}$ or less.

A seventh aspect of the present invention is directed to the semiconductor device according to the first aspect of the present invention, wherein the body region potential setting portion includes a semiconductor region for body fixation of the second conductivity type formed together with the source region.

An eighth aspect of the present invention is directed to the semiconductor device according to the first aspect of the present invention, wherein the partial isolation film lower semiconductor region has the second conductivity type and is formed in contact with the body region, the semiconductor device further comprising an element formation region outside body region of a first conductivity type provided outside the element formation region of the SOI layer and being capable of externally fixing an electric potential, the element formation region outside body region being formed in contact with the partial insulating film lower semiconductor region.

A ninth aspect of the present invention is directed to the semiconductor device according to the first aspect of the present invention, wherein the source and drain regions have such depths as to reach the buried insulating layer.

A tenth aspect of the present invention is directed to the semiconductor device according to the first aspect of the present invention, wherein the source and drain regions have such depths that a depletion layer extended from the source and drain regions does not reach the buried insulating layer during a normal operation.

An eleventh aspect of the present invention is directed to the semiconductor device according to the first aspect of the present invention, wherein the source and drain regions have such depths that the buried insulating layer is not reached and a depletion layer extended from the drain region reaches the buried insulating layer during a normal operation.

A twelfth aspect of the present invention is directed to the semiconductor device according to the first aspect of the present invention, wherein the drain region has a greater depth than that of the source region and has such a depth that a depletion layer extended from the drain region reaches the buried insulating layer during a normal operation.

A thirteenth aspect of the present invention is directed to a semiconductor device having an SOI structure including a semiconductor substrate, a buried insulating layer and an SOI layer, comprising first and second semiconductor regions of a predetermined conductivity type provided in an element formation region of the SOI layer, and a partial insulating film provided in an upper layer portion of the element formation region and a partial insulating film lower semiconductor region of a predetermined conductivity type to be a part of the element formation region in a lower layer portion of the element formation region, wherein the partial insulating film lower semiconductor region is electrically connected to the first and second semiconductor regions to constitute a resistive element.

A fourteenth aspect of the present invention is directed to the semiconductor device according to the thirteenth aspect of the present invention, further comprising a complete insulating film provided through the SOI layer for isolating the element formation region.

A fifteenth aspect of the present invention is directed to the semiconductor device according to the thirteenth aspect of the present invention, wherein the element formation region other than the partial insulating film and the first and second semiconductor regions is a part of a region where the resistive element is to be formed.

A sixteenth aspect of the present invention is directed to the semiconductor device according to the thirteenth aspect of the present invention, wherein the resistive element includes a load resistor of an SRAM memory cell.

A seventeenth aspect of the present invention is directed to a semiconductor device having an SOI structure including a semiconductor substrate, a buried insulating layer and an SOI layer, comprising first and second element formation regions provided in the SOI layer, a partial isolation region including a partial insulating film provided in an upper layer portion of the SOI layer and a semiconductor region to be a part of the SOI layer which is provided under the partial insulating film and serving to isolate the first and second element formation regions from each other, and first and second MOS transistors formed in the first and second element formation regions, respectively, wherein at least one of a structure of a body region, a structure of a gate electrode and presence/absence of body potential fixation in the first and second MOS transistors is varied to make transistor characteristics of the first and second MOS transistors different from each other.

An eighteenth aspect of the present invention is directed to a semiconductor device having an SOI structure including a semiconductor substrate, a buried insulating layer and an SOI layer, comprising first and second element formation regions provided in the SOI layer, a partial isolation region including a partial insulating film provided in an upper layer portion of the SOI layer and a semiconductor region to be a part of the SOI layer which is provided under the partial insulating film and serving to isolate the first element formation region from other regions, a complete isolation region including a complete insulating film provided through the SOI layer and serving to isolate the second element formation region from other regions, a first MOS transistor formed in the first element formation region, and a second MOS transistor formed in the second element formation region, wherein the first and second MOS transistors have different transistor characteristics.

A nineteenth aspect of the present invention is directed to a method of manufacturing a semiconductor device comprising the steps of (a) preparing an SOI substrate including an SOI structure having a semiconductor substrate, a buried insulating layer and an SOI layer, (b) selectively forming a partial insulating film in an upper layer portion of the SOI layer, the partial insulating film constituting a partial isolation region for isolating first and second element isolation regions in the SOI layer together with a semiconductor region to be a part of the SOI layer which is provided under the partial insulating film, and (c) forming first and second MOS transistors in the first and second element formation regions, wherein at the step (c), at least one of a structure of a body region, a structure of a gate electrode and presence/absence of body potential fixation in the first and second MOS transistors is varied to make transistor characteristics of the first and second MOS transistors different from each other.

A twentieth aspect of the present invention is directed to a method of manufacturing a semiconductor device comprising the steps of (a) preparing an SOI substrate including an SOI structure having a semiconductor substrate, a buried insulating layer and an SOI layer, (b) selectively forming a partial insulating film in an upper layer portion of the SOI layer, the partial insulating film constituting a partial isolation region for isolating the first element isolation region from other regions together with a semiconductor region to be a part of the SOI layer which is provided under the partial insulating film, (c) selectively forming a complete insulating film through the SOI layer, the complete isolating film constituting a complete isolation region for isolating the second element formation region from other regions, (d) forming a first MOS transistor in the first element formation region, and (e) forming a second MOS transistor in the second element formation region, wherein the steps (d) and (e) are performed such that the first and second MOS transistors have different transistor characteristics.

According to the first aspect of the present invention, the body region potential setting portion capable of externally fixing an electric potential is provided in the element formation region. Therefore, it is possible to fix a body potential to be an electric potential of the body region main part with a high stability.

According to the second aspect of the present invention, the body region source/drain adjacent portion and the source and drain regions are electrically blocked by the gate extension region of the gate electrode. Consequently, the presence of the body region source/drain adjacent portion does not affect the operation of the MOS transistor and the body potential can be fixed with a high stability.

According to the third aspect of the present invention, the body potential can be fixed in the first and second body region source/drain adjacent portions, respectively. Correspondingly, it is possible to fix the body potential with a higher stability.

According to the fourth aspect of the present invention, it is possible to fix the body potential with a high stability by one body region source/drain adjacent portion while minimizing a gate capacitance in one gate extension region.

According to the fifth aspect of the present invention, the body region source/drain adjacent portion has a high concentration region having a higher impurity concentration than that in other regions over the region provided apart from the gate extension region by a predetermined distance. Therefore, when the impurity of the second conductivity type for the formation of a high concentration region is to be implanted, it is possible to reliably prevent the impurity of the second conductivity type from being implanted into the gate extension region.

According to the sixth aspect of the present invention, the gate extension region includes a gate extension region having an impurity concentration of the second conductivity type of $5 \times 10^{18}$ cm$^{-3}$ or less. Therefore, it is possible to prevent a threshold voltage of the MOS transistor from being varied.

According to the seventh aspect of the present invention, the electric potential is fixed in the semiconductor region for body potential fixation of the second conductivity type which is formed together with the source region. Consequently, it is possible to fix the body potential with a high stability. The presence of the semiconductor region for body potential fixation does not affect the MOS transistor for being operated by setting the body region and the source region to have the same electric potential.

According to the eighth aspect of the present invention, it is possible to fix the electric potential of the body region from the element formation region outside body region through the partial isolating film lower semiconductor region in addition to the body region potential setting portion.

According to the ninth aspect of the present invention, the source and drain regions in the MOS transistor have such depths as to reach the buried insulating layer. Therefore, a pn junction is not formed on respective bottom faces. Consequently, a junction leakage can be suppressed.

According to the tenth aspect of the present invention, the source and drain regions in the MOS transistor have such depths that the depletion layer extended from the source and drain regions does not reach the buried insulating layer during the normal operation. Therefore, in the case in which the electric potential of the body region is to be fixed on the outside of the element formation region, the body potential fixation can be carried out with a high stability.

According to the eleventh aspect of the present invention, the source and drain regions in the MOS transistor do not reach the buried insulating layer and the depletion layer extended from the drain region has such a depth as to reach the buried insulating layer during the normal operation. Therefore, it is possible to fix the body potential on the outside of the element formation region while reducing a junction capacitance.

According to the twelfth aspect of the present invention, the drain region has a greater depth than that of the source region and has such a depth that a depletion layer extended from the drain region reaches the buried insulating layer during a normal operation. Therefore, it is possible to reduce a junction capacitance in the drain region while fixing the body potential through the source region on the outside of the element formation region.

According to the thirteenth aspect of the present invention, the partial insulating film lower semiconductor region of a predetermined conductivity type to be a part of the SOI layer provided under the partial insulating film is a component of a resistive element. Therefore, it is possible to obtain a resistive element having a high resistance value with a comparatively small formation area. As a result, it is possible to constitute a semiconductor integrated circuit having a high degree of integration.

According to the fourteenth aspect of the present invention, it is possible to completely isolate the resistive element from the outside through the complete insulating film.

According to the fifteenth aspect of the present invention, the element formation region other than the partial insulating film and the first and second semiconductor regions is a part of a region where the resistive element is to be formed. Consequently, it is possible to prevent the resistance value of the resistive element from being varied.

According to the sixteenth aspect of the present invention, the resistive element is used as the load resistor of an SRAM. Consequently, it is possible to constitute an SRAM having a high degree of integration.

According to the seventeenth aspect of the present invention, at least one of a structure of a body region, a structure of a gate electrode and presence of body potential fixation in the first and second MOS transistors is varied to make transistor characteristics of the first and second MOS transistors different from each other. Consequently, it is possible to constitute a high functional semiconductor integrated circuit comprising first and second MOS transistors.

According to the eighteenth aspect of the present invention, the transistor characteristic is varied between the first MOS transistor isolated by the partial isolation region and the second transistor isolated by the complete isolation region. Consequently, it is possible to constitute a high functional semiconductor integrated circuit comprising first and second MOS transistors.

According to the nineteenth aspect of the present invention, at least one of a structure of a body region, a structure of a gate electrode and presence of body potential fixation in the first and second MOS transistors is varied to make transistor characteristics of the first and second MOS transistors different from each other. Consequently, it is possible to constitute a high functional semiconductor integrated circuit comprising first and second MOS transistors.

According to the twentieth aspect of the present invention, the transistor characteristic is varied between the first MOS transistor isolated by the partial isolation region and the second transistor isolated by the complete isolation region. Consequently, it is possible to constitute a high functional semiconductor integrated circuit comprising first and second MOS transistors.

In order to solve the above-mentioned problems, it is an object of the present invention to provide a semiconductor device having an SOI structure which can fix a body potential with a high stability in a body region over an element formation region isolated by a partial isolation region and a semiconductor device capable of constituting a high functional semiconductor integrated circuit for a partial isolation or a partial isolation and complete isolation combination, and a method of manufacturing the semiconductor device.

These and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a plan view showing a planar structure of a semiconductor device according to a first embodiment (first mode) of the present invention, FIG. 10 is a plan view showing a planar structure of a semiconductor device according to a third embodiment of the present invention.

DESCRIPTION OF THE PREFERRED EMBODIMENTS

Figure 1:
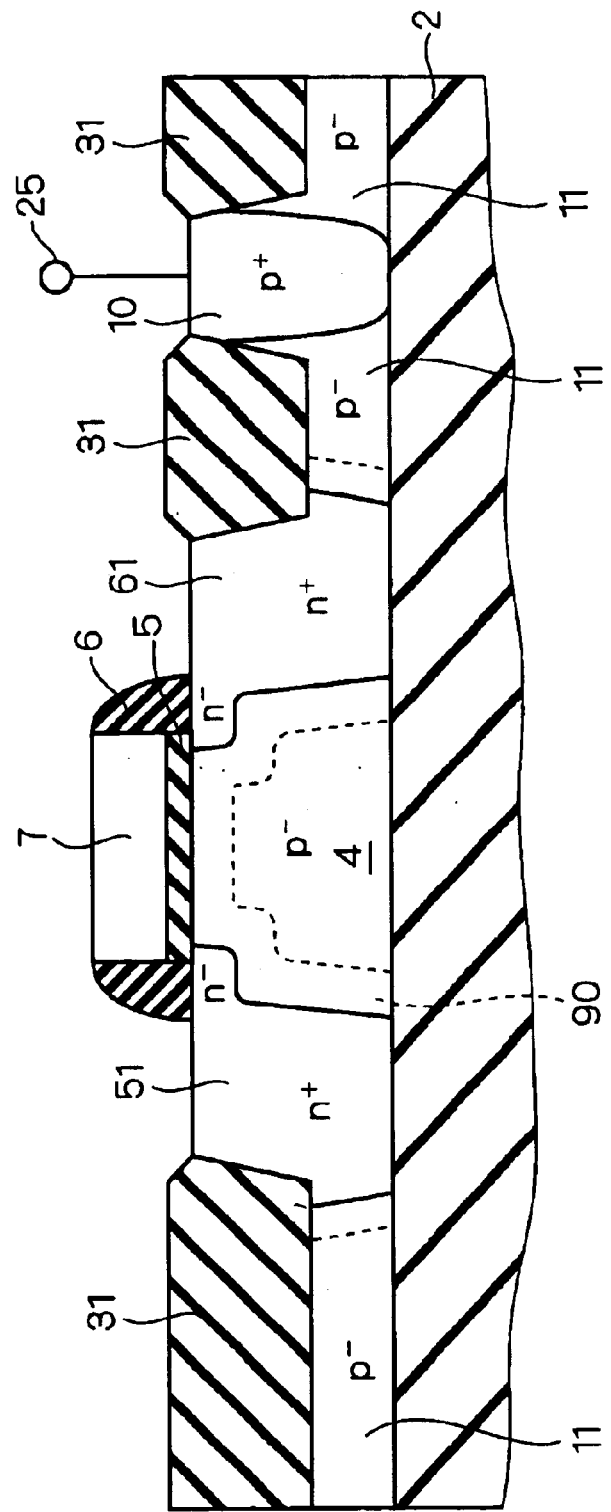
FIG. 1 is a sectional view showing an example of a conventional PDSOI-MOSFET.

<Summary of the Invention>
(Technical Background)

A partial isolation technique has an advantage in that an electric potential of a body region provided outside an element formation region through a partial isolation region can be set externally and a substrate potential can be thereby fixed through an SOI layer provided under a partial oxide film. The advantage is not always sufficient for a high breakdown voltage element or a device requiring high reliability of a hot carrier. Since the SOI layer provided under the partial oxide film has a small thickness, a finite body resistance is present. Also in the device, therefore, a kink is sometimes generated through the body resistance in a high voltage region. Consequently, the partial isolation technique has a technical background in which the reliability of a hot carrier and the frequency dependency of a delay time are not always sufficient.

In the partial isolation technique or a partial isolation and complete isolation combination technique, an H gate electrode and a T gate electrode which will be described below in detail are used in a portion where the reliability is particularly required in order to prevent the reliability of a gate oxide film from being reduced due to a variation in an isolation edge. Consequently, it is necessary to provide a semiconductor device capable of enhancing the reliability for body potential fixation, and furthermore, increasing an edge leakage current.

(Single Kind of Transistor)

In a partial isolation having a body terminal, a single kind of transistor using one of an H gate electrode, a T gate electrode and a source—tied structure which will be described below in detail is utilized so that a stability for fixing a body potential can be further enhanced and the problems of a hot carrier and the frequency dependency of a delay time can be further improved. By such a method, however, a speed of a circuit is reduced. Therefore, it is desirable that a conventional device (a device using a gate electrode having an ordinary structure or the like) should be utilized in a portion where a high speed is required.

(Combination of Plural Kinds of Transistors)

Moreover, when a body terminal is not partially provided and a transistor is operated in a floating state, a threshold voltage can be dropped. Therefore, a transistor having a large drain current can be fabricated. Accordingly, a transistor having a body floating structure is provided in a circuit together with a transistor having a body fixing structure through the body terminal so that a high-speed circuit having low power consumption can be fabricated.

In the partial isolation technique, moreover, a variation in a threshold due to a difference in a distance from the body terminal can be suppressed by using the H gate electrode, the T gate electrode and the source-tied structure in which the body terminal is to be provided in respective transistors. Furthermore, when a floating structure using no body terminal is utilized, it is apparent that a variation in a threshold due to a body resistance can be suppressed. The floating structure has a disadvantage in that a threshold voltage has a frequency dependency.

By a combination of plural kinds of transistors having various features, thus, it is possible to provide a high functional device in respect of design.

<First Embodiment>
(Conventional PDSOI-MOSFET)

Figure 2:
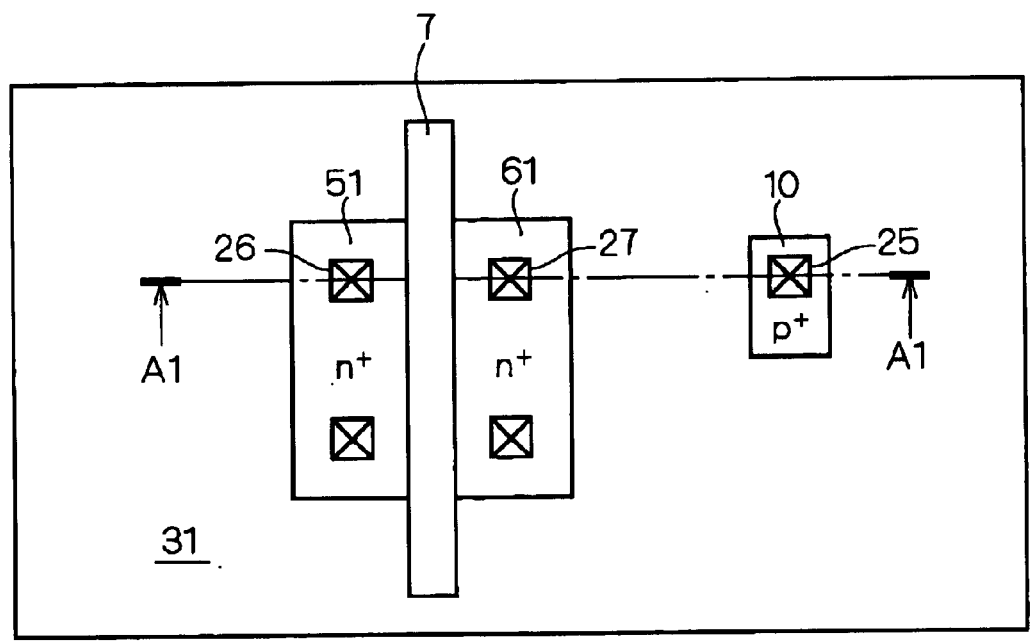
FIG. 2 is a plan view showing an example of the conventional PDSOI-MOSFET.

FIG. 1 is a sectional view showing an example of a PD (Partially-Depleted) SOI-MOSFET to be one of conventional MOS transistors, and FIG. 2 is a plan view showing an example of the conventional PDSOI-MOSFET. A sectional taken along a line A1—A1 in FIG. 2 corresponds to FIG. 1.

The PDSOI-MOSFET has such a feature that a depletion layer 90 provided under a gate electrode 7 does not reach a buried oxide film 2 as shown in FIG. 1. Because of such a feature, the PDSOI-MOSFET has an excellent controllability of a threshold voltage.

As shown in FIGS. 1 and 2, an SOI layer 4 is formed on the buried oxide film 2 provided on a semiconductor substrate (not shown). Consequently, an SOI substrate having an SOI structure can be implemented. The SOI layer 4 is isolated through a partial isolation region including a partial oxide film 31 and a p well region 11 provided under the partial oxide film 31.

A source region 51 and a drain region 61 which are selectively formed on the SOI layer 4 have such depths as to reach a back face of the SOI layer 4 (a surface of the buried oxide film 2) from a surface thereof, respectively.

A gate oxide film 5 is formed on the SOI layer 4 between the source region 51 and the drain region 61, and a gate electrode 7 is formed on the gate oxide film 5. Moreover, a side wall 6 is formed on a side wall of the gate electrode 7. Then, a source terminal 26 and a drain terminal 27 are provided on the source region 51 and the drain region 61, respectively.

Moreover, a body region 10 (a body region outside an element formation region) is isolated by the partial oxide film 31 and the p well region 11 provided thereunder and is formed from the surface of the SOI layer 4 to the back faze thereof. The body region 10 is electrically connected to a main part of the body region to be the 501 layer 4 provided under the gate electrode 7 through the p well region 11.

Accordingly, a predetermined electric potential is applied to a body terminal 25 provided on the body region 10 to fix a body of the PDSOI-MOSFET shown in FIG. 1 (to fix a channel potential in the SOI layer 4 provided under the gate oxide film 5). Consequently, the above-mentioned floating-body effect can be suppressed.

(PDSOI-MOSFET according to First Embodiment)

Figure 4:
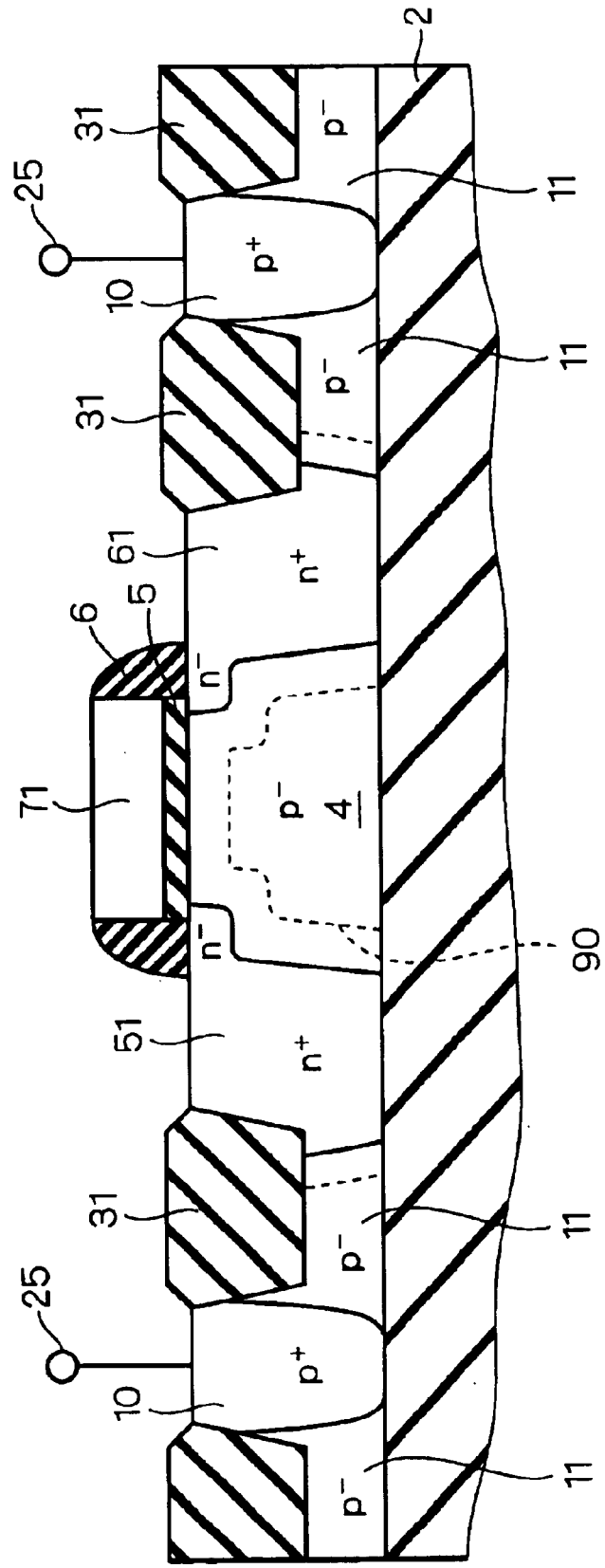
FIG. 4 is a sectional view showing a section taken along a line A2—A2 in FIG. 3.
Figure 5:
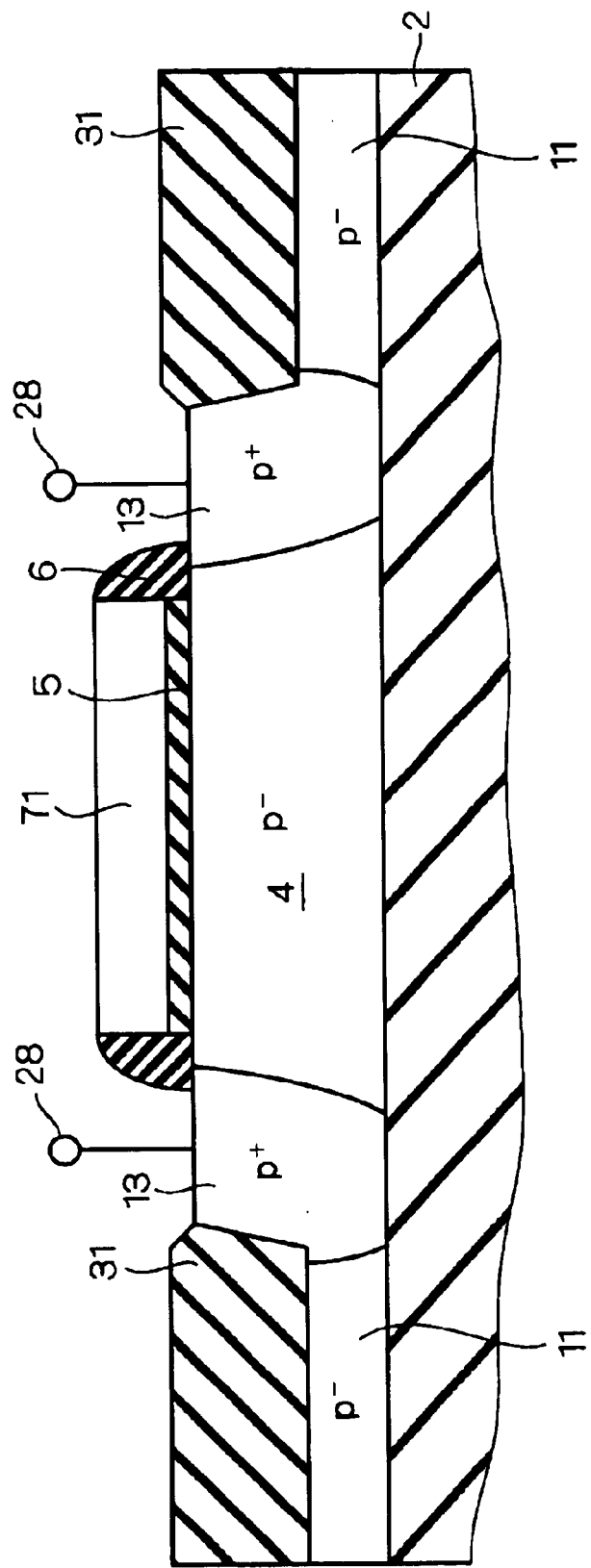
FIG. 5 is a sectional view showing a section taken along a line B1—B1 in FIG. 3.

FIG. 3 is a plan view showing a planar structure of a semiconductor device according to a first embodiment of the present invention, FIG. 4 is a sectional view showing a section taken along a line A2—A2 in FIG. 3, and FIG. 5 is a sectional view showing a section taken along a line B1—B1 in FIG. 3.

The semiconductor device according to the first embodiment is provided on an SOI layer isolated partially and provides body fixation through a PDSOI-MOSFET having an H gate electrode.

As shown in FIG. 3, an H gate electrode 71 electrically isolates a body region 13 formed in a gate width W direction adjacently to a source region 51 and a drain region 61 from the drain region 61 and the source region 51 through "I" (a gate extension region, and source/drain adjacent portions of first and second body regions) in a transverse direction (a vertical direction in the drawing), and a central "–" (a main part of a gate electrode) functions as a gate electrode of an original MOS transistor. A p⁻body region is formed under the "I" of the H gate electrode 71 in the transverse direction (the vertical direction in the drawing) through an insulating film.

As shown in FIGS. 3 and 5, two body regions 13 and 13 (the source/drain adjacent portions of the first and second body regions) are extended in a first direction along a gate length direction and a second direction opposite thereto from the main part of the body region to be the SOI layer 4 provided under the main part of the gate electrode of the H gate electrode 71 in a gate width direction adjacently to the source region 51 and the drain region 61.

Accordingly, the source region 51 and drain region 61 and the body regions 13 and 13 are electrically blocked through the "I" of the H gate electrode 71 in the transverse direction and a body potential obtained from a body terminal 28 is not directly transmitted to the drain region 61 and the source region 51.

The source region 51 and the drain region 61 which are selectively formed on the SOI layer 4 have such depths as to reach a back face of the SOI layer 4 from a surface thereof, respectively.

A gate oxide film 5 is formed on the SOI layer 4 between the source region 51 and the drain region 61, the central "–" portion of the H gate electrode 71 is formed on the gate oxide film 5, and a side wall 6 is formed on a side wall of the gate electrode 71. Then, a source terminal 26 and a drain terminal 27 (which are not shown in FIG. 4) are provided on the source region 51 and the drain region 61, respectively.

Moreover, a body region 10 is isolated by a partial isolation region of a partial oxide film 31 and a p well region 11 provided thereunder and is formed from the surface of the SOI layer 4 to the back face thereof. The body region 10 is electrically connected to the main part of the body region to be the SOI layer 4 provided under the gate electrode 71 through the p well region 11.

As described above, furthermore, the body region 13 is formed adjacently to the main part of the body region (the channel region) to be the SOI layer 4 provided under the gate oxide film 5.

Accordingly, a predetermined electric potential is applied to the body terminal 28 provided on the body region 13 in addition to a body terminal 25 provided on the body region 10. Consequently, the body fixation of the PDSOI-MOSFET according to the first embodiment can be carried out. Therefore, a body potential to be the electric potential of the main part of the body region can be fixed stably so that the floating-body effect can be suppressed considerably.

The PDSOI-MOSFET having the above-mentioned structure according to the first embodiment has such a feature that a depletion layer 90 provided under the central "–" portion of the H gate electrode 71 does not reach a buried oxide film 2. Because of such a feature, the PDSOI-MOSFET has an excellent controllability of a threshold voltage.

Therefore, the semiconductor device according to the first embodiment has the H gate electrode structure and is provided with the body regions 13 and 13 in a region where the PDSOI-MOSFET is to be formed. Consequently, it is possible to decrease a body resistance than that in the conventional PDSOI-MOSFET shown in FIGS. 1 and 2 and to fix a body potential having a high stability. This respect will be described below in detail.

In the conventional PDSOI-MOSFET shown in FIGS. 1 and 2, the body terminal 25 and the channel region are electrically connected through the thin p well region 11 provided under a partial isolation. Therefore, the body resistance is comparatively high and a transistor characteristic is easily varied depending on a distance from the body terminal 25.

On the other hand, in the structure according to the first embodiment, the body terminal 28 can be provided on the body region 13 formed in the vicinity of the source region 51 and the drain region 61 in the PDSOI-MOSFET formation region in addition to the body terminal 25 on the body region 10 provided through the partial isolation regions (the partial oxide film 31 and the p well region 11 provided thereunder). These two types of body terminals 25 and 28 can reduce the body resistance value and can effectively suppress a variation in the transistor characteristic.

Moreover, a reduction in the body resistance can raise a drain breakdown voltage. To the contrary, in the case in which the thickness of the p well region 11 provided under the partial oxide film 31 is proportional to that of the SOI layer 4 and the same body resistance is set, the thickness of the SOI layer 4 can be reduced by employing the H gate electrode structure.

When the thickness of the SOI layer 4 is reduced, there is a possibility that a junction capacitance of a line component of a source-drain (a longitudinal component) might be reduced, resulting in an increase in a speed. Moreover, the H gate electrode structure can reduce an edge leakage (edge parasitic MOS) caused by the isolation. Furthermore, it is possible to prevent the reliability of the gate oxide film from being deteriorated due to the isolation edge. The edge leakage caused by the isolation and the deterioration in the reliability of the gate oxide film will be described below in detail.

The PDSOI-MOSFET according to the first embodiment having the above-mentioned features can be used particularly effectively for an I/O circuit, an analog circuit (a PLL, a sense amplifier circuit), a timing circuit, a dynamic circuit and the like in which the fixation of the body potential is greatly required.

(Classification according to Source-Drain Region)
(First Mode: a structure in which both a source region and a drain region are directly provided in contact with a buried oxide film 2 (the structure shown in FIGS. 3 to 5)

As shown in FIG. 4, the source region 51 and the drain region 61 are directly provided in contact with the buried oxide film 2. Therefore, the effect of fixing the body potential through the body terminal 25 provided on the body region 10 is reduced.

According to the structure of the first mode, however, a pn junction is not formed on the bottom surfaces of the source region 51 and the drain region 61. Correspondingly, the area of a pn junction interface is reduced so that a junction leakage can be suppressed. Moreover, a junction capacitance can be reduced.

Figure 6:
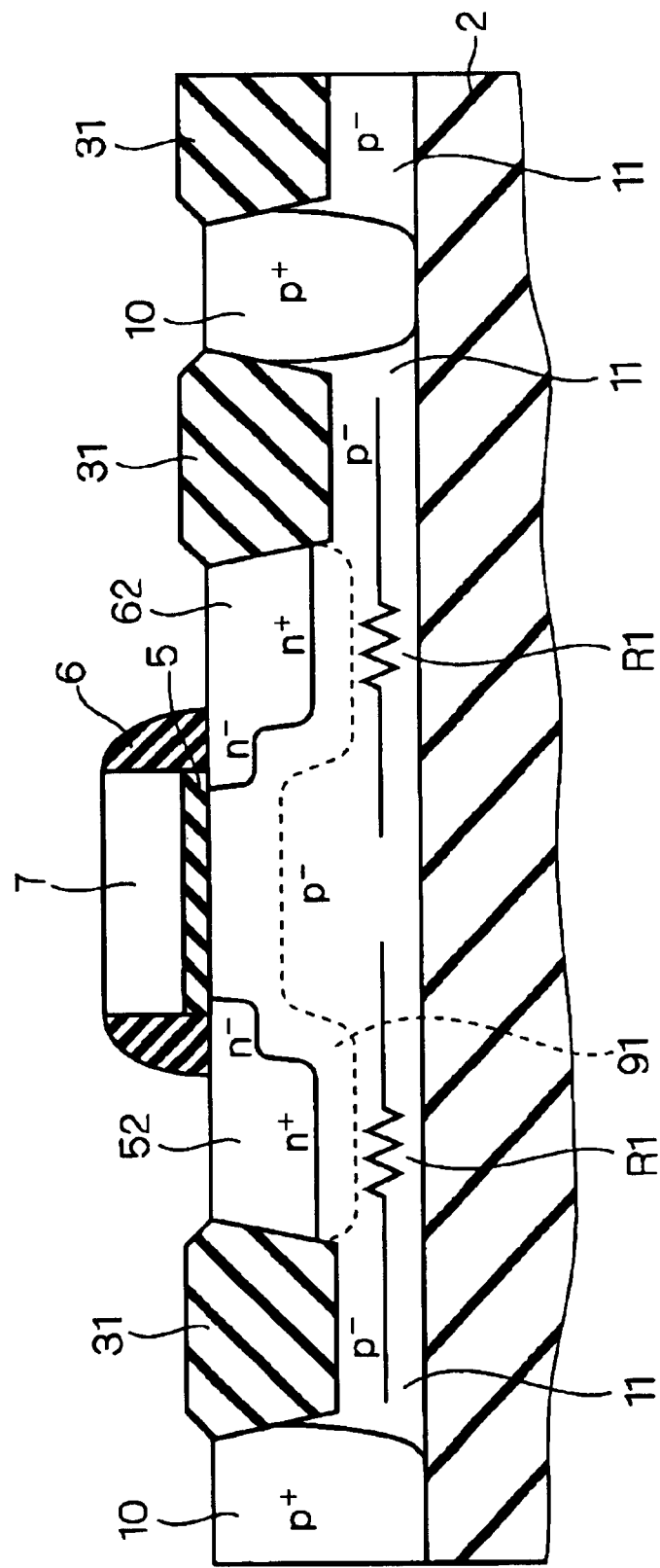
FIG. 6 is a sectional view showing a second mode of the first embodiment.

Second Mode: a structure in which a depletion layer extended from a source region and a drain region, as well as the source region and the drain region, are not provided in contact with a buried oxide film FIG. 6 is a sectional view showing a second mode of the first embodiment. FIG. 6 corresponds to a section taken along a line A2—A2 in FIG. 3.

As shown in FIG. 6, a source region 52 and a drain region 62 do not reach a buried oxide film 2 but is formed in an SOI layer 4. Furthermore, a depletion layer 91 extended from the source region 52 and the drain region 62 during a normal operation does not reach the buried oxide film 2. Other structures are the same as those in the first mode.

According to the second mode, thus, the source region 52 and the drain region 62, and the depletion layer 91 extended from the source region 52 and the drain region 62 do not reach the buried oxide film 2. Therefore, it is possible to reduce a body resistance R1 reaching a channel region from the body terminal 25, and there is an advantage that the effect of fixing the body potential through the body terminal 25 is the greatest. However, there is a disadvantage that the pn junction capacitance is increased.

(Third Mode: a structure in which a drain region is not provided in contact with a buried oxide film but a depletion layer extended from the drain region is not provided in contact with the buried oxide film)

Figure 7:
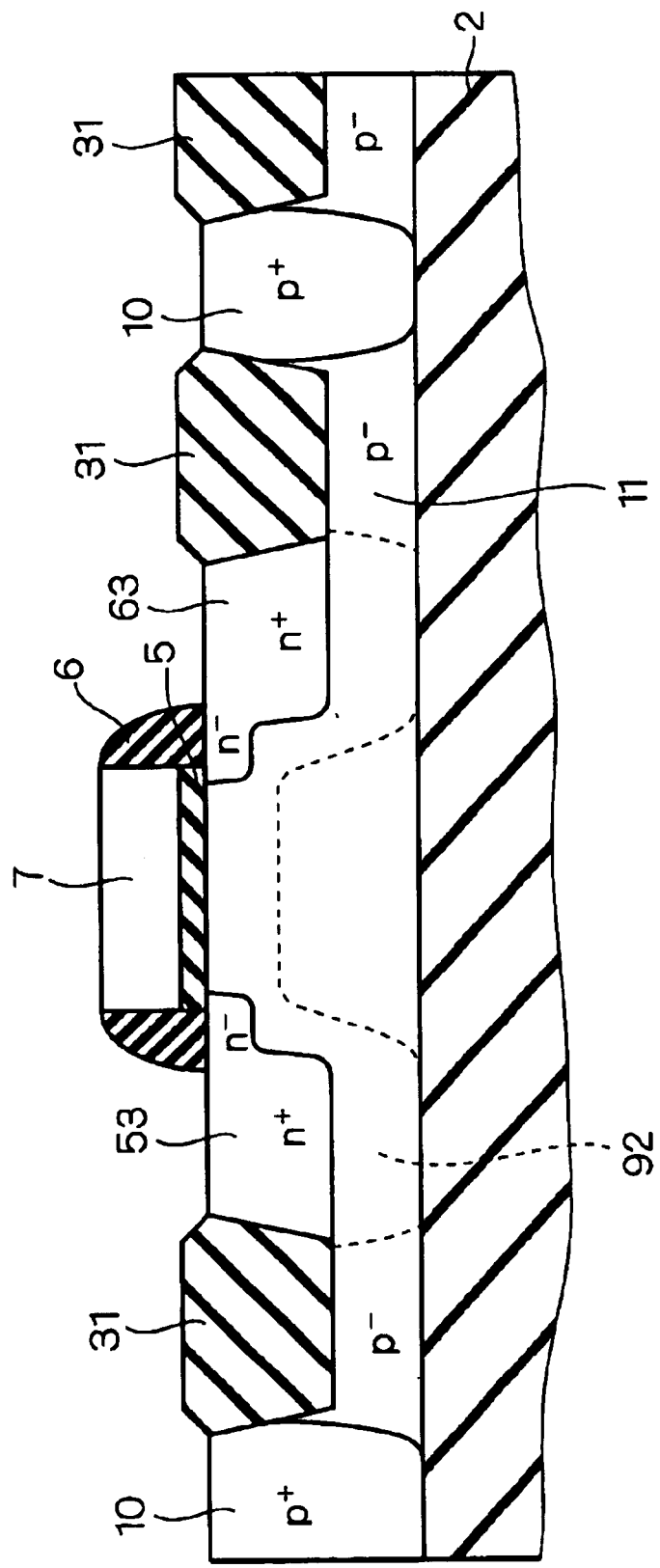
FIG. 7 is a sectional view showing a third mode of the first embodiment.

FIG. 7 is a sectional view showing a third mode of the first embodiment. FIG. 7 corresponds to the section taken along the line A2—A2 in FIG. 3.

As shown in FIG. 7, a source region 53 and a drain region 63 do not reach a buried oxide film 2 but is formed in an SOI layer 4. However, a depletion layer 92 extended from the source region 53 and the drain region 63 during a normal operation does not reach the buried oxide film 2. Other structures are the same as those in the first mode.

In the third mode, the drain region 63 is not directly provided in contact with the buried oxide film 2 and the effect of fixing a body potential is therefore greater than that in the first mode. In addition, the depletion layer 92 is provided in contact with the buried oxide film 2. Therefore, a pn junction capacitance is also reduced. In the case in which the depletion layer 92 extended from the drain region 63 is provided in contact with the buried oxide film 2 at a voltage of 0 V, there is a greater advantage that the pn junction capacitance can be reduced. While the depletion layer 92 extended from the source region 53 is also provided in contact with the buried oxide film 2 in the example of FIG. 7, the same effects can be obtained even if the depletion layer 92 is not provided in contact with the buried oxide film 2.

(Fourth Mode: an asymmetrical structure in which a drain region is formed more deeply than a source region and the drain region or a depletion layer extended from the drain region is provided in contact with a buried oxide film)

Figure 8:
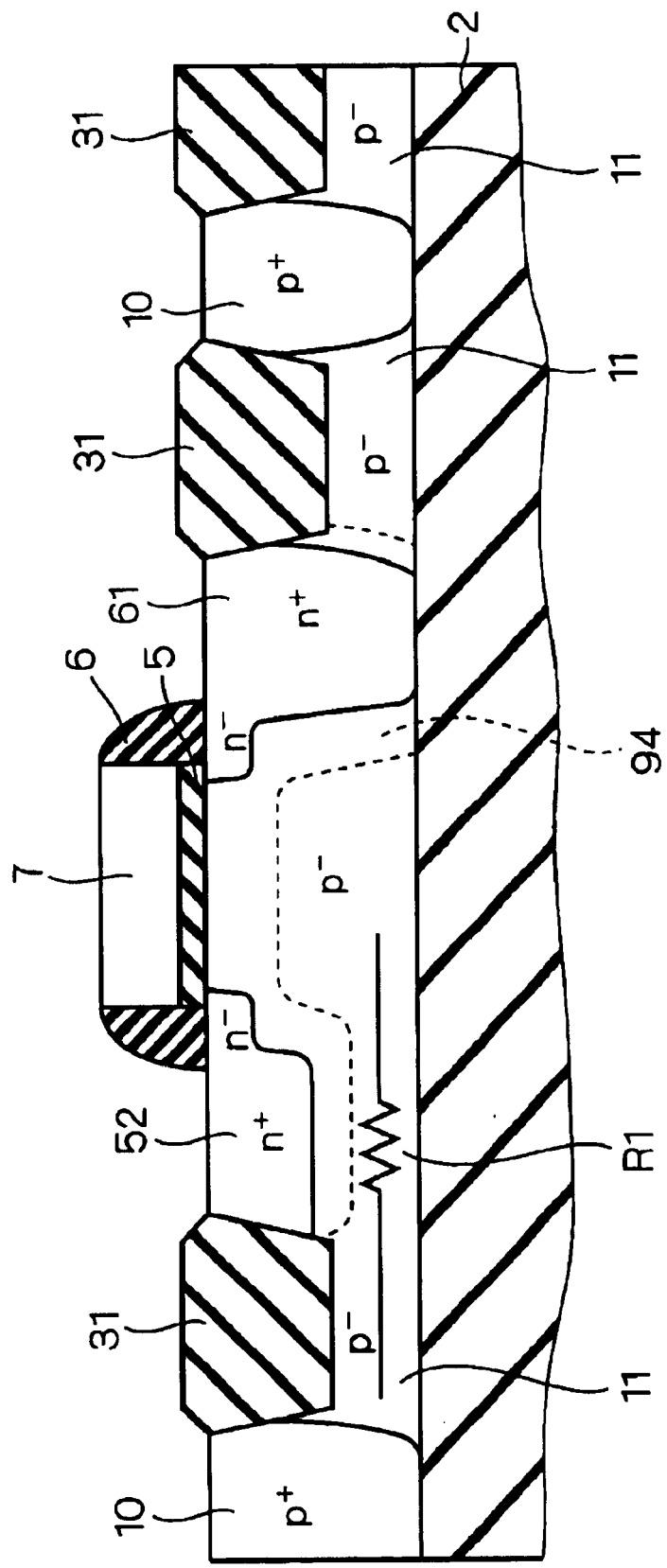
FIG. 8 is a sectional view showing a fourth mode of the first embodiment.

FIG. 8 is a sectional view showing a fourth mode of the first embodiment. FIG. 8 corresponds to the section taken along the line A2—A2 in FIG. 3.

As shown in FIG. 8, although the source region 52 and a depletion layer 94 extended from the source region 52 do not reach the buried oxide film 2, it has a source-drain asymmetrical structure in which the drain region 61 is directly provided in contact with the buried oxide film 2. Other structures are the same as those in the first mode.

The source-drain asymmetrical structure can be fabricated by separately implanting ions into a source and a drain using a resist mask.

In the fourth mode having such a structure, the junction capacitance of the source region 52 rarely affects an operating speed of a circuit. Therefore, even if the depletion layer 94 extended from the source region 52 is not provided in contact with the buried oxide film 2, there is no bad influence. Since the depletion layer 94 extended from the source region is not provided in contact with the buried oxide film 2, a body resistance value R1S provided under a region from a channel region to the vicinity of the source region 52 can be reduced. Moreover, while the source region may be formed with a structure in which the depletion layer 94 is provided in contact with the buried oxide film 2, it is more desirable that the depletion 94 should not reach the buried oxide film 2 because the area of the pn junction interface can be reduced.

Since the drain region 61 is provided in contact with the buried oxide film 2. Therefore, the junction capacitance and the area of the pn junction interface can be reduced. Furthermore, if the drain region 61 is not provided in contact with the buried oxide film 2 but the depletion layer extended from the drain region 61 during a normal operation is provided in contact with the buried oxide film 2, the body resistance value can be reduced.

<Second Embodiment>

Figure 9:
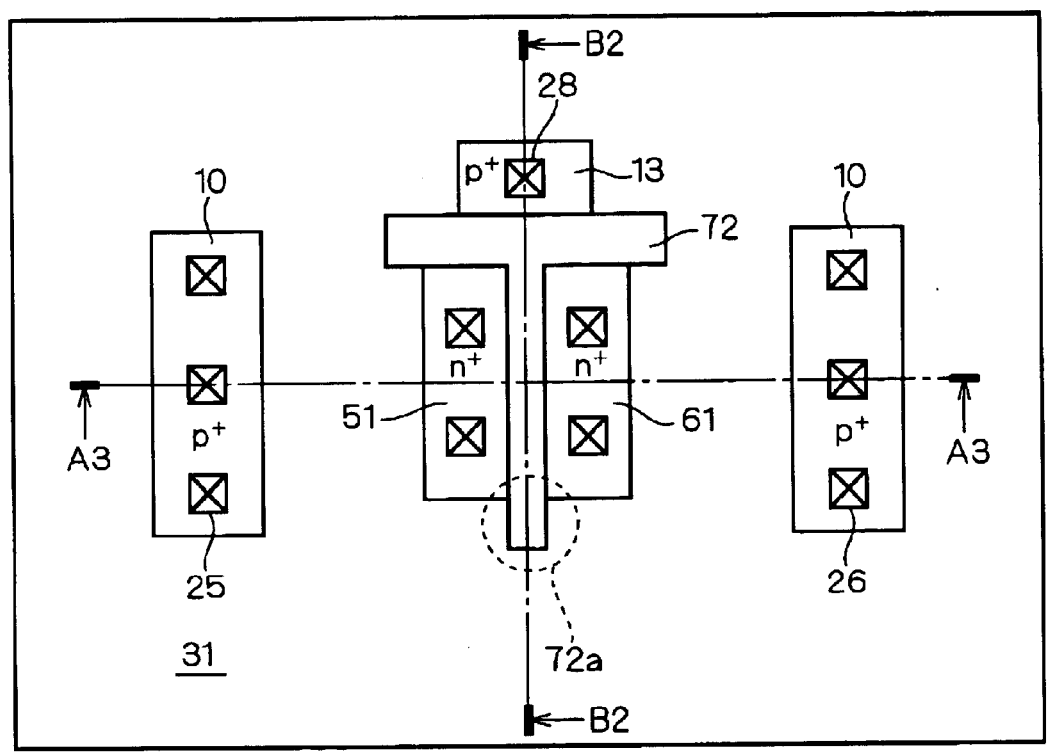
FIG. 9 is a plan view showing a planar structure of a semiconductor device according to a second embodiment of the present invention.

FIG. 9 is a plan view showing a planar structure of a semiconductor device according to a second embodiment of the present invention. A section taken along a line A3—A3 in FIG. 9 is the same as the shape shown in FIG. 4 and a section taken along a line B1—B1 in FIG. 9 is the same as the shape shown in FIG. 5 except that a body region 13 is formed on one of sides.

As shown in FIG. 9, a PDSOI-MOSFET according to the second embodiment has a structure in which a T gate electrode 72 is employed in place of the H gate electrode 71 according to the first embodiment. More specifically, while the H gate electrode 1 according to the first embodiment has the body region 13 provided in the vicinity of "I" on the right and left sides respectively, the T gate electrode 72 according to the second embodiment has the body region 13 provided in the vicinity of "I" on one of the sides in the same manner as the H gate electrode 71. Since other structures are the same as those in the first embodiment, description will be omitted.

In the T gate electrode 72 according to the second embodiment, accordingly, body fixation is carried out through body terminals 25 and 28 provided on body regions 10 and 13 of two types in the same manner as in the first embodiment. Consequently, a body resistance value can be reduced and a variation in a transistor characteristic can be suppressed effectively.

In the T gate electrode 72 according to the second embodiment, moreover, an area covering an edge of an active region (a source region 51, a drain region 61 or the like where a partial oxide film 31 is not formed) can be reduced. Therefore, a gate capacitance can be more reduced than that in the H gate electrode 71. Consequently, an operation of a circuit can be carried out more quickly than that in the PDSOI-MOSFET according to the first embodiment.

Moreover, the problem of an isolation edge can be solved effectively in the second embodiment having the T gate electrode 72 in the same manner as that in the first embodiment.

Accordingly, the PDSOI-MOSFET according to the second embodiment can be used particularly effectively for an I/O circuit, an analog circuit (a PLL, a sense amplifier circuit), a timing circuit, a dynamic circuit and the like in which the fixation of a body potential is greatly required.

The structure according to the second embodiment is classified into first to fourth modes depending on a junction position of a source-drain region in the same manner as that in the first embodiment.

<Third Embodiment>

Figure 11:
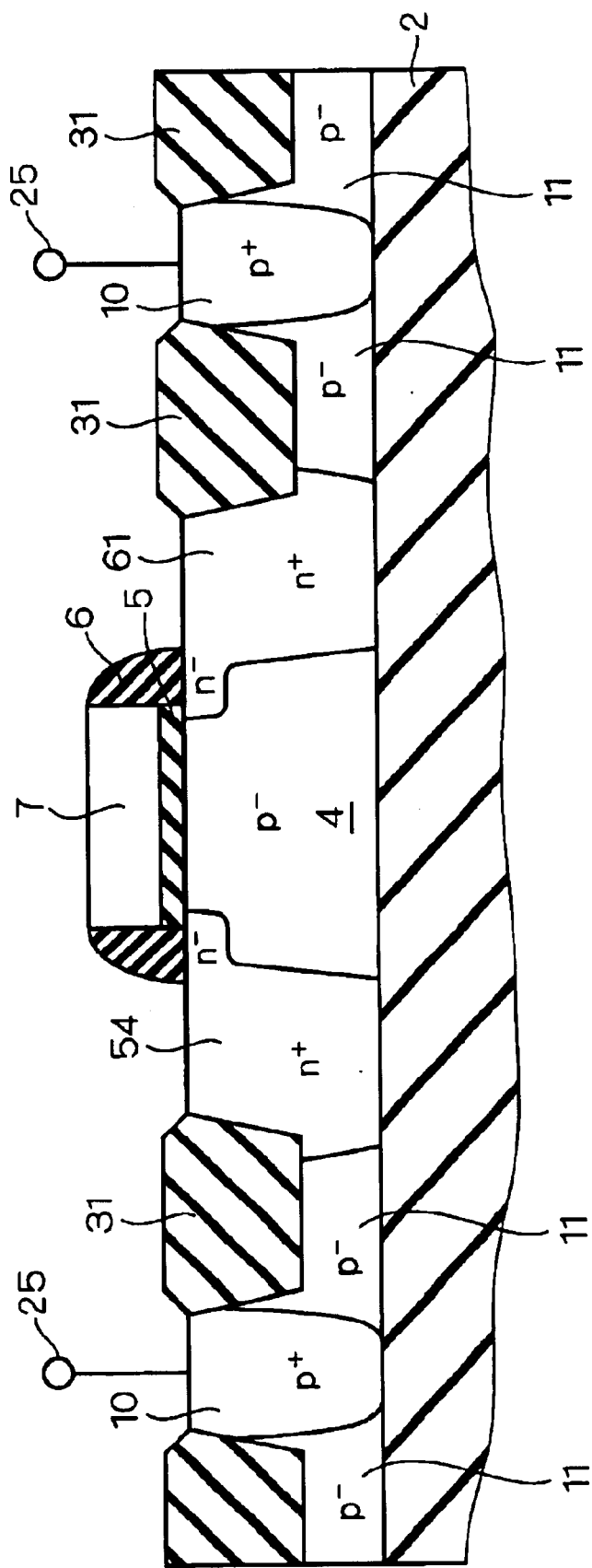
FIG. 11 is a sectional view showing a section taken along a line A4—A4 in FIG. 10.
Figure 12:
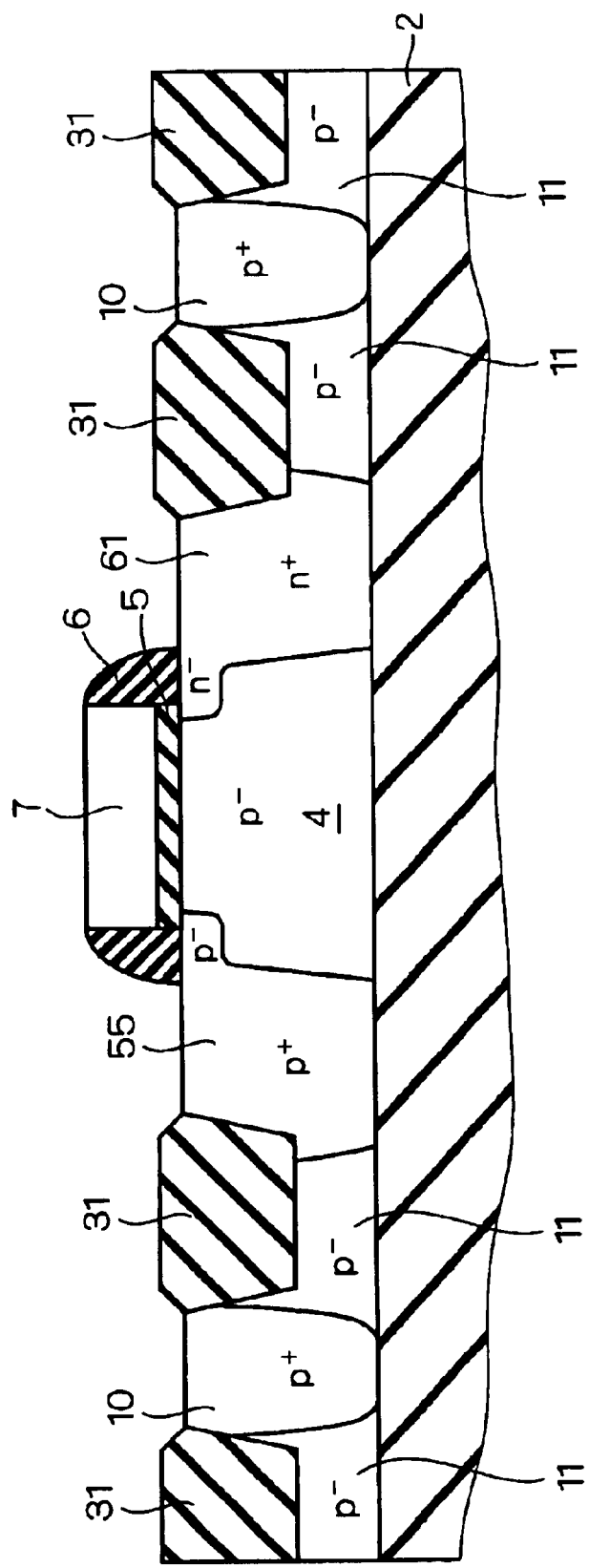
FIG. 12 is a sectional view showing a section taken along a line A5—A5 in FIG. 11.

FIG. 10 is a plan view showing a planar structure of a semiconductor device according to a third embodiment of the present invention, FIG. 11 is a sectional view showing a section taken along a line A4—A4 in FIG. 10, and FIG. 12 is a sectional view showing a section taken along a line A5—A5 in FIG. 11.

As shown in these drawings, a source region according to the third embodiment presents a source—tied structure in which a $p^+$ region 55 (a semiconductor region for body fixation) is provided in a source region 54 isolated into two portions.

Moreover, the source region 54, the $p^+$ region 55 and a drain region 61 are formed to have such depths as to reach a back face of an SOI layer 4 from a surface thereof, respectively.

A gate oxide film 5 is formed on the SOI layer 4 between the source region 54 ($p^+$ region 55) and the drain region 61, a gate electrode 7 is formed on the gate oxide film 5, and a side wall 6 is formed on side surfaces of the gate electrode 7.

Moreover, a body region 10 is isolated by a partial oxide film 31 and a p well region 11 provided thereunder and is formed from the surface of the SOI layer 4 to the back face thereof. The body region 10 is electrically connected to a main part of the body region to be the SOI layer 4 provided under the gate electrode 7 through the p well region 11 provided under the partial oxide film 31.

In such a source—tied structure in a PDSOI-MOSFET according to the third embodiment, electric potentials of a source and a body can be fixed simultaneously in a source junction region as shown in FIGS. 10, 11 and 12. More specifically, a part of the source region acts as the $p^+$ region 55. Therefore, the source region 54 and the $p^+$ region 55 are set to have the same electric potential so that the body potential can be fixed with a high stability. As a matter of course, the body potential can also be fixed through the body region 10.

Accordingly, the PDSOI-MOSFET according to the third embodiment having the above-mentioned features can be used particularly effectively for an I/O circuit, an analog circuit (a PLL, a sense amplifier circuit), a timing circuit, a dynamic circuit and the like in which the fixation of the body potential is greatly required.

Moreover, the structure according to the third embodiment is classified into a first mode to a fourth mode depending on a junction position of a source-drain region in the same manner as that in the first embodiment.

<Fourth Embodiment>

Figure 13:
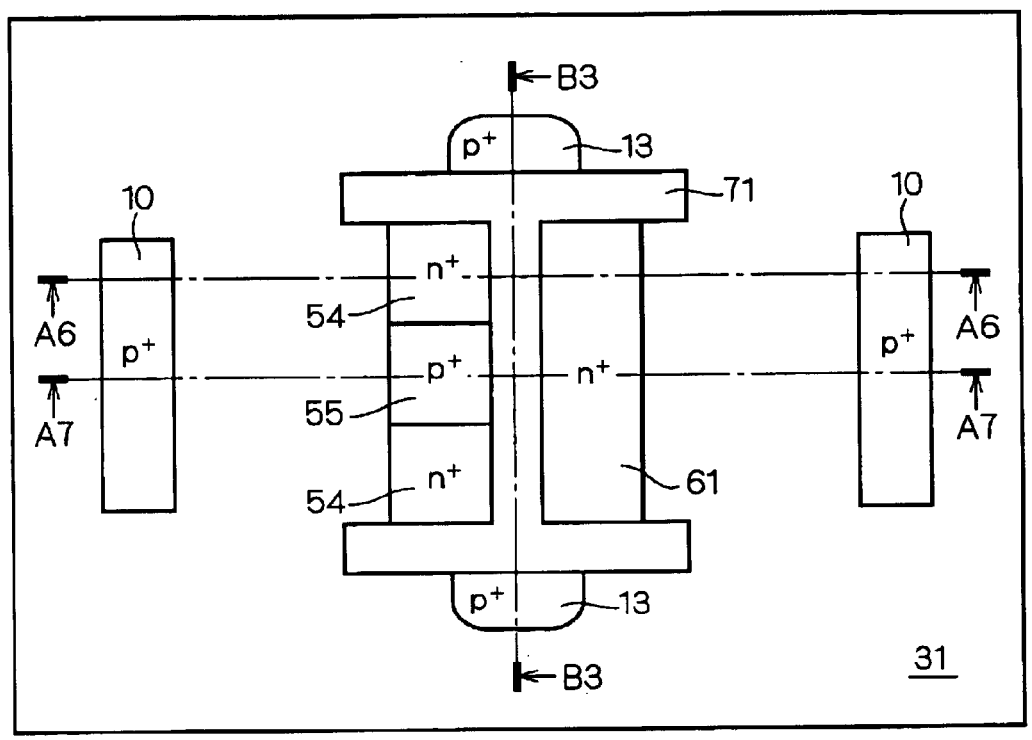
FIG. 13 is a plan view showing a planar structure of a semiconductor device according to a first mode of a fourth embodiment of the present invention.

FIG. 13 is a plan view showing a planar structure of a semiconductor device according to a first mode of a fourth embodiment of the present invention. A section taken along a line A6—A6 in FIG. 13 is the same as the shape shown in FIG. 11, a section taken along a line A7—A7 in FIG. 13 is the same as the shape shown in FIG. 12, and a section taken along a line B3—B3 in FIG. 13 is the same as the shape shown in FIG. 5.

The structure according to the first mode of the fourth embodiment is obtained by a combination of the H gate electrode 71 according to the first embodiment and the source-tied structure according to the third embodiment, and the respective body potential fixations according to the first and third embodiments (the body potential fixations through the body region 10, the two body regions 13 and the $p^+$ region 55) are combined so that the body potential fixation can be intensified still more.

Figure 14:
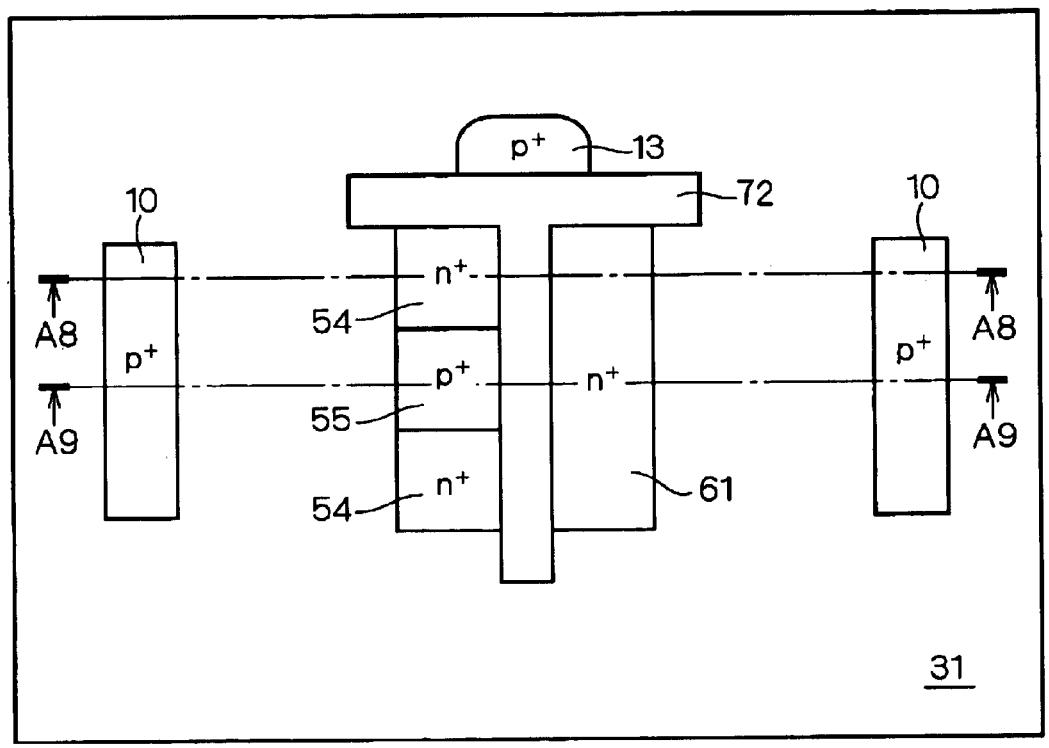
FIG. 14 is a plan view showing a planar structure of a semiconductor device according to a second mode of the fourth embodiment of the present invention.

FIG. 14 is a plan view showing a planar structure of a semiconductor device according to a second mode of a fourth embodiment of the present invention. A section taken along a line A8—A8 in FIG. 14 is the same as the shape shown in FIG. 11 and a section taken along a line A9—A9 in FIG. 14 is the same as the shape shown in FIG. 12.

The structure according to the second mode of the fourth embodiment is obtained by a combination of the T gate electrode 72 according to the second embodiment and the source-tied structure according to the third embodiment, and the respective body potential fixations according to the second and third embodiments (the body potential fixations through the body region 10, the body region 13 and the $p^+$ region 55) are combined so that the body potential fixation can be intensified still more.

Figure 15:
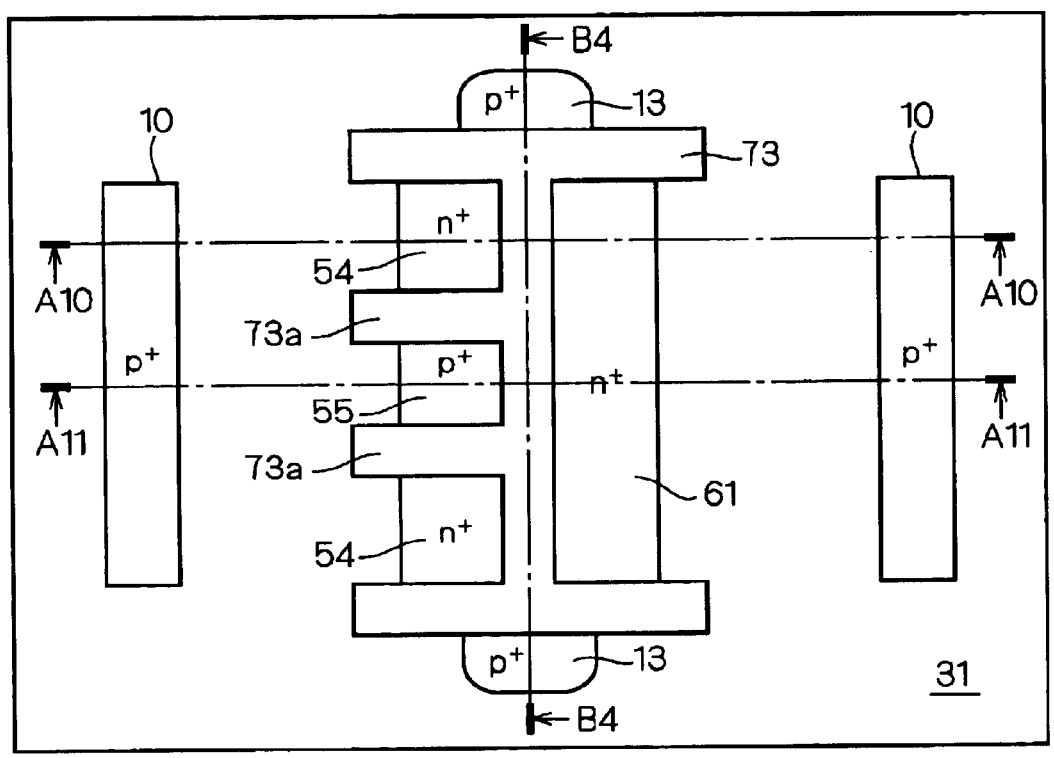
FIG. 15 is a plan view showing a planar structure of a semiconductor device according to a third mode of the fourth embodiment of the present invention.

FIG. 15 is a plan view showing a planar structure of a semiconductor device according to a third mode of a fourth embodiment of the present invention. A section taken along a line A10—A10 in FIG. 15 is the same as the shape shown in FIG. 11, a section taken along a line A11—A11 in FIG. 15 is the same as the shape shown in FIG. 12, and a section taken along a line B4—B4 in FIG. 15 is the same as the shape shown in FIG. 5.

The structure according to the third mode of the fourth embodiment is obtained by a combination of the special H gate electrode 73 obtained by improving the H gate electrode 71 according to the first embodiment and the source-tied structure according to the third embodiment, and the respective body potential fixations according to the first and third embodiments are combined so that the body potential fixation can be intensified still more.

In the third mode according to the fourth embodiment, furthermore, a source region 54 and a $p^+$ region 55 are isolated by an isolating portion 73a in the special H gate electrode 73.

The gate electrode according to the third embodiment and the first and second modes of the fourth embodiment does not have a portion corresponding to the isolating portion 73a. Therefore, when a silicide region is to be formed on the source region 54, the source region 54 and the $p^+$ region 55 are short-circuited. For this reason, the actions of the source and the drain cannot be utilized reversely.

On the other hand, in the third mode according to the fourth embodiment, the isolating portion 73a is present. Therefore, even if the silicide region is formed on the source region 54, the source region 54 and the $p^+$ region 55 are not short-circuited through the isolating portion 73a. Consequently, the actions of the source and the drain can be utilized reversely. However, a gate capacitance is increased corresponding to the presence of the isolating portion 73a. Thus, an operation speed is lower than that in the first mode. A $p^-$body region is formed under the isolating portion 73a through an oxide film.

Accordingly, the PDSOI-MOSFET according to the first to third modes of the fourth embodiment described above can be used particularly effectively for an I/O circuit, an analog circuit (a PLL, a sense amplifier circuit), a timing circuit, a dynamic circuit and the like in which the fixation of the body potential is greatly required.

Moreover, the structure according to the fourth embodiment is classified into a first mode to a fourth mode depending on a junction position of a source-drain region in the same manner as that in the first embodiment.

<Fifth Embodiment>

While the semiconductor device has a single PDSOI-MOSFET to be isolated by the partial isolation region in each of the first to fourth embodiments, a semiconductor device according to a fifth embodiment has plural kinds of PDSOI-MOSFETs to be isolated by a partial isolation region.

Type 1: A body potential is fixed with a normal gate structure (see FIGS. 1 and 2).

Type 2: The body potential is fixed with an H gate electrode structure (the first embodiment).

Type 3: The body potential is fixed with a T gate electrode structure (the second embodiment).

Type 4: The body potential is fixed with a source-tied structure (the third embodiment).

In some cases, the type 4 and the type 2 or the type 3 are used repetitively (the fourth embodiment).

Body Floating Type

Figure 16:
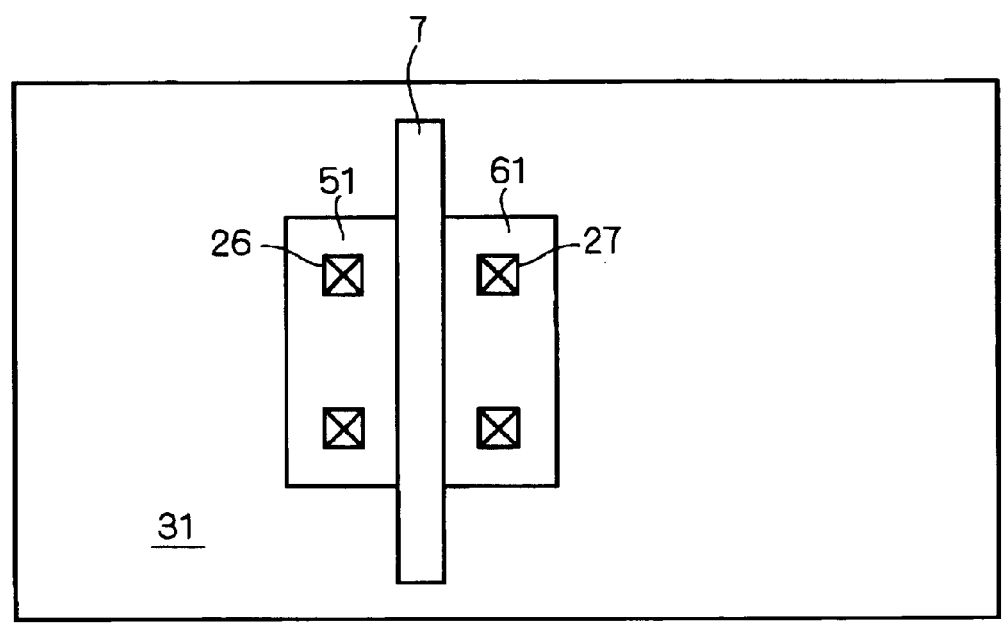
FIG. 16 is a plan view showing a planar structure of a type 5 (No. 1) of a PDSOI-MOSFET.

FIG. 16 is a plan view showing a planar structure of a type 5 (No. 1) of the PDSOI-MOSFET. As shown in FIG. 16, a main part of a body region of the PDSOI-MOSFET is also brought into a floating state with such a structure that an electric potential is not fixed through a body terminal even if a body region 10 is provided.

Figure 17:
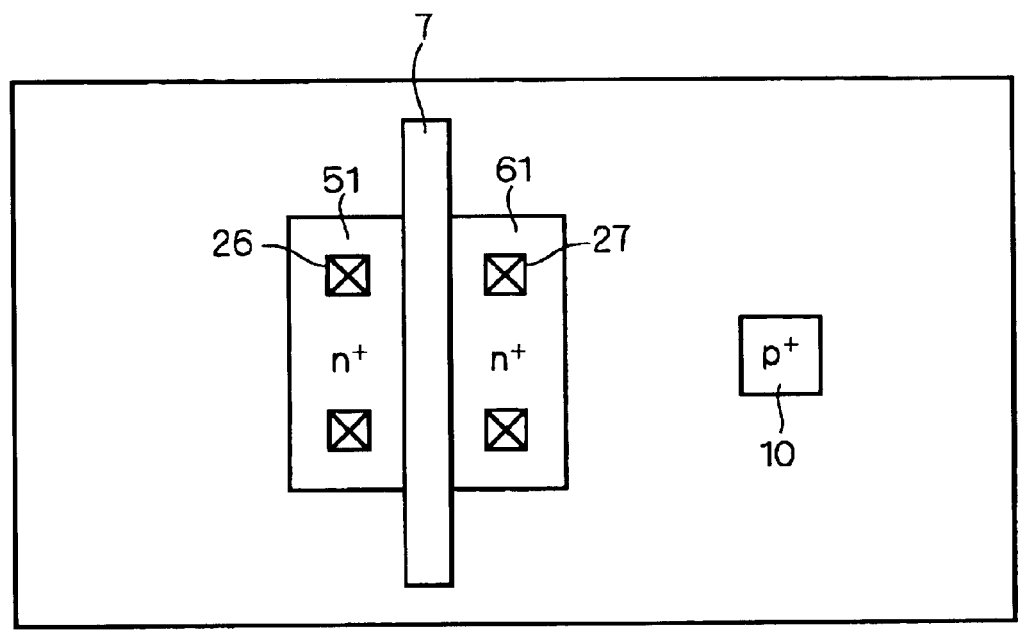
FIG. 17 is a plan view showing a planar structure of the type 5 (No. 2) of the PDSOI-MOSFET.

FIG. 17 is a plan view showing a planar structure of the type 5 (No. 2) of the PDSOI-MOSFET. As shown in FIG. 17, the body region of the PDSOI-MOSFET is brought into the floating state with such a structure that the potential fixation is not carried out through the body terminal even if the body region 10 is provided.

Thus, such a type as to bring the body region into a floating state is classified as a new kind. A PDSOI-MOSFET of the type 5 can produce effects in that a threshold voltage can be set to be lower than that in the types 1 to 4 in which the body potential is to be fixed.

In such a body floating type, the normal electrode structure such as a gate electrode 7 is classified into the type 5, and such a type as to bring the body floating with the H gate electrode structure and the T gate electrode structure in place of the gate electrode 7 in the same manner as the types 2 and 3 is classified into types 6 and 7. In the types 6 and 7, it is a matter of course that the body potential fixation is not carried out through a body terminal 28 provided on a body region 13.

The floating type of the PDSOI-MOSFET will be listed below.

Type 5: The body floating is brought with the normal gate structure (a linked-body structure in which the body region 15 shown in FIG. 15 is not usually provided).

Type 6: The body floating is brought with the H gate electrode structure.

Type 7: The body floating is brought with the T gate electrode structure.

The body region has a size with a relationship of the type 6> the type 7> the type 5. Therefore, if other conditions are identical, a threshold voltage has a relationship of the type 5<the type 7<the type 6 depending on the easiness to cause carriers to go away to the body region.

The semiconductor device according to the fifth embodiment is formed in two or more element formation regions obtained by isolating the PDSOI-MOSFETs of two of the type 1 to the type 7 or more are isolated by a partial isolation region.

In the semiconductor device according to the fifth embodiment having such a structure, plural kinds of PDSOI-MOSFETs having different transistor characteristics such as a threshold voltage can be provided in a plurality of element formation regions isolated by the partial isolation region through a variation in at least one of the structure of the body region, the structure of the gate electrode and the presence of the body potential fixation.

As a result, it is possible to constitute a semiconductor integrated circuit having a high function by using any of the PDSOI-MOSFETs which correspond to the transistor characteristic.

Furthermore, it is possible to set the threshold voltage of the respective PDSOI-MOSFETs to have different values by changing a channel concentration, a thickness of an SOI layer 4, a thickness and a material of a gate oxide film 5 and the like.

Moreover, it is also possible to set the PDSOI-MOSFETs of two of the types 1 to the type 4 or more to have different threshold voltages by setting respective substrate biases (body potential fixing voltages) to have different values.

<Sixth Embodiment>

A semiconductor device according to a sixth embodiment is of a partial isolation—complete isolation combination type having a first element formation region isolated by a partial isolation region, and furthermore, a second element formation region isolated by a complete isolation region (an insulating film for isolation reaching a back face (a buried oxide film 2) of an SOI layer 4 from a surface thereof).

The kind of a PDSOI-MOSFET to be isolated by the complete isolation region will be listed below.

Figure 18:
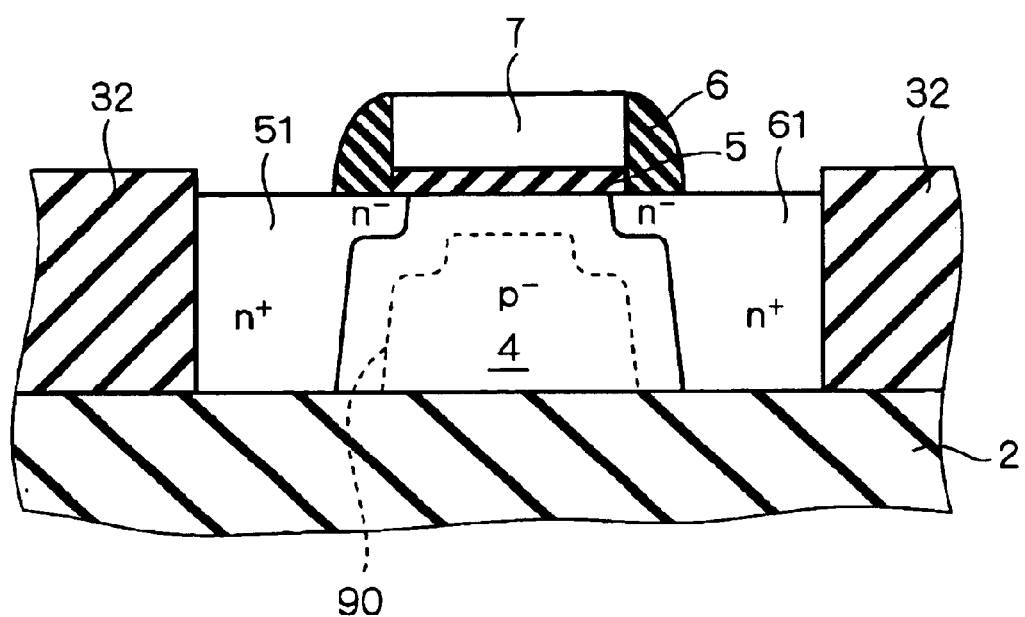
FIG. 18 is a sectional view showing a sectional structure of a PDSOI-MOSFET of a type A.

FIG. 18 is a sectional view showing a sectional structure of a PDSOI-MOSFET of a type A. As shown in FIG. 18, the PDSOI-MOSFET is formed in a region isolated by a complete oxide film 32 to be the complete isolation region provided to reach the back face (the buried oxide film 2) of the SOI layer 4 from the surface thereof. The sectional structure is the same as the planar structure according to the first embodiment shown in FIG. 4 except a partial oxide film 31 is replaced with the complete oxide film 32 and the body region 10 and the body region 25 are not present.

Figure 19:
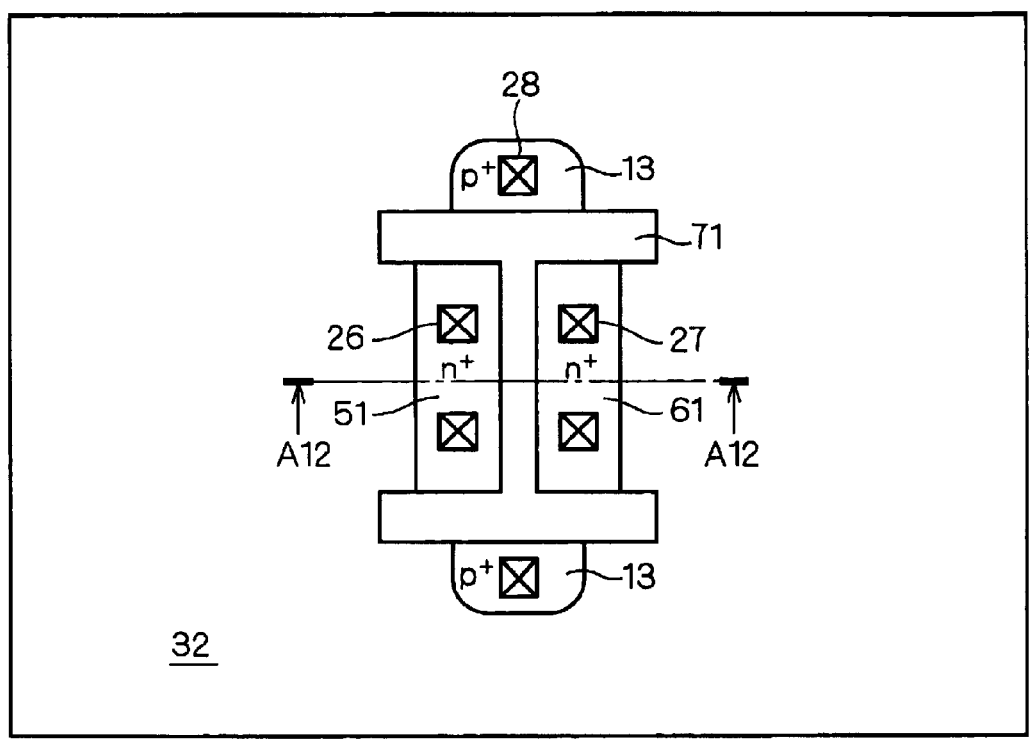
FIG. 19 is a plan view showing a planar structure of the PDSOI-MOSFET of the type A.

FIG. 19 is a plan view showing a planar structure of a PDSOI-MOSFET of a type A. A section taken along a line A12—A12 in FIG. 19 corresponds to FIG. 18.

As shown in FIG. 19, the planar structure is the same as the planar structure according to the first embodiment shown in FIG. 4 except that the partial oxide film 31 is replaced with the complete oxide film 32 and the body region 10 is not present.

In the PDSOI-MOSFET of the type A, accordingly, body potential fixation is carried out through two body terminals 28 provided on two body regions 13. Consequently, the body resistance value can be reduced and a variation in a transistor characteristic can be suppressed effectively. Differently from the first embodiment, however, it is impossible to carry out the body potential fixation through the body terminal 25 provided on the body region 10.

Figure 20:
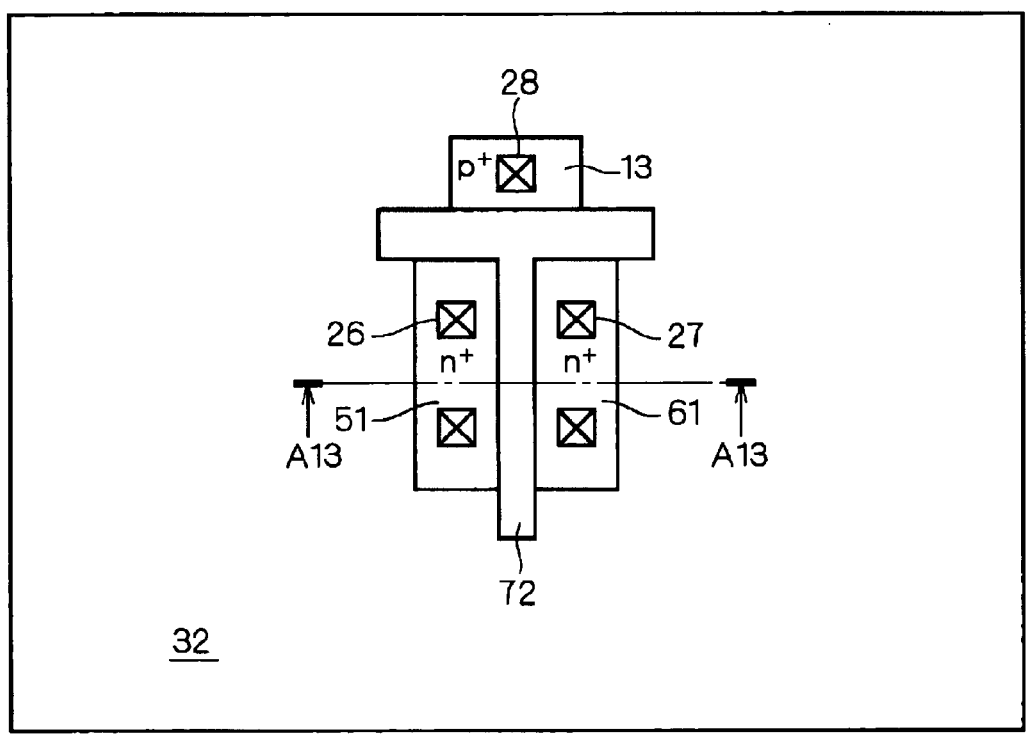
FIG. 20 is a plan view showing a planar structure of a PDSOI-MOSFET of a type B.

FIG. 20 is a plan view showing a planar structure of a PDSOI-MOSFET of a type B. As shown in FIG. 20, the planar structure is the same as the planar structure according to the second embodiment except that the partial oxide film 31 is replaced with the complete oxide film 32 and the body region 10 is not present. Moreover, a section taken along a line A13—A13 in FIG. 20 is the same as the sectional structure shown in FIG. 18.

In the PDSOI-MOSFET of the type B, accordingly, body potential fixation is carried out through the body terminal 28 provided on the body region 13. Consequently, the body resistance value can be reduced and a variation in a transistor characteristic can be suppressed effectively. Differently from the second embodiment, however, it is impossible to carry out the body potential fixation through the body terminal 25 provided on the body region 10.

Referring to a type C, the body potential fixation is carried out with a source—tied structure in the complete isolation region as that in the third embodiment.

Figure 21:
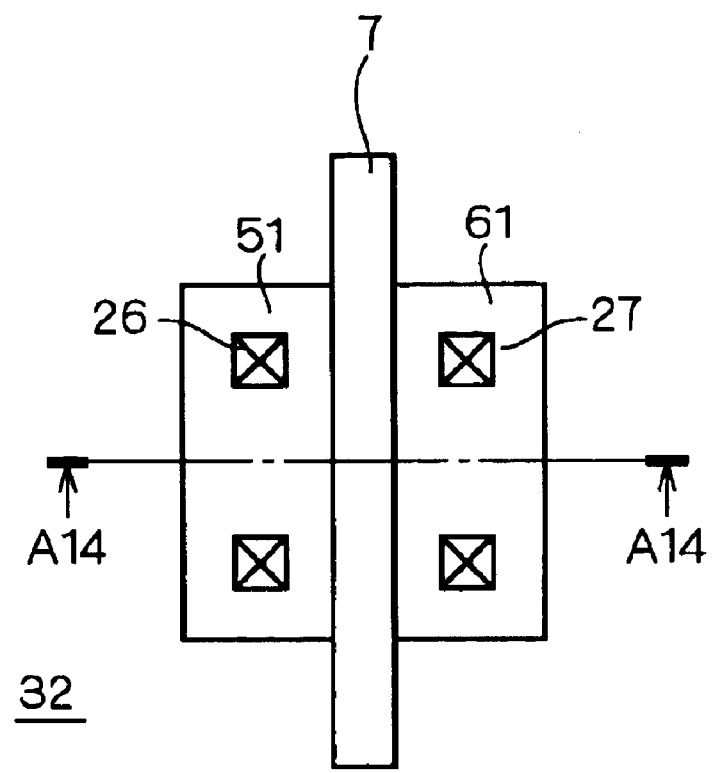
FIG. 21 is a plan view showing a planar structure of a PDSOI-MOSFET of a type D.

FIG. 21 is a plan view showing a planar structure of a PDSOI-MOSFET of a type D. As shown in FIG. 21, the planar structure is the same as the planar structure of the PDSOI-MOSFET of the type 5 which is partially isolated as shown in FIG. 16 except that the partial oxide film 31 is replaced with the complete oxide film 32. Moreover, a section taken along a line A14—A14 in FIG. 21 is the same as the sectional structure shown in FIG. 18.

Similarly, PDSOI-MOSFETs of types E and F have the same structures as those of the PDSOI-MOSFETs of the types 6 and 7 except that the partial oxide film 31 is replaced with the complete oxide film 32.

In the case in which other conditions are identical for the same reasons of the types 5 to 7, a threshold voltage has a relationship of the type D<the type F<the type E.

As described above, the types A to F are set to a PDSOI-MOSFET to be formed in a second region isolated by a complete isolation region. The above-mentioned types A to F can be summarized as follows.

Type A: A body potential is fixed with an H gate electrode structure (which is similar to that in the first embodiment, and the body potential fixation is not carried out through the body region 10).

Type B: The body potential is fixed with a T gate electrode structure (which is similar to that in the second embodiment, and the body potential fixation is not carried out through the body region 10).

Type C: The body potential is fixed with a source—tied structure (which is similar to that in the third embodiment, and the body potential fixation is not carried out through a p⁺ region 55).

Type D: The body floating is brought with a normal gate structure.

Type E: The body floating is brought with the H gate electrode structure.

Type F: The body floating is brought with the T gate electrode structure.

The PDSOI-MOSFETs of the types A to F are formed in a second element formation region isolated by a complete isolation region. Therefore, an advantage of latch up free can be obtained.

By employing the H gate electrode structure and the T gate electrode structure as in the types A and B or the source—tied structure as in the type C, moreover, the body potential can be fixed to suppress a floating-body effect. described in the fifth embodiment.

In the case in which other conditions are identical for the threshold voltage of the PDSOI-MOSFET, the following relationship is established: "complete isolation floating structure (type D to type F)<partial isolation floating structure (type 5 to type 7)<body potential fixing structure (type A, type B, type 1 to type 4).

A threshold voltage in the partial isolation floating structure is greater than that in the complete isolation floating structure for the following reason. Since the body region in the partial isolation floating structure is greater than that in the complete isolation floating structure, it is possible to obtain the effect of annihilating a carrier (a hole in an NMOS and an electron in a PMOS) to produce a floating-body effect.

The semiconductor device according to the sixth embodiment has the partial isolation—complete isolation combination structure in which the PDSOI-MOSFET of one of the types 1 to 7 or more is (are) formed in the first element formation region isolated by the partial isolation region and the PDSOI-MOSFET of one of the types A to F or more is (are) formed in the second element formation region isolated by the complete isolation region.

The semiconductor device according to the sixth embodiment having such a structure comprises plural kinds of PDSOI-MOSFETs. Therefore, it is possible to provide the PDSOI-MOSFETs applicable to respective uses.

In plural kinds of PDSOI-MOSFETs, furthermore, it is possible to set the threshold voltage of the respective PDSOI-MOSFETs to have different values by changing a channel concentration, a thickness of an SOI layer 4, a thickness and a material of a gate oxide film 5 and the like.

Moreover, it is also possible to set the PDSOI-MOSFETs of two of the types 1 to the type 4 or more to have different threshold voltages by setting respective substrate biases (body potential fixing voltages) to have different values.

Figure 22:
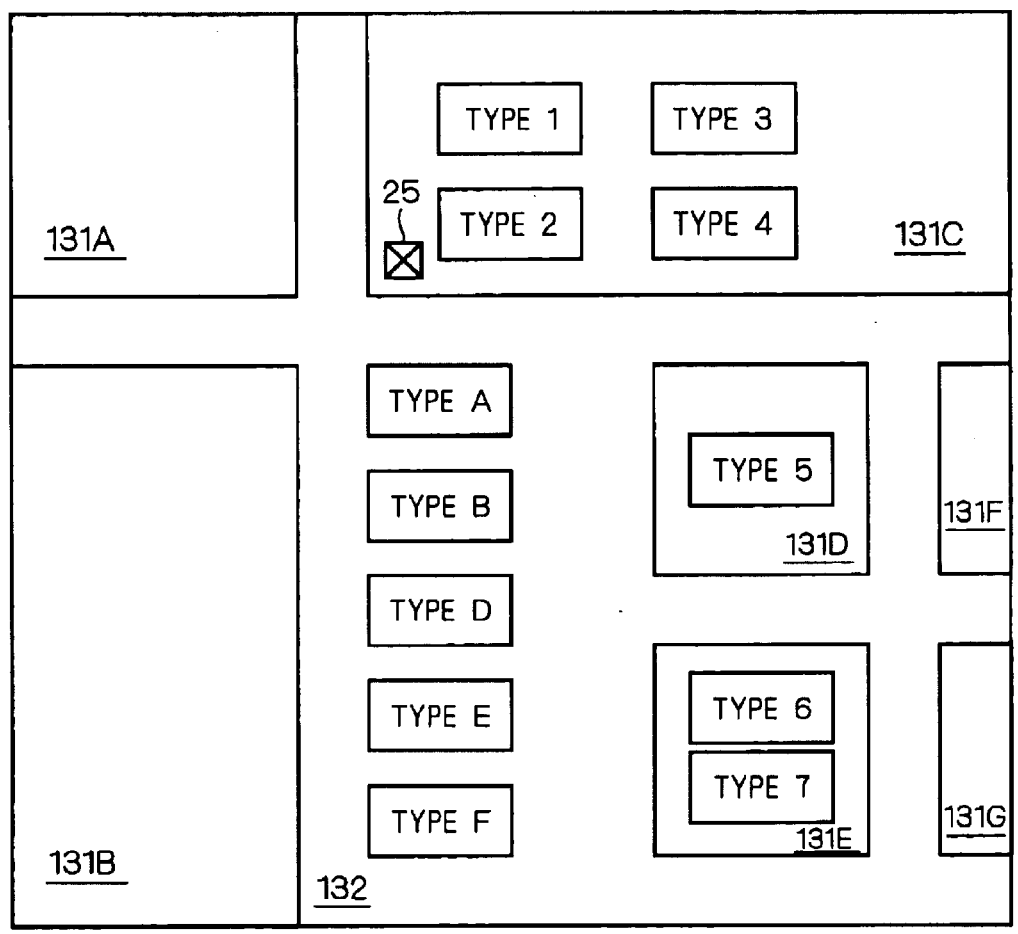
FIG. 22 is a view conceptually showing a planar structure of a semiconductor device according to a sixth embodiment.

FIG. 22 is a view conceptually showing a planar structure of the semiconductor device according to the sixth embodiment. As shown in FIG. 22, a partial isolation region 131 (131A to 131G) isolated by the partial oxide film 31 and a complete isolation region 132 isolated by the complete oxide film 32 are provided together. In the example of FIG. 22, PDSOI-MOSFETs of body potential fixing types 1 to 4 are provided in a partial isolation region 131B, PDSOI-MOSFETs of a type A, a type B and types D to F are provided in a complete isolation region 132, a body floating type PDSOI-MOSFET of a type 5 is provided in a partial isolation region 131D, and body floating type PDSOI-MOSFETs of types 6 and 7 are provided in a partial isolation region 131E.

(First Applied Example)

Figure 23:
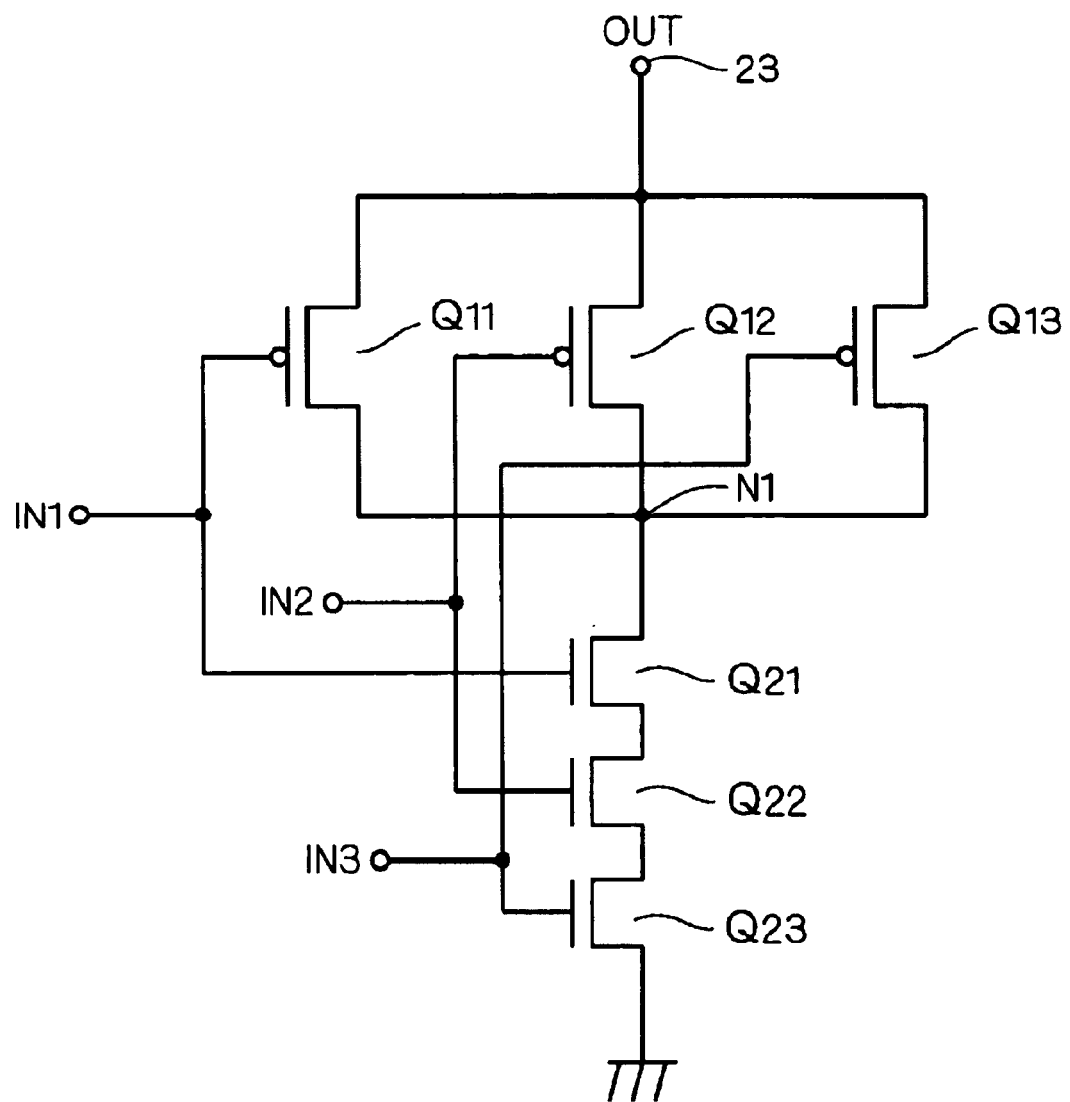
FIG. 23 is a circuit diagram showing a first applied example of the semiconductor device according to the sixth embodiment.

FIG. 23 is a circuit diagram showing a first applied example of the semiconductor device according to the sixth embodiment. As shown in FIG. 23, a 3-input NAND gate (a semiconductor integrated circuit) is constituted by PMOS transistors Q11 to Q13 and NMOS transistors Q21 to Q23.

The NMOS transistors Q21 to Q23 are connected in series in this order between a node N1 and a ground, and the PMOS transistors Q11 to Q13 are connected in parallel between an output terminal 33 and the node N1. An input signal IN1 is input to gates of the PMOS transistor Q11 and the NMOS transistor Q21, an input signal IN2 is input to gates of the PMOS transistor Q12 and the NMOS transistor Q22, and an input signal IN3 is input to gates of the PMOS transistor Q13 and the NMOS transistor Q23.

With such a structure, a complete isolation floating structure (for example, the type D) is used for the NMOS transistor Q21, a linked-body structure (the type 5) having the partial isolation floating structure and having neither the body region nor the body terminal is used for the NMOS transistor Q22, and a partial isolation body potential fixing structure (any of the types 1 to 4) is used for the NMOS transistor Q23.

Thus, plural kinds of PDSOI-MOSFETs are used properly for the NMOS transistors Q21 to Q23 and are provided over the NMOS transistors Q21 to Q23 such that a substrate bias effect is increased.

More specifically, it is possible to effectively suppress a reduction in a speed due to the substrate bias effect by using MOS transistors having such a character as to be influenced by the substrate bias effect in order of Q21 to Q23 for the NMOS transistors Q21 to Q23 set in such a situation as to be influenced by the substrate bias effect in order of Q21 to Q23.

(Second Applied Example)

Figure 24:
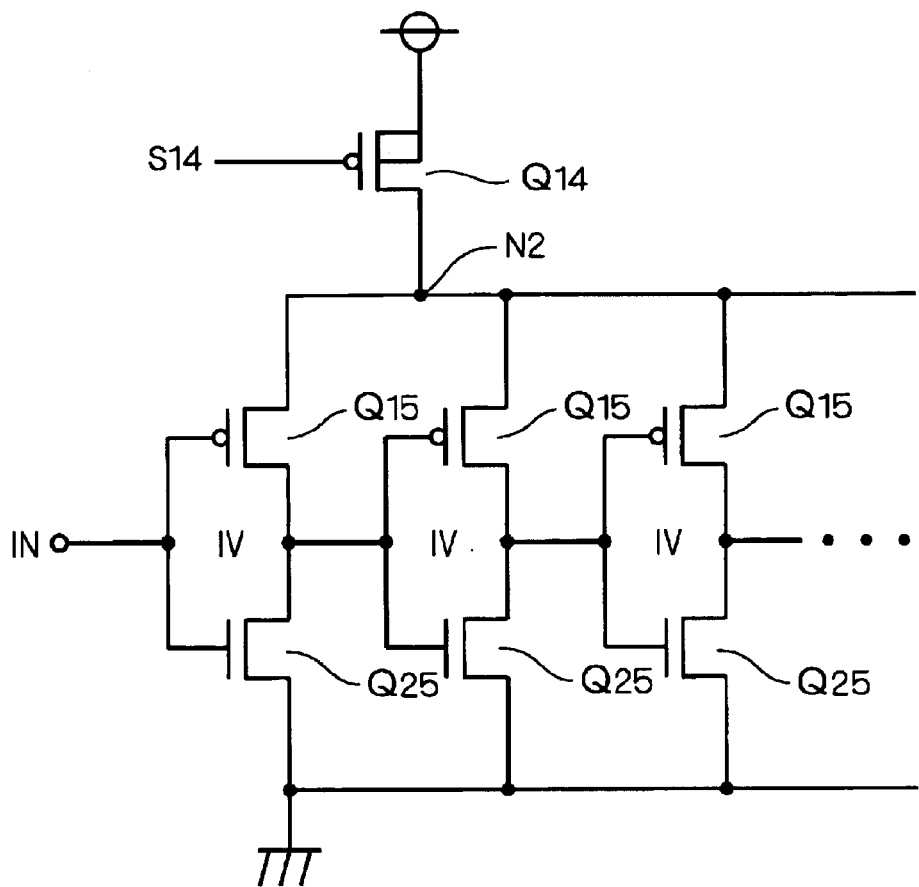
FIG. 24 is a circuit diagram showing a second applied example of the semiconductor device according to the sixth embodiment.

FIG. 24 is a circuit diagram showing a second applied example of the semiconductor device according to the sixth embodiment. A shown in FIG. 24, a plurality of inverters IV are connected in series to implement an inverter chain (or a ring oscillator).

Each inverter IV is constituted by a PMOS transistor Q15 and an NMOS transistor Q25. The PMOS transistor Q15 has a drain connected to a node N2 in common and the node N2 is connected to a source voltage VDD through a PMOS transistor Q14, and a control signal S14 is applied to a gate of the PMOS transistor Q14. Moreover, the NMOS transistor Q25 has a source grounded in common.

In a state in which the PMOS transistor Q14 is OFF, each inverter IV is brought into an inactive state. In a state in which the PMOS transistor Q14 is ON, each inverter IV is brought into an active state.

With such a structure, a complete isolation floating structure (the types D to F) or a partial isolation linked-body structure (the type 5) are used for the PMOS transistor Q15 and the NMOS transistor Q25 which constitute the inverter IV. These structures can set a threshold voltage to be lower than that in the body potential fixing structure. Therefore, the inverter IV can be operated at a high speed.

On the other hand, it is possible to increase the threshold voltage by using the partial isolation body potential fixing structure (the types 1 to 4) in the PMOS transistor Q14 for switching control of the inverter IV. Therefore, it is possible to reduce power consumption in the power-OFF state.

Thus, it is possible to increase the speed and to reduce the power consumption by properly using plural kinds of PDSOI-MOSFETs for the MOS transistors Q15 and Q25 constituting the inverter IV and the PMOS transistor Q14 to change threshold voltages thereof.

Supplement

Figure 25:
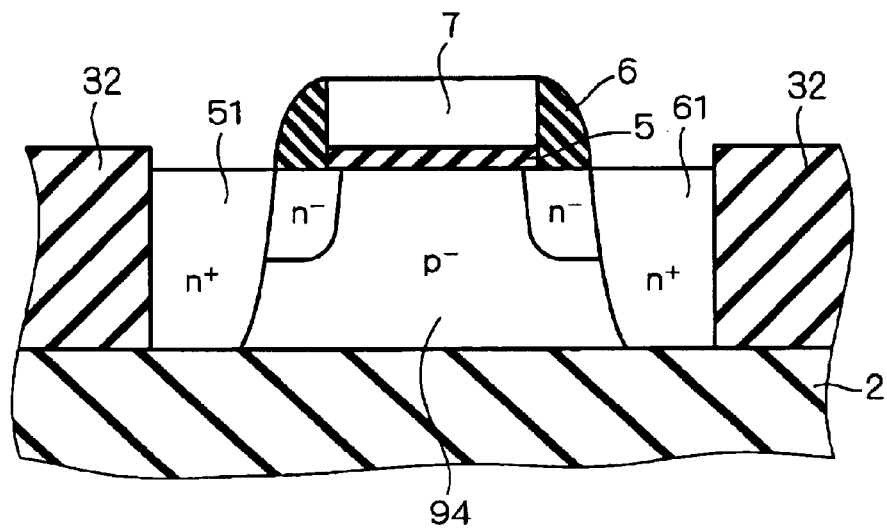
FIG. 25 is a sectional view showing a structure of a complete isolated PDSOI-MOSFET.

FIG. 25 is a sectional view showing a structure of an FD (Fully-Depleted) SOI-MOSFET structure isolated by a complete isolation region. As shown in FIG. 25, an apparent structure is the same as the complete isolation body floating structure shown in FIG. 16.

The FDSOI-MOSFET is different from the PDSOI-MOSFET in that a depletion layer 94 provided under a gate electrode 7 reaches a buried oxide film 2. Moreover, the FDSOI-MOSFET may have such a structure that an n⁻ region of a source-drain reaches the buried oxide film 2.

The FDSOI-MOSFET shown in FIG. 25 can implement all the types A to F of the complete isolation structure and all the types 1 to 7 of the partial isolation structure.

The FDSOI-MOSFET has an advantage that a subthreshold coefficient is good, that is, a switching speed is good. However, there is also a disadvantage that a threshold is varied due to a variation in a thickness of an SOI layer 4. In this respect, the PDSOI-MOSFET has a high controllability of a threshold voltage because the depletion layer provided under the gate does not come in contact with the buried oxide film.

It is also possible to further diversify the type of transistors to be used by adding the FDSOI-MOSFET shown in FIG. 25 to the type of transistors used in the fifth embodiment or the sixth embodiment.

While the structure of the NMOS transistor has mainly been described in the first to sixth embodiments, it is apparent that the present invention can also be applied to a PMOS transistor and a CMOS transistor.

<Seventh Embodiment>

(First Mode)

Figure 26:
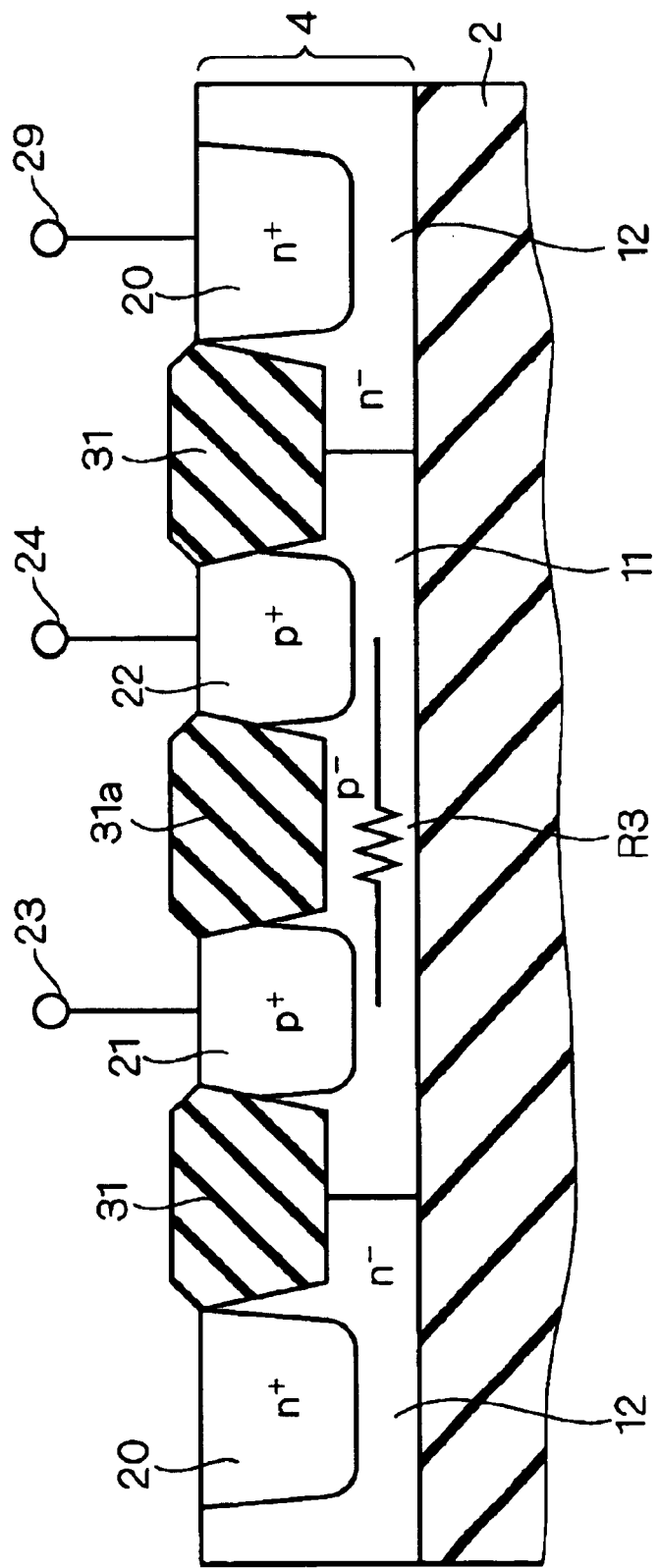
FIG. 26 is a sectional view showing a resistive element formation region of a semiconductor device according to a first mode of a seventh embodiment of the present invention.
Figure 27:
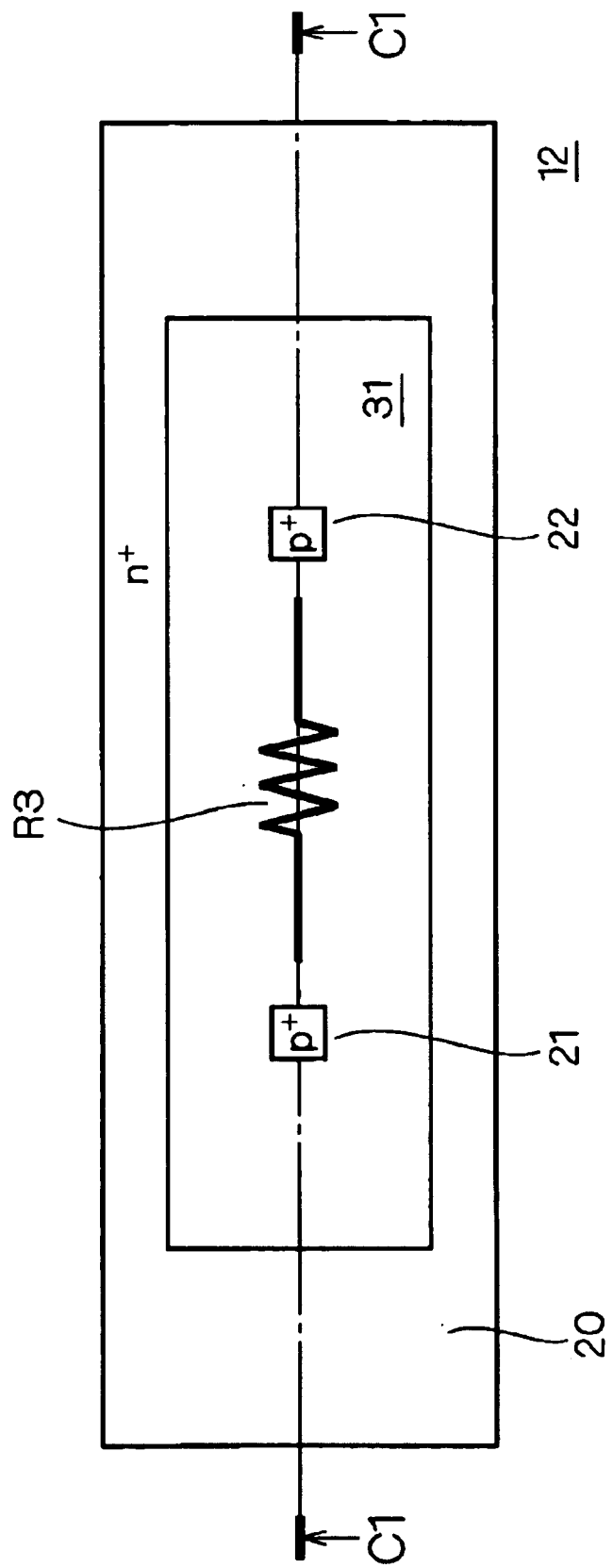
FIG. 27 is a plan view showing the first mode of the seventh embodiment.

FIG. 26 is a sectional view showing a resistive element of a semiconductor device according to a first mode of the second embodiment of the present invention, and FIG. 27 is a plan view. A section taken along a line C1—C1 in FIG. 27 corresponds to FIG. 26.

As shown in these drawings, p⁺ regions 21 and 22 are isolated by a partial oxide film 31a and a p well region 11 provided thereunder. The p⁺ region 21 and the p⁺ region 22 are electrically connected to each other through the p well region 11 provided under the partial oxide film 31a, and a resistive element R3 can be formed between a resistive terminal 23 provided on the p⁺ region 21 and a resistive terminal provided on the p⁺ region 22.

More specifically, the resistive element R3 is formed by using the p well region 111 to be an SOI layer 4 provided under the partial oxide film 31a. A resistance value of the resistive element R3 can be controlled based on a thickness of the partial oxide film 31a (that is, a thickness of the p well region 11 provided under the partial oxide film 31a).

The periphery of the resistive element R3 is isolated through a partial oxide film 31 which is different from the partial oxide film 31a. An n well region 12 and an n⁺ guard ring region 20 are formed. The n⁺ guard ring region 20 is selectively formed in the n well region 12. A resistive element formation region where the resistive element R3 can be isolated from other elements through the n⁺ guard ring region 20 and the n well region 12.

Figure 28:
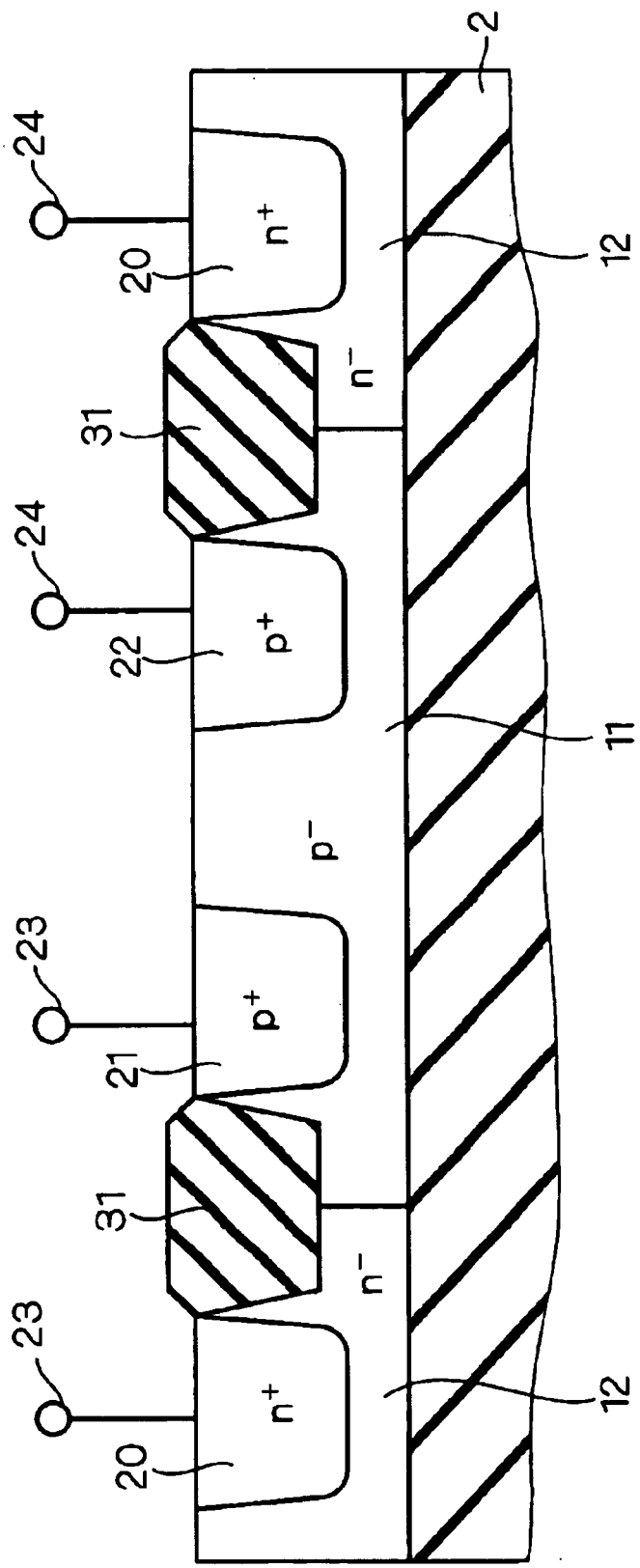
FIG. 28 is a sectional view showing a general resistive element formation region.

FIG. 28 is a sectional view showing a general resistive element. As shown in FIG. 28, the p⁺ regions 21 and 22 are selectively provided in an upper layer portion of the p well region 11. The p⁺ region 21 and the p⁺ region 22 are electrically connected to each other through the p well region 11. Consequently, a resistive element R3 is formed between the terminal 23 provided on the p⁺ region 21 and the resistive terminal provided on the p⁺ region 22. Other structures are the same as those in the first mode.

According to the first mode shown in FIG. 23, the p well region 11 provided under the partial oxide film 31 is utilized to form a resistor. Therefore, a resistance value of a general resistive element shown in FIG. 28 can be increased.

(Second Mode)

Figure 29:
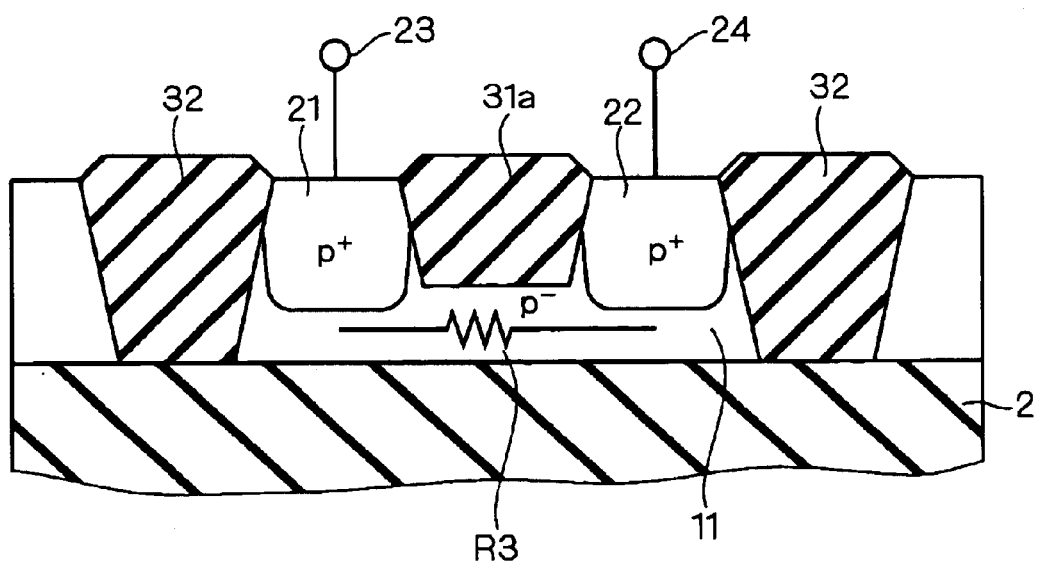
FIG. 29 is a sectional view showing a resistive element formation region of a semiconductor device according to a second mode of the seventh embodiment.

FIG. 29 is a sectional view showing a resistive element of a semiconductor device according to a second mode of the second embodiment. The second mode employs a partial isolation and complete isolation combination structure.

As shown in FIG. 29, a resistive element R3 can be formed through a p well region 11 provided under a partial oxide film 31 between a resistive terminal 23 provided on a p⁺ region 21 and a resistive terminal 24 provided on a p⁺ region 22 in the same manner as that in the first mode.

The resistive element R3 is completely isolated from the periphery through a complete oxide film 32. Therefore, it is not necessary to provide an n well region 12 and an n⁺ guard ring region 20 as in the first mode.

(Third Mode)

Figure 30:
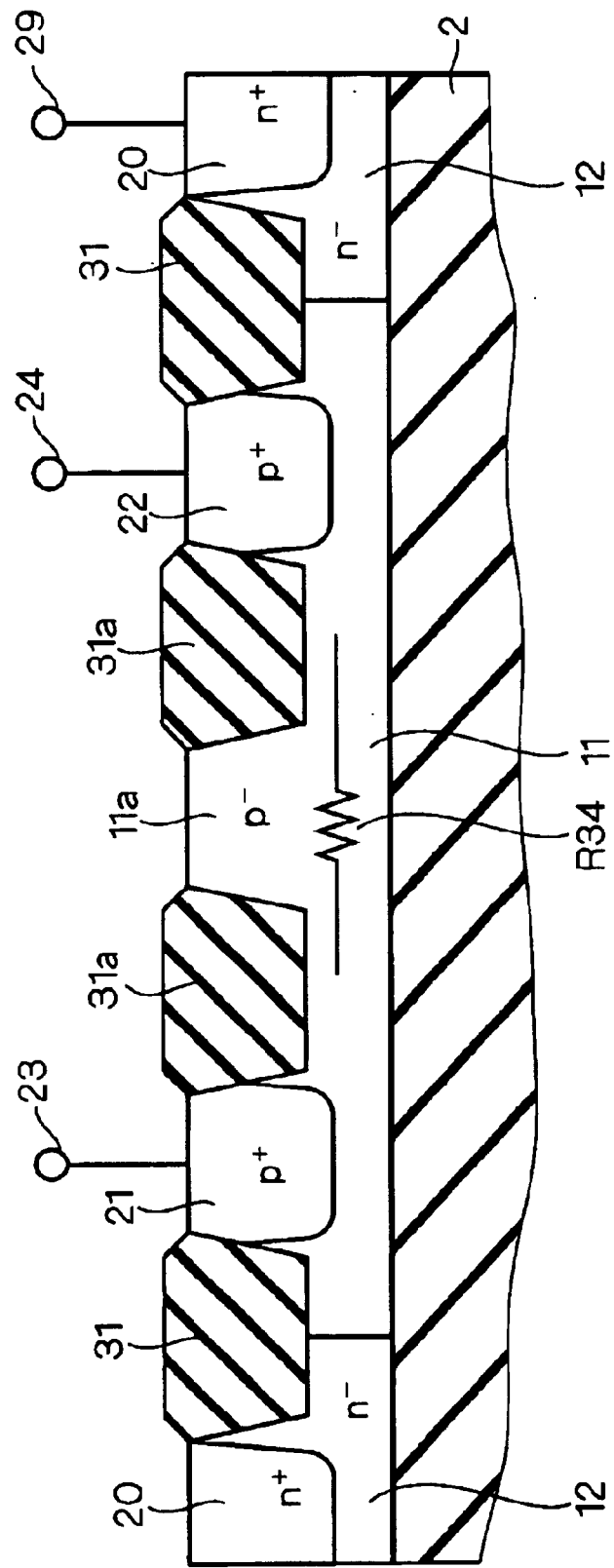
FIG. 30 is a sectional view showing a resistive element formation region of a semiconductor device according to a third mode of the seventh embodiment.

FIG. 30 is a sectional view showing a resistive element formation region of a semiconductor device according to a third mode of the seventh embodiment.

As shown in FIG. 30, p⁺ regions 21 and 22 are isolated by a partial oxide film 31 and a partial isolation region to be a p well region 11 provided thereunder. The p⁺ region 21 and the p⁺ region 22 are electrically connected to each other through the p well region 11 provided under two partial oxide films 31a and a p well region 11a where the partial oxide film 31 is not formed, and a resistive element R34 can be formed between a resistive terminal 23 provided on the p⁺ region 21 and a resistive terminal provided on the p⁺ region 22. Other structures are the same as those in the first mode.

According to the third mode, the resistive element R34 is formed by the p well region 11a on which the partial oxide film 31 is not provided. Therefore, dishing can be suppressed during the formation of the partial oxide film 31.

In the seventh embodiment described above, an impurity for determining a resistance value is implanted through the partial oxide film 31 during the formation of a source-drain region. Therefore, it is possible to suppress a variation in the resistance value by the provision of a region where the partial oxide film 31 is not formed as in the third mode.

(Applied Example)

Figure 31:
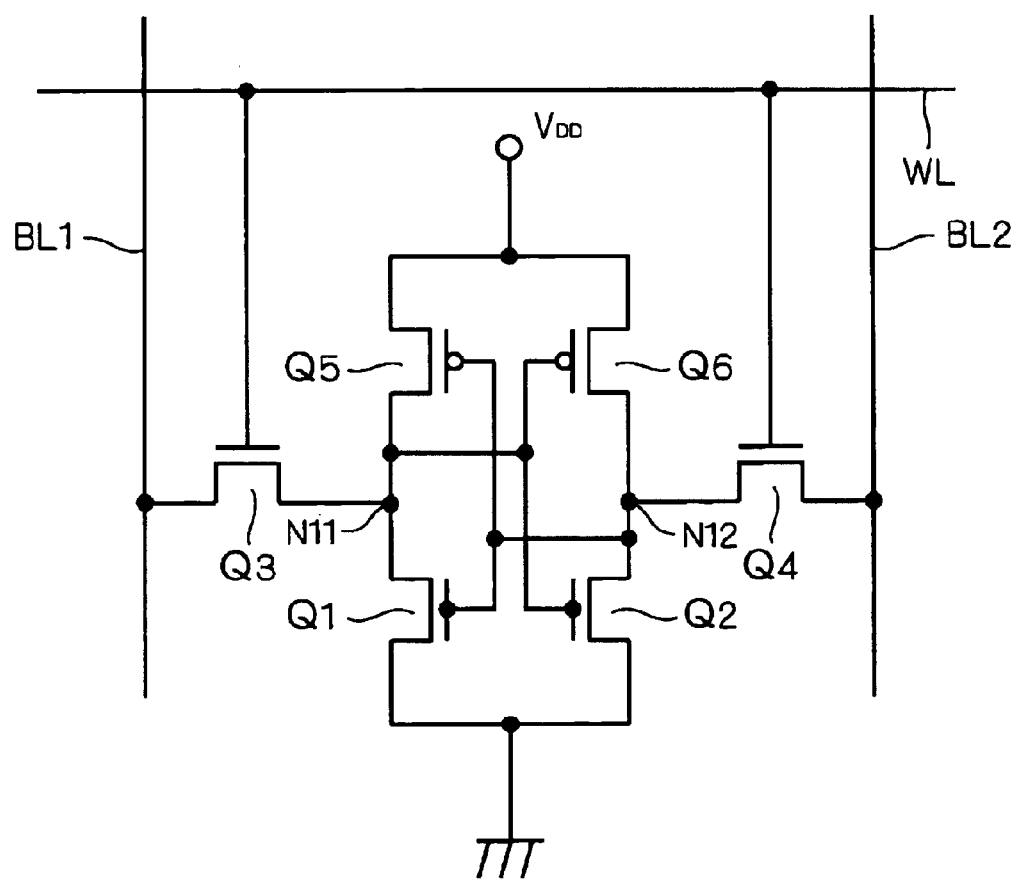
FIG. 31 is a circuit diagram showing an SRAM cell having a 6-transistor CMOS structure.

FIG. 31 is a circuit diagram showing an SRAM cell having a 6-transistor CMOS structure. As shown in FIG. 31, a CMOS inverter having an NMOS transistor Q1 and a PMOS transistor Q5 and a CMOS inverter having an NMOS transistor Q2 and a PMOS transistor Q6 are cross connected between nodes N11 and N12. Thus, a latch is constituted.

An NMOS transistor Q3 is inserted between a bit line BL and the node N11, an NMOS transistor Q4 is inserted between a bit line BL2 and a node N12, and gates of the NMOS transistors Q3 and Q4 are connected to a word line WL. The NMOS transistors Q1 and Q2 and the PMOS transistors Q5 and Q6 are referred to as driver transistors, and the NMOS transistors Q3 and Q4 are referred to as access transistors.

Figure 32:
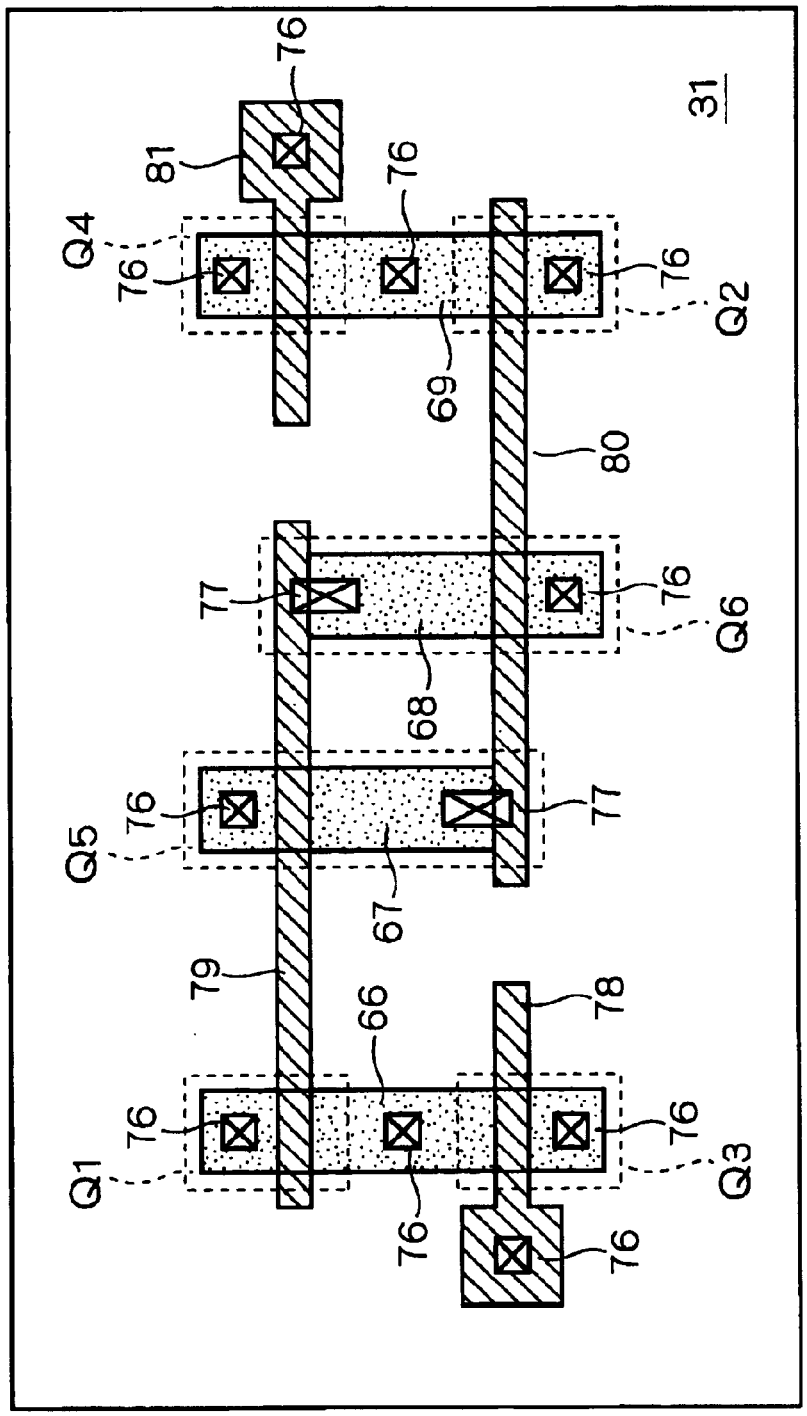
FIG. 32 is a plan view showing a layout structure for implementing the SRAM cell illustrated in FIG. 31.

FIG. 32 is a plan view showing a layout structure for implementing the SRAM cell illustrated in FIG. 31. As shown in FIG. 32, active regions 66 to 69 are isolated through the partial oxide film 31 and are selectively formed. The active regions 66 and 69 are n-type impurity regions and the active regions 67 and 68 are p-type impurity regions.

In FIG. 32, a gate electrode 78 is formed across the active region 66, a gate electrode 79 is formed across the active regions 66 and 67, a gate electrode 80 is formed across the active regions 68 and 69, and a gate electrode 81 is formed across the active region 69.

Moreover, the active regions 66 to 69 and the gate electrodes 78 and 82 are provided with a contact 78 in predetermined portions respectively, and is electrically connected through the contact 76 to a wiring such as a bit line BL or a word line WL which is not shown. Moreover, the active region 67 is electrically connected to the gate electrode 80 through a shared contact 77.

With such a structure, the NMOS transistor Q1 is constituted by the active region 66 and the gate electrode 79, the NMOS transistor Q2 is constituted by the active region 69 and the gate electrode 80, the NMOS transistor Q3 is constituted by the active region 66 and the gate electrode 78, the NMOS transistor Q4 is constituted by the active region 69 and the gate electrode 81, the PMOS transistor Q5 is constituted by the active region 67 and the gate electrode 79, and the PMOS transistor Q6 is constituted by the active region 68 and the gate electrode 80.

Figure 33:
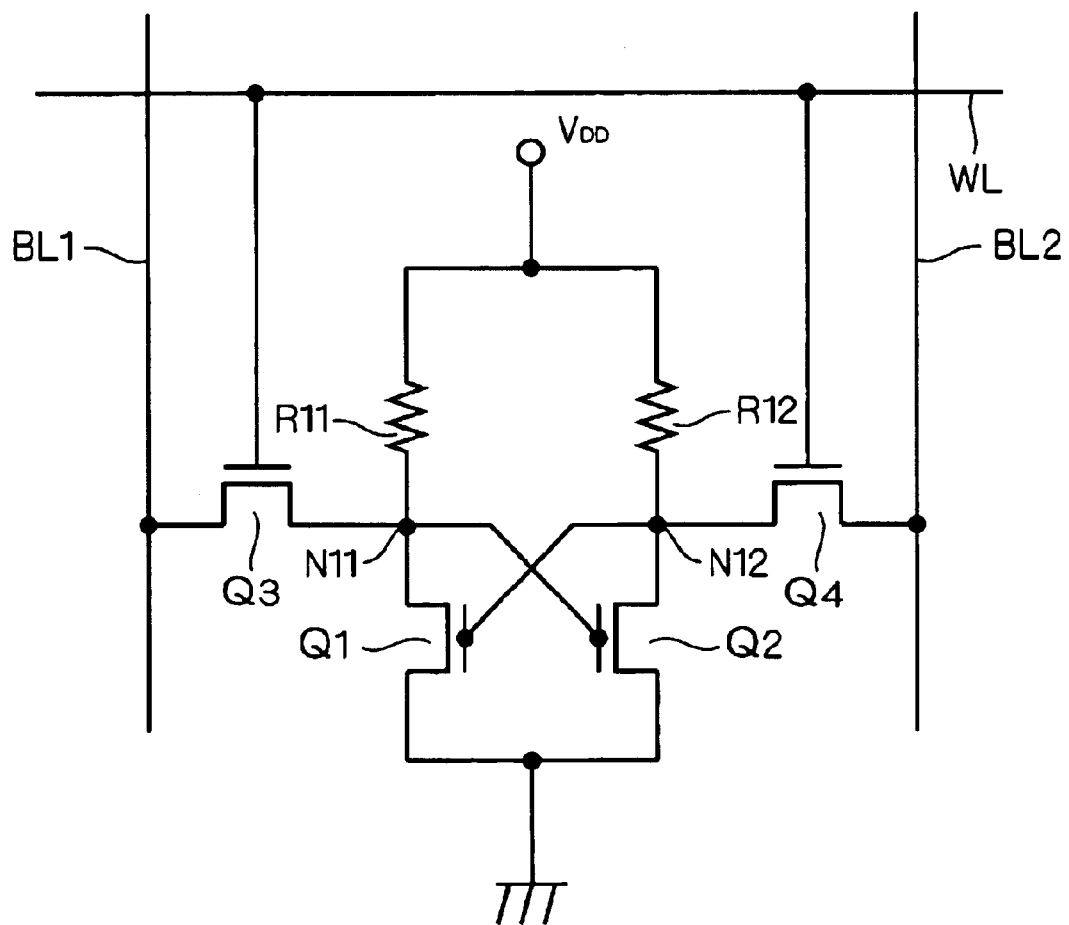
FIG. 33 is a circuit diagram showing an SRAM cell having a high resistance load type cell structure.

FIG. 33 is a circuit diagram showing an SRAM cell having a high resistance load type cell structure. As shown in FIG. 33, an NMOS inverter having an NMOS transistor Q1 and a resistor R11 and an NMOS inverter having an NMOS transistor Q2 and a resistor R12 are cross connected between nodes N11 and N12. Thus, a latch is constituted. Other structures are the same as those of the SRAM cell shown in FIG. 31.

Figure 34:
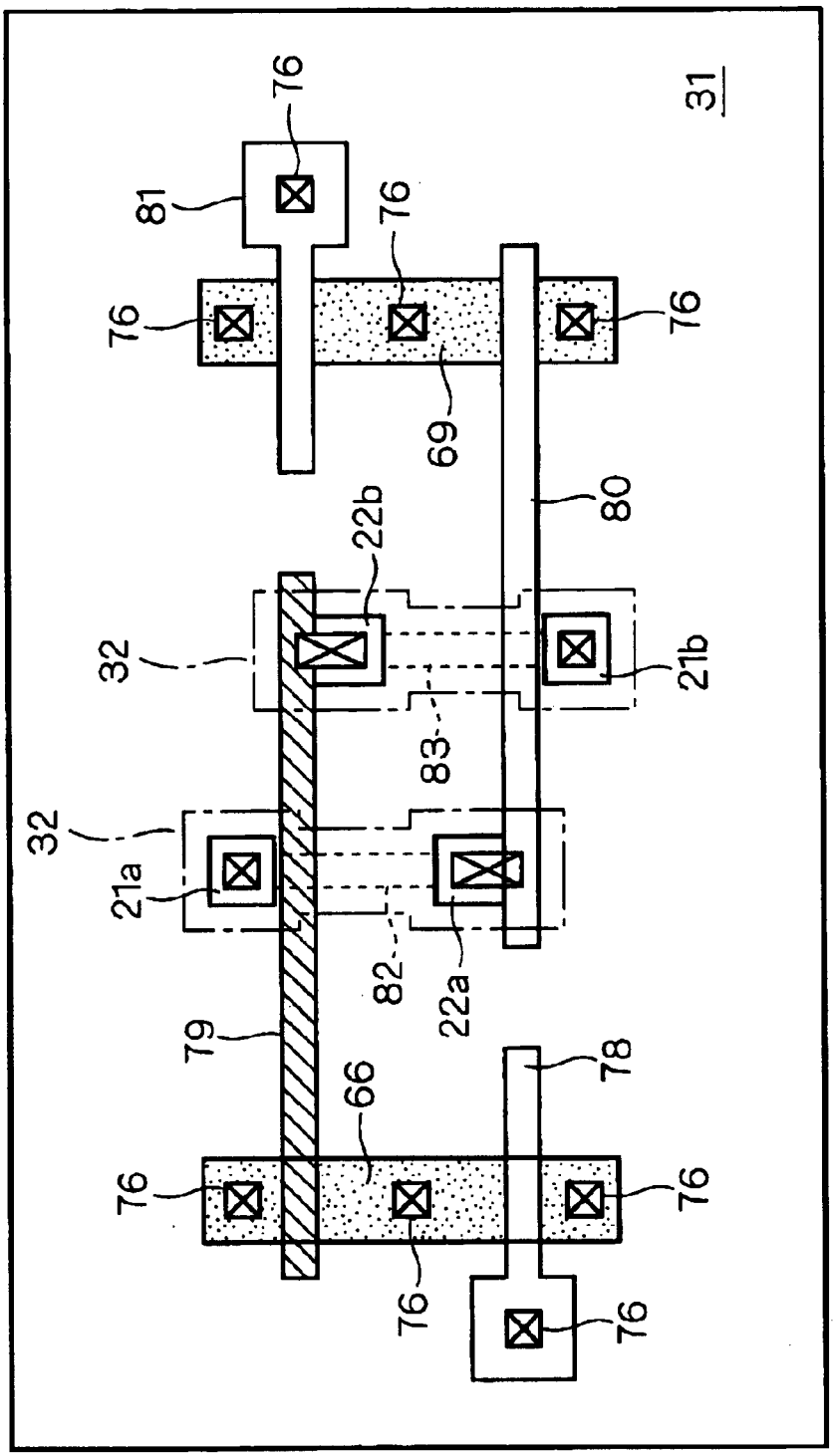
FIG. 34 is a plan view showing a layout structure for implementing the SRAM cell illustrated in FIG. 33.

FIG. 34 is a plan view showing a layout structure for implementing the SRAM cell illustrated in FIG. 33. As shown in FIG. 34, active regions 66 and 69 are isolated through the partial oxide film 31 and are selectively formed. The active regions 66 and 69 are n-type impurity regions.

Furthermore, p$^+$ regions 21a, 21b, 22a and 22b are selectively formed and resistive layer formation well regions 82a and 82b where a resistive element shown in the second mode of the seventh embodiment is to be formed are provided between the p$^+$ regions 21a and 22a and the p$^+$ regions 21b and 22b, respectively. The resistive element formation well regions 82a and p$^+$ regions 21a and 22a and the resistive element formation well region 82b and p$^+$ regions 21b and 22b are completely isolated from other elements through a complete oxide film 32 formed therearound.

In FIG. 34, a gate electrode 78 is formed across the active region 66, a gate electrode 79 is formed across the active region 67, a gate electrode 80 is formed across the active region 69, and a gate electrode 81 is formed across the active region 69.

Moreover, the active regions 66 and 69 and the gate electrodes 78 and 82 are provided with a contact 78 in predetermined portions respectively, and is electrically connected through the contact 76 to a wiring such as a bit line BL or a word line WL which is not shown. Moreover, the p$^+$ region 22a is electrically connected to the gate electrode 80 through a shared contact 77, and the p$^+$ region 22b is electrically connected to the gate electrode 79 through the shared contact 77.

With such a structure, the NMOS transistor Q1 is constituted by the active region 66 and the gate electrode 79, the NMOS transistor Q2 is constituted by the active region 69 and the gate electrode 80, the NMOS transistor Q3 is constituted by the active region 66 and the gate electrode 78, the NMOS transistor Q4 is constituted by the active region 69 and the gate electrode 81, a resistor R11 to be a load resistor (LOAD element) is constituted by the p$^+$ regions 21a and 22a and the resistive element formation well region 82a, and a resistor R12 to be the load resistor is constituted by the p$^+$ regions 21b and 22b and the resistive element formation well region 82b.

By a comparison between FIG. 32 and FIG. 34, the formation area of the resistive element formation well regions 82a and 82b is set to be smaller than that of the active regions 67 and 68. Consequently, an SRAM cell area can be reduced.

<Eighth Embodiment>

Figure 35:
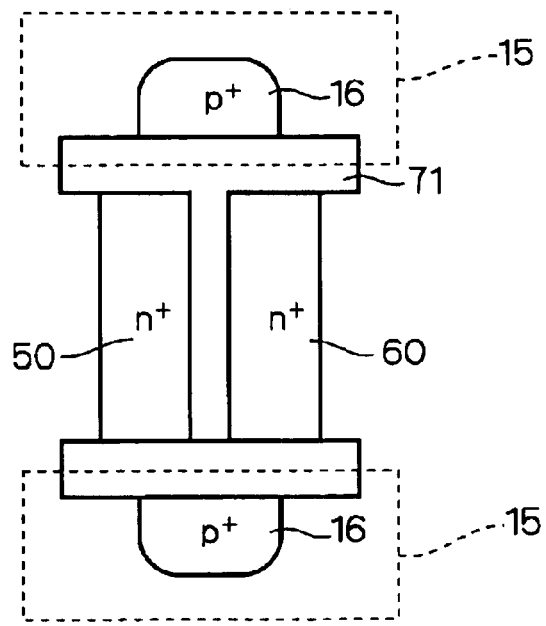
FIG. 35 is a plan view showing a general H gate electrode.

FIG. 35 is a plan view showing a general H gate electrode. As shown in FIG. 35, an H gate electrode 71 electrically isolates a body region 16 formed adjacently to a source region 50 and a drain region 60 in a gate width W direction from the drain region 60 and the source region 50 through "I" in a transverse direction, and a central "−" functions as a gate electrode of an original MOS transistor.

With such a structure, a p$^+$ implantation mask opening 15 for implantation into the body region 16 is partially provided at an end of the H gate electrode 71. Accordingly, a p-type impurity is also implanted together with an n-type impurity at the end of the H gate electrode 71. Consequently, there is a problem in that a gate oxide film provided under the H gate electrode 71 is greatly damaged during the ion implantation. Moreover, there is a problem in that B, BF$_2$ or the like implanted as the p-type impurity is diffused into a gate electrode region formed in an active region, resulting in a variation in a threshold voltage depending on a process temperature.

Figure 36:
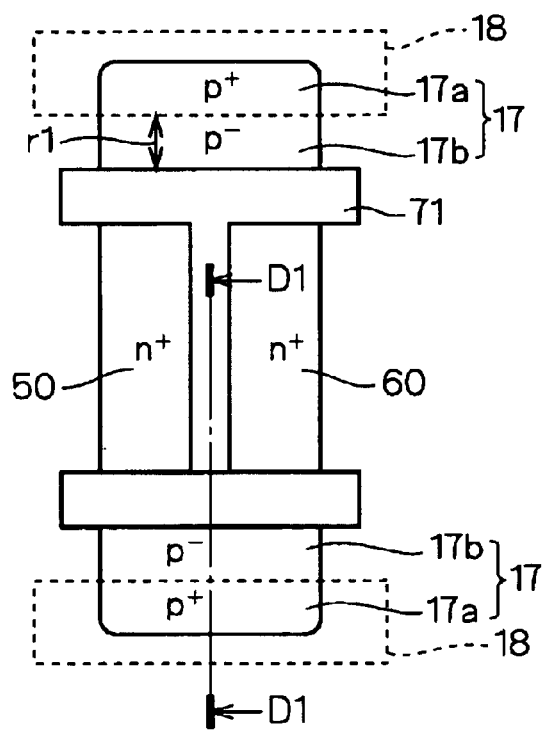
FIG. 36 is a plan view showing a planar structure of a semiconductor device according to an eighth embodiment of the present invention.
Figure 37:
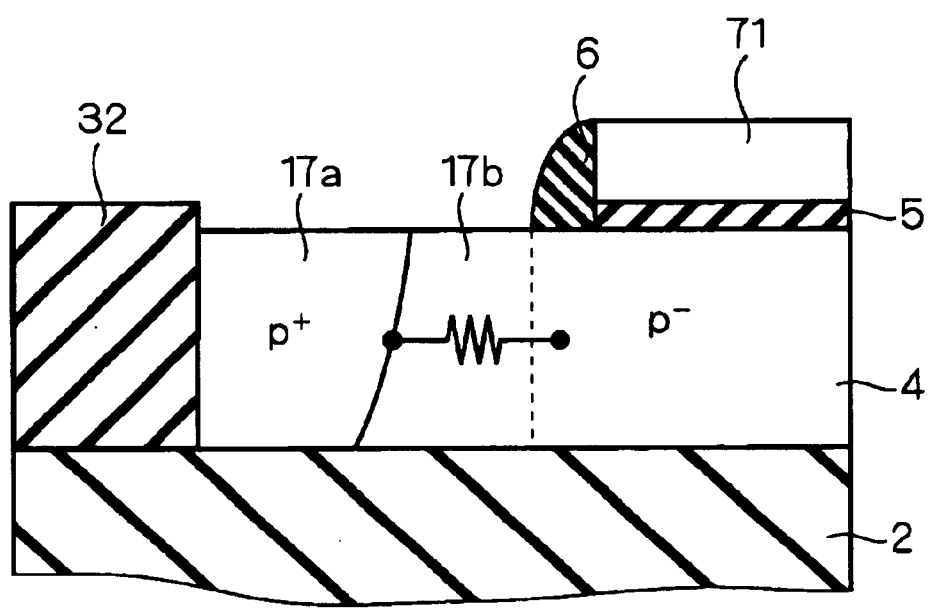
FIG. 37 is a sectional view showing a section taken along a line D1—D1 in FIG. 36, FIGS. 38 to 52 are sectional views showing a partial isolation flow.

FIG. 36 is a plan view showing a planar structure of a semiconductor device according to an eighth embodiment of the present invention. FIG. 37 is a sectional view showing a section taken along a line D1—D1 in FIG. 36.

As shown in these drawings, the H gate electrode 71 is provided with a p$^-$ body region 17b in a region adjacent to "I" on the right and left and is provided with a p$^+$ body region 17a adjacent to the p$^-$ body region 17b. Thus, a body region 17 is formed.

Thus, the p$^+$ body region 17a is provided with a distance r1 from the H gate electrode 71 so that the p$^+$ implantation mask opening 16 can be reliably prevented from being partially provided at the end of the H gate electrode 71.

As compared with the structure shown in FIG. 35, accordingly, the damage caused to the gate oxide film provided under the H gate electrode 71 during the implantation of the impurity can be relieved more considerably. Consequently, the reliability of the gate oxide film can be enhanced and the variation in the threshold voltage can be suppressed effectively.

In addition, the distance r1 is provided between the p$^+$ body region 17a and the H gate electrode 71. Therefore, it is possible to prevent the threshold voltage from being varied due to the diffusion, into the gate electrode region, of B, BF$_2$ or the like implanted as the p-type impurity for forming the p$^+$ body region 17a.

With the structure shown in FIG. 36, the p-type impurity is implanted into the end of the H gate electrode 71 during the formation of a pocket region at most. Therefore, a concentration of the p-type impurity in the end of the H gate electrode 71 can be controlled to be $5 \times 10^{18}$ cm$^{-3}$ or less. Thus, the variation in the threshold can be suppressed.

As shown in FIG. 37, moreover, the p$^-$ body region 17b having a low impurity concentration is provided between an SOI layer 4 provided under the H gate electrode 71 and the p$^+$ body region 17a. Therefore, there is a possibility that a body resistance value might be increased.

However, the provision of a silicide on the p$^-$ body region 17b can solve the problem comparatively easily. It is apparent that the eighth embodiment can be exactly applied to a T gate electrode structure as well as the H gate electrode structure.

Referring to an isolation technique, moreover, the eighth embodiment is used for the H gate electrode—T gate electrode structure fabricated through a complete isolation, a partial isolation, a partial isolation and complete isolation combination. It is apparent that this structure can also be applied to PMOS and CMOS.

While the SOI transistor fabricated on single crystal Si has been described in the first to eighth embodiments, it is a matter of course that the present invention can also be applied to a polysilicon TFT (Thin Film Transistor) formed on polycrystalline Si.

<Partial Isolation Flow>

Description will be given to examples of a partial isolation flow and a partial isolation—complete isolation combination flow.

FIGS. 38 to 52 are sectional views showing a partial isolation flow for forming an element in a first region isolated from a partial isolation region. The partial isolation flow will be described below with these drawings.

Figure 38:
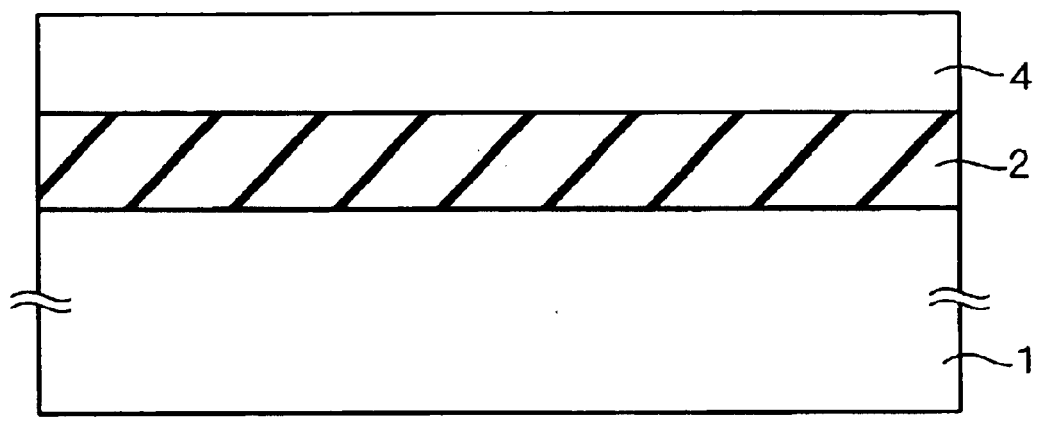

As shown in FIG. 38, first of all, an SOI substrate to be an initial wafer is prepared. The SOI substrate is formed by a multilayered structure having a semiconductor substrate 1, a buried oxide film 2 and an SOI layer 4. Typically, the SOI layer 4 has a thickness of 30 to 400 nm and the buried oxide film 2 has a thickness of 100 to 500 nm. For uses in a power device, the SOI layer 4 has a thickness of several to several tens μm.

Figure 39:
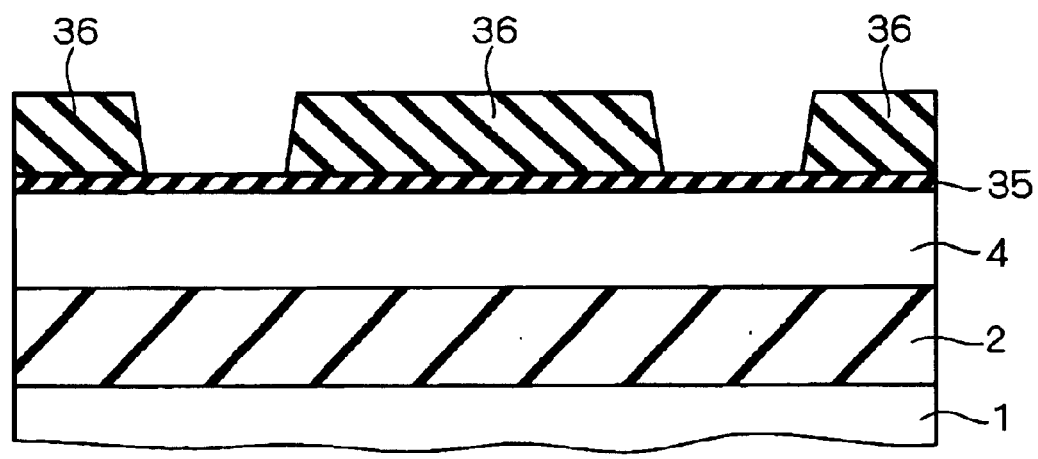

As shown in FIG. 39, next, an oxide film 35 is formed on a surface of the SOI layer 4. A thermal oxide film, a TEOS oxide film and the like are used for the oxide film 35. The oxide film 35 has a thickness of approximately 5 to 40 nm. Then, a nitride film 36 is deposited on the oxide film 35. The nitride film 36 has a thickness of 50 to 300 nm. The nitride film 36 can be deposited through LPCVD (Low Pressure Chemical Vapor Deposition) or plasma nitride film CVD.

Subsequently, the nitride film 36 is subjected to lithography. More specifically, a resist formed on the nitride film 36 is used as a mask and the nitride film 36 is subjected to patterning by an RIE (Reactive Ion Etching) or ECR (Electron Cyclotron Resonance) device. Then, the resist is removed through ashing or aqueous persulfate.

Figure 40:
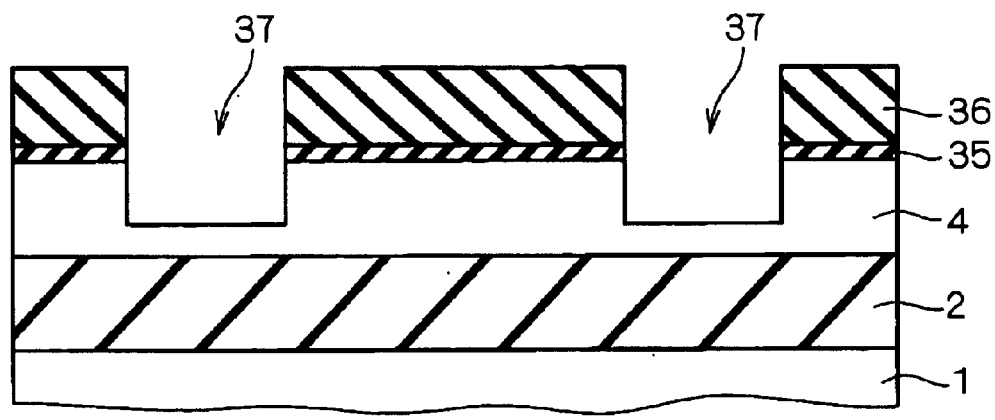

As shown in FIG. 40, thereafter, the oxide film 35 and the SOI layer 4 are etched by using the patterned nitride film 36 as a mask by means of the RIE device of the ECR device. Thus, a trench 37 is selectively formed. In this case, the trench 37 is formed such that a part of the SOI layer 4 remains.

Figure 41:
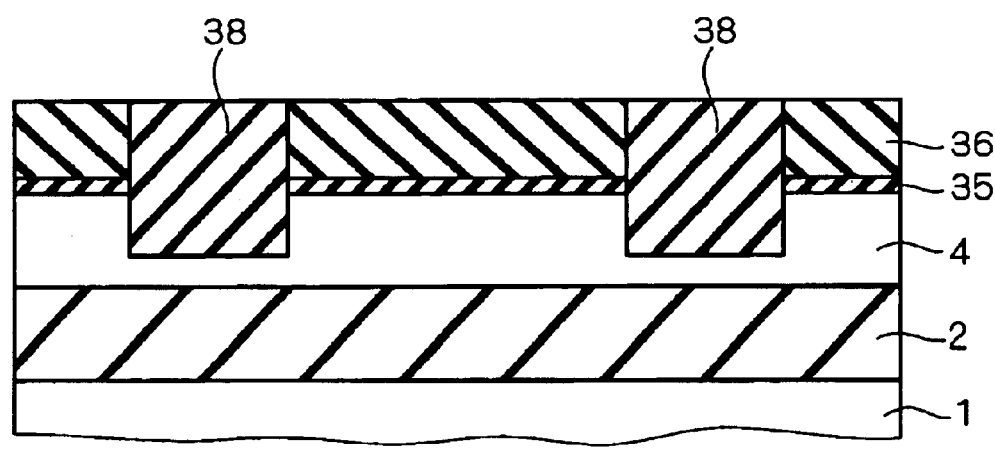

As shown in FIG. 41, next, an oxide film 38 is provided over the whole surface. The oxide film 38 can be deposited by using a plasma TEOS device, an HDP (High Density Plasma) device or the like. The oxide film 38 has a thickness of approximately 100 to 500 nm. Then, a surface is flattened by using a CMP (Chemical Mechanical Polishing) device. As a result, the oxide film 38 can be buried in the trench 37.

Thereafter, a heat treatment is carried out at a temperature of 1000° C. to 1100° C. Thus, the quality of the provided oxide film 38 can be enhanced. In the stage of FIG. 40 in which the oxide film 38 has not been provided, moreover, it is effective that an internal wall of the trench 37 is subjected to high temperature thermal oxidation at a temperature of 900° C. to 1000° C. to round corner portions of the SOI layer 4 in upper and bottom parts of the trench because a stress can be relieved.

As shown in FIG. 42, next, the oxide film is etched back through the RIE, the ECR or wet etching. Then, the nitride film 36 is removed by using hot phosphoric acid. Thus, a partial oxide film 31 is finished. A region isolated by the partial oxide film 31 and the SOI layer 4 provided under the partial oxide film 31 acts as an element formation region. At this time, the oxide film 35 remaining on the SOI layer 4 (active) may be completely removed and a thermal oxide film or an oxide film may be provided again.

Figure 43:
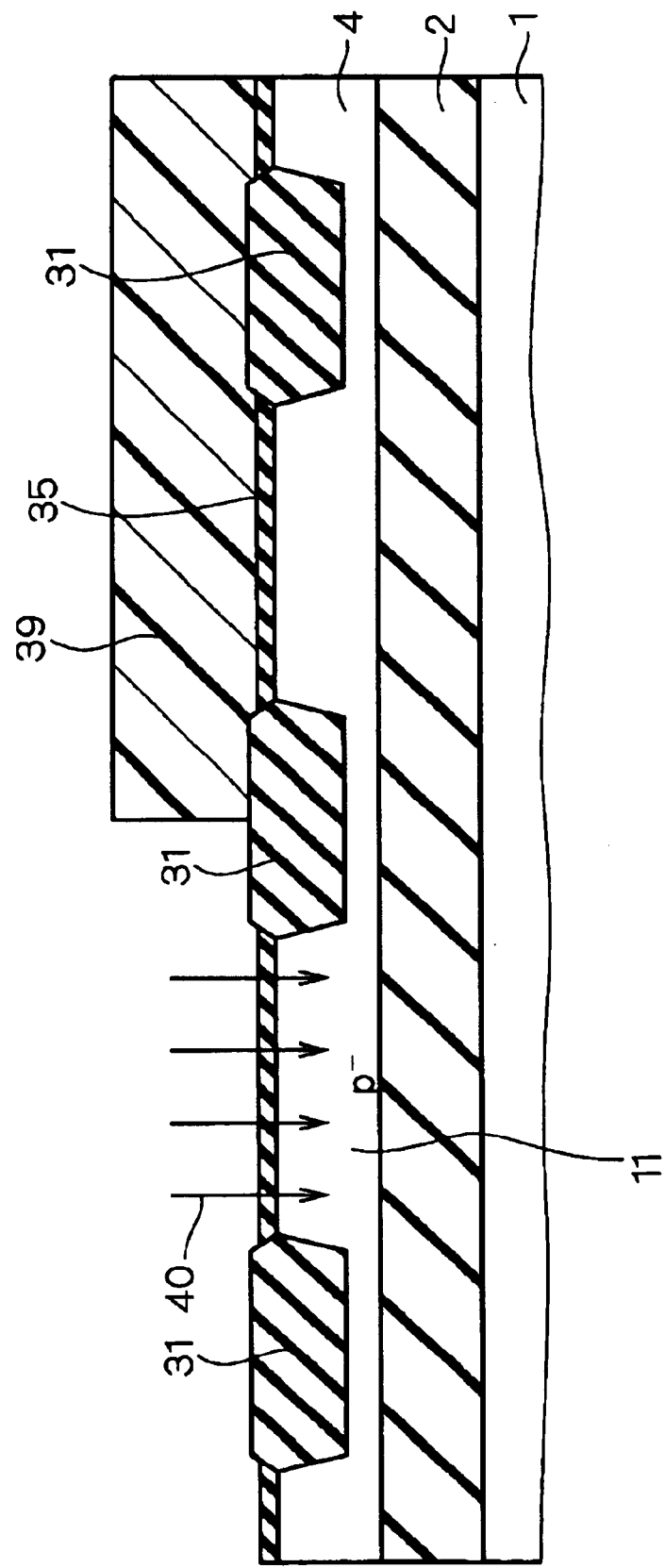

As shown in FIG. 43, a B (boron) ion 40 is implanted to form a p well region 11 by using, as a mask, a resist 39 patterned through lithography.

Figure 44:
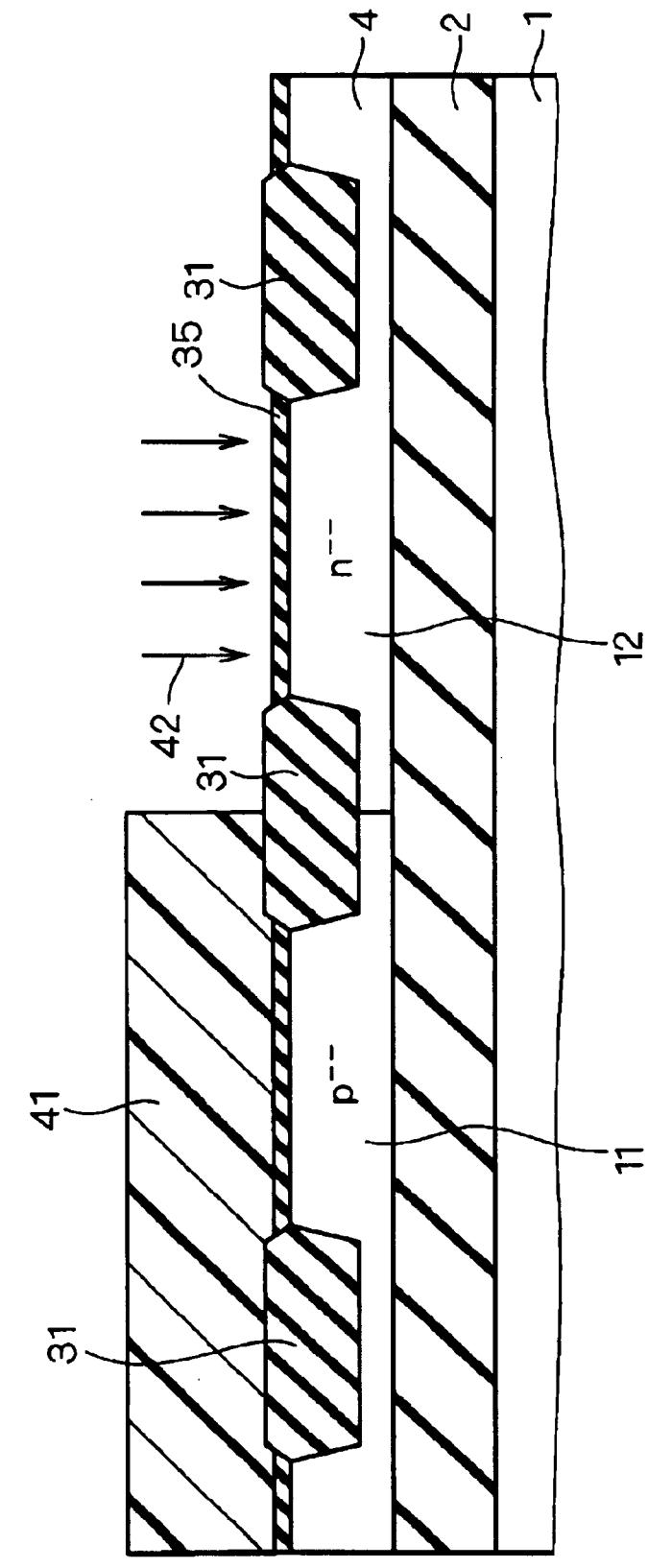

As shown in FIG. 44, subsequently, a P (phosphorus) ion 42 is implanted to form an n well region 12 by using, as a mask, a resist 41 obtained by the patterning through the lithography.

In order to form the n well region 12, an impurity such as As or Sb may be used in addition to P. In order to form the p well region 11, BF$_2$, In or the like may be used in addition to B. Each of the p well region 11 and the n well region 12 is set to have an impurity concentration of $1 \times 10^{15}$ to $1 \times 10^{19}$ cm$^{-2}$.

Figure 45:
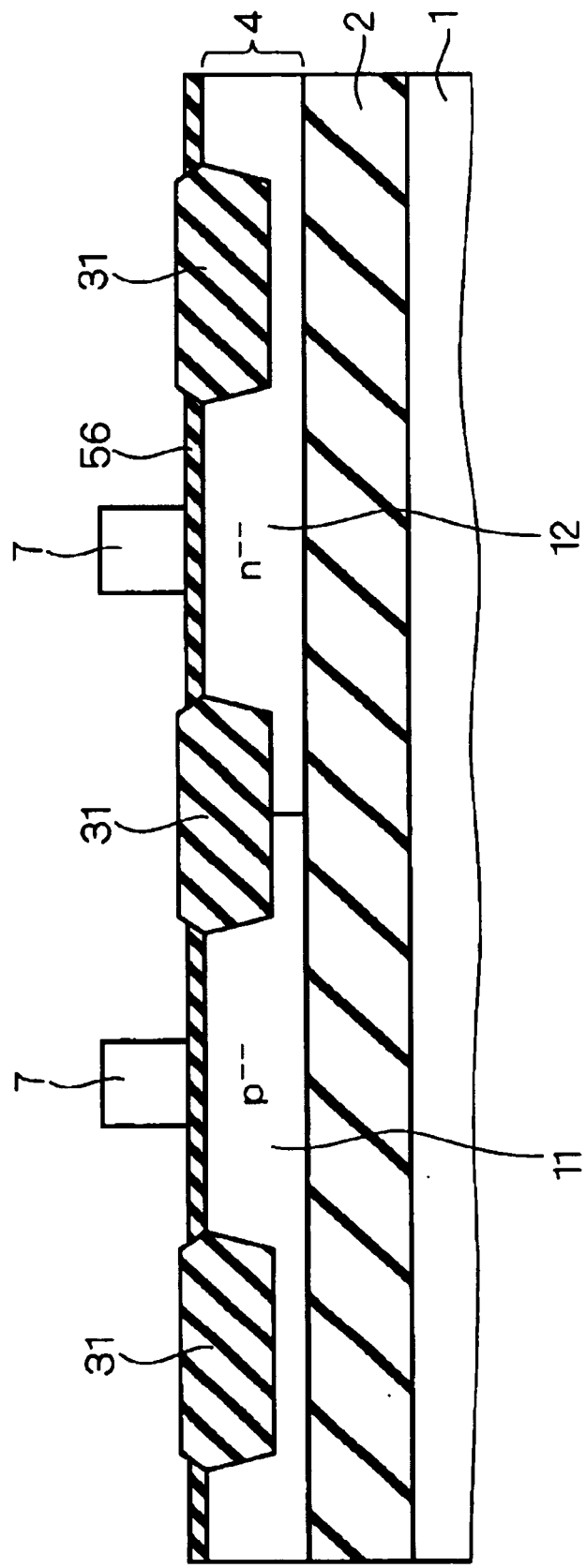

As shown in FIG. 45, the oxide film 35 formed on the surface of the SOI layer 4 is removed through wet etching, and an oxide film 56 for a gate oxide film is then formed. For the oxide film 56, it is also possible to use a metal oxide film such as Al$_2$O$_3$, a high dielectric oxide film such as Ta$_2$O$_5$ or BST and the like as well as a thermal oxide film and a nitride oxide film which are usually used.

Next, a polysilicon layer is provided in a thickness of approximately 100 to 400 nm by using the LPCVD device. For the polysilicon layer, a polysilicon layer having an impurity such as P or B implanted therein may be used. Furthermore, a metal electrode such as W, Ta or Al may be used in place of the polysilicon layer to be the material of a gate electrode.

Next, the lithography is carried out. Then, the polysilicon layer is processed by using an anisotropic etching device such as the RIE or the ECR. Thus, a gate electrode 7 is formed. At this time, an oxide film or a nitride film/oxide film may be provided as an insulating film on the polysilicon layer and the insulating film may be used as a mask to process the polysilicon layer after the lithography. While the gate electrode 7 is typically shown in FIG. 45, a gate electrode such as an H gate electrode 71, a T gate electrode 72 or a special H gate electrode 73 may be formed and a data electrode structure may be changed for each element formation region.

Figure 46:
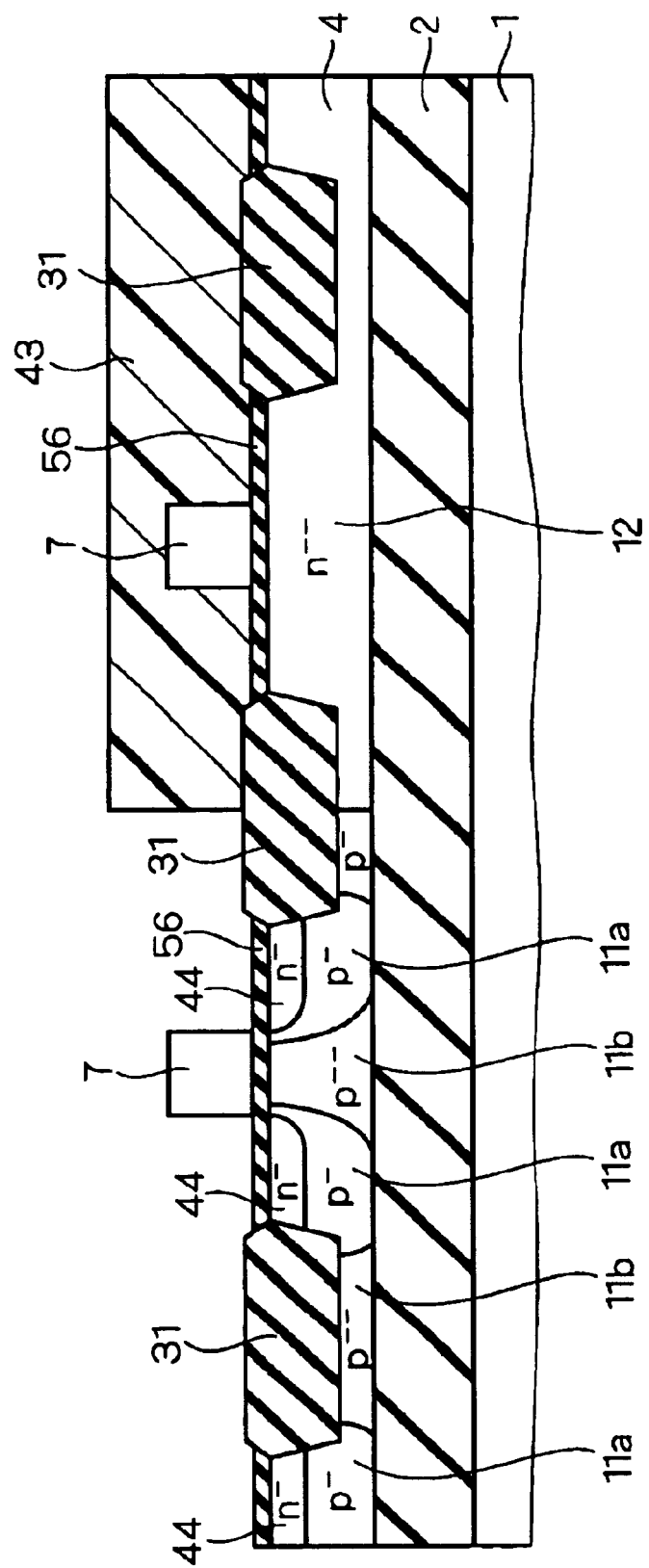

As shown in FIG. 46, next, a p-type impurity is implanted by using, as masks, a resist 43 patterned by the lithography and the gate electrode 7. Thus, a pocket region 11a is formed. The pocket region 11a has the function of suppressing a short channel effect caused by microfabrication. The short channel effect is also influenced by conditions such as a junction depth of a source-drain, a gate oxide film and the like. Accordingly, if the conditions and the like are optimized to suppress the short channel effect, it is also possible to omit the step of forming the pocket region.

As the p-type impurity for the formation of the pocket region, B, $BF_2$ or In is implanted in a concentration of approximately $1\times10^{12}$ to $1\times10^{14}$ $cm^{-2}$. Thus, a pocket region 11a is formed.

Furthermore, after the pocket region is formed, an n-type impurity is implanted by using the resist 43 and the gate electrode 7 as masks. Thus, an n extension region 44 is formed. As the n-type impurity, it is preferable that As, P or Sb should be used in a concentration of approximately $1\times10^{13}$ to $1\times10^{15}$ $cm^{-2}$.

Figure 47:
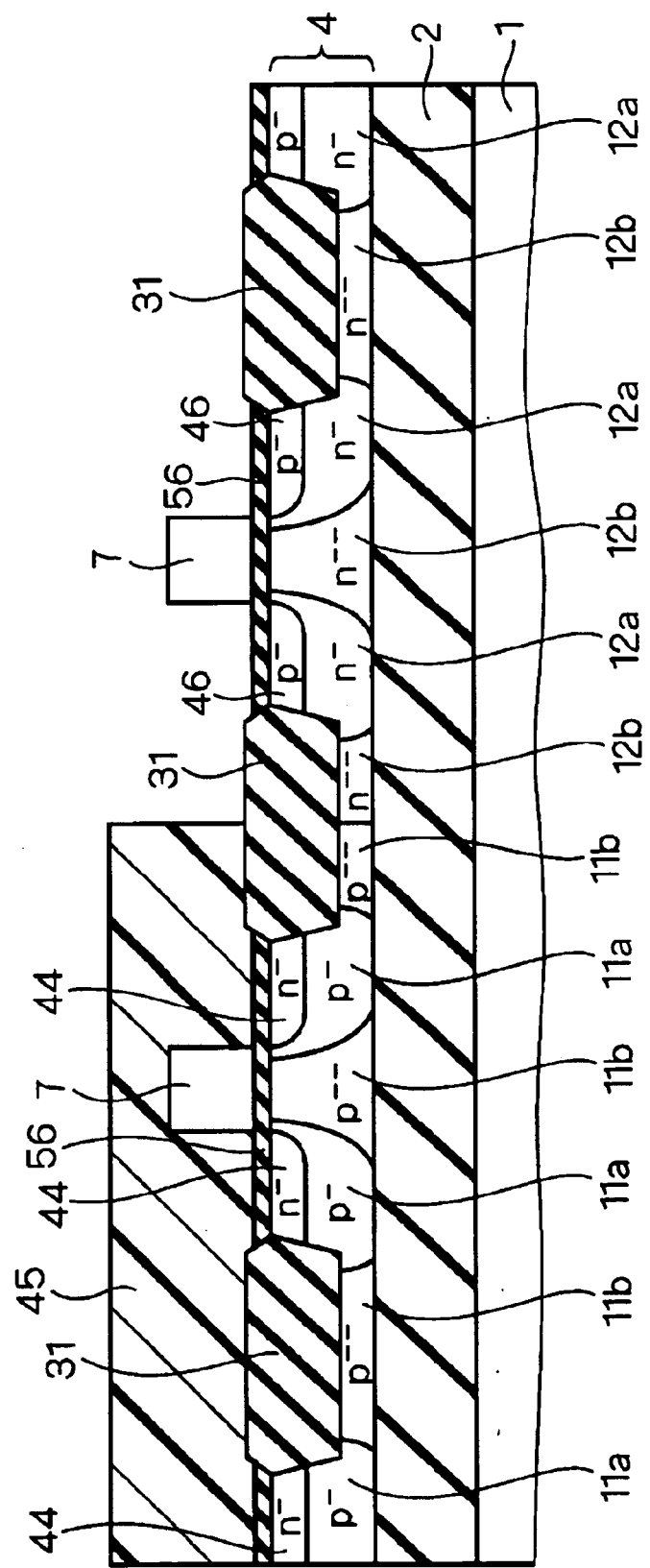

As shown in FIG. 47, next, an n-type impurity is implanted by using, as masks, a resist 45 patterned by the lithography and the gate electrode 7. Thus, a pocket region 12a is formed.

As the n-type impurity for the formation of the pocket region, As, P or Sb is implanted in a concentration of approximately $1\times10^{12}$ to $1\times10^{14}$ $cm^{-2}$. Thus, the pocket region 12a is formed.

Furthermore, after the formation of the pocket region, a p-type impurity is implanted by using the resist 45 and the gate electrode 7 as masks. Thus, an n extension region 46 is formed. As the p-type impurity, it is preferable that B, $BF_2$ or In should be used in a concentration of approximately $1\times10^{13}$ to $1\times10^{15}$ $cm^{-2}$.

While both the pocket region 11a and the p extension region 46 are shown in "p$^-$" for convenience in FIGS. 46 and 47, the p extension region 46 actually has a higher impurity concentration. Similarly, while both the pocket region 12a and the n extension region 44 are shown in "n$^-$" for convenience, the n extension region 44 actually has a higher impurity concentration.

Figure 48:
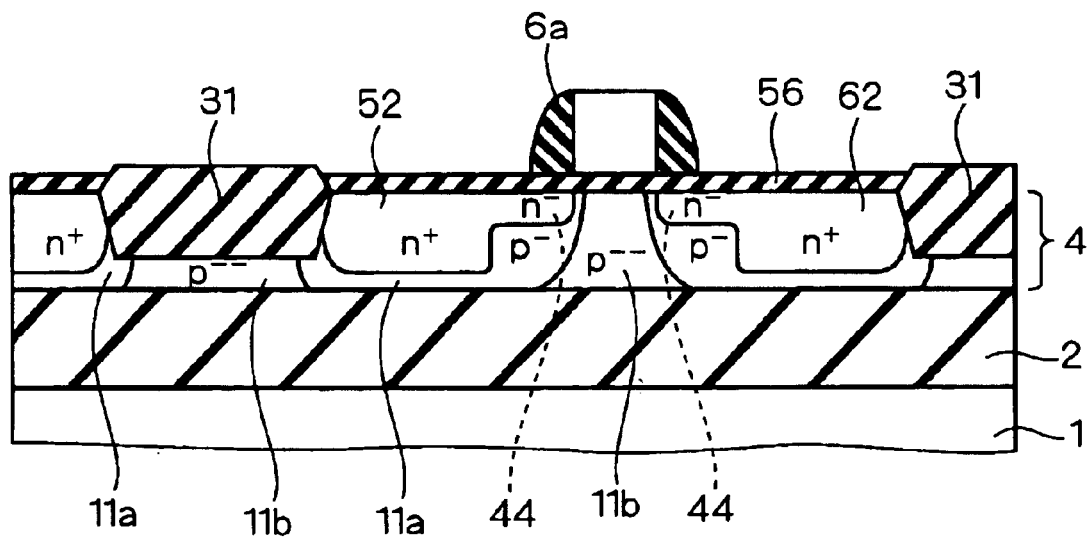

In FIG. 48 and succeeding drawings which will be described below, an NMOS transistor will be explained typically. A PMOS transistor is formed in the same manner as the NMOS transistor except that a conductivity type is reverse to that of the NMOS transistor.

As shown in FIG. 48, next, a side wall film is deposited on a side surface of the gate electrode 7. A TEOS film or a plasma oxide film is used as the side wall film. Moreover, an insulating film having a two-layer structure of $Si_3N_4$ or $Si_3N_4/SiO_2$ formed by the LPCVD or the plasma CVD may be used. After the deposition, etch back is carried out to form a side wall 6.

Next, the lithography is carried out to implant an n-type impurity in an NMOS formation region. Thus, a source region 52 and a drain region 62 are formed. As the n-type impurity, As, P, Sb or the like is implanted in a concentration of approximately $1\times10^{14}$ to $1\times10^{16}$ $cm^{-2}$. During the formation of the source region 52 and the drain region 62, an n-type body region of the PMOS may be formed together.

A source-drain region of the PMOS can be formed by implanting a p-type impurity such as B, $BF_2$ or In in a concentration of approximately $1\times10^{14}$ to $1\times10^{16}$ $cm^{-2}$, which is not shown in FIG. 48. In this case, a p-type body region of the NMOS may be formed together. Subsequently, annealing (800 to 1150° C.) for activating the source-drain region is carried out.

Figure 49:
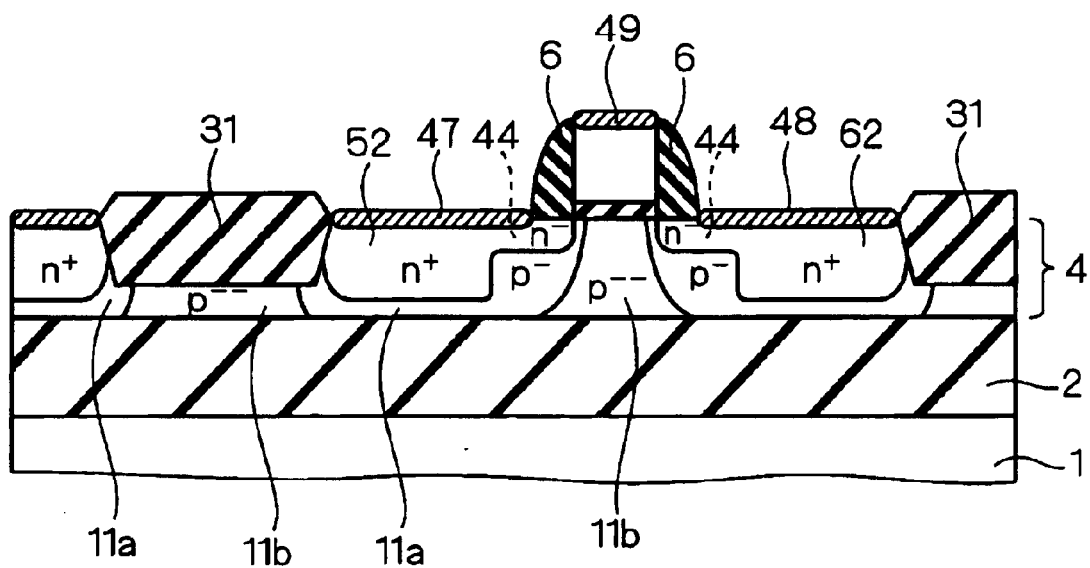

As shown in FIG. 49, next, an oxide film 56 in a portion to be silicided (the source region 52, the drain region 62, the gate electrode 7, a body region (not shown) or the like) is removed. Accordingly, only the oxide film 56 provided under the gate electrode 7 and the side wall 6a remains, and the oxide film 56 provided under the gate electrode 7 acts as a gate oxide film 5 and the oxide film 56 provided under the side wall 6a and the side wall 6a act as the side wall 6. Then, silicide regions 47, 48 and 49 are formed on the surfaces of the source region 52, the drain region 62 and the gate electrode 7.

In this case, two or more PDSOI-MOSFETs of types 1 to 7 are formed in two or more element formation regions isolated by a partial isolation region, respectively. Thus, the semiconductor device according to the fifth embodiment can be obtained.

FIG. 49 shows a salicide process for siliciding a source-drain and a gate. In some cases, a polycide process for siliciding only the gate is carried out or a silicide protection oxide film is formed on the source-drain and the gate such that the siliciding is not completely carried out depending on uses (ESD: Electro-Static Discharge and the like). For the siliciding, $TiSi_2$, $CoSi_2$, $NiSi_2$, $WSi_2$, $TaSi_2$, $MoSi_2$, $HfSi_2$, $Pd_2Si$, PtSi, $ZrSi_2$ and the like are used.

Figure 50:
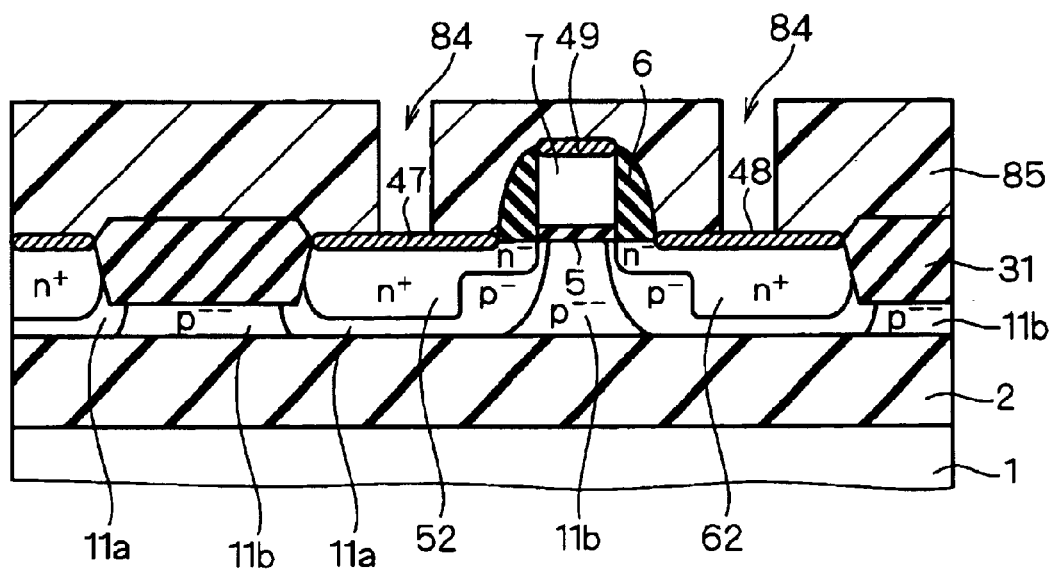

As shown in FIG. 50, next, an interlayer insulating film 85 formed of an oxide film is deposited in a thickness of approximately 1 $\mu$m over the whole surface. Then, CMP is carried out to flatten the interlayer insulating film 85. Thereafter, the lithography for contact formation is carried out and a contact hole 84 is formed on the silicide regions 47 and 48 by etching.

Figure 51:
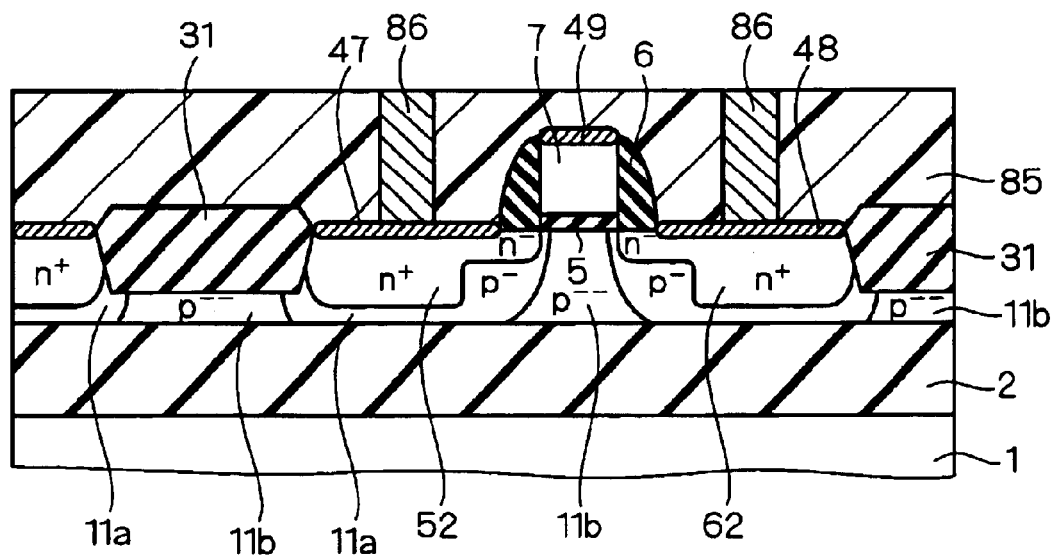

As shown in FIG. 51, subsequently, W (tungsten) is deposited over the whole surface. In place of W, Al, TiN, or a D-polysilicon layer may be deposited. Referring to W, a film forming method includes blanket CVD and selective CVD. Referring to Al, high temperature sputtering and reflow sputtering can be used. Referring to TiN and the D-polysilicon layer, LPCVD can be used. In order to enhance adhesion of W and a substrate insulating film, Ti, TiN and TiW may be formed before W is deposited. Description will be given to W in the blanket CVD. After W is deposited, it is completely flattened by etch back.

Figure 52:
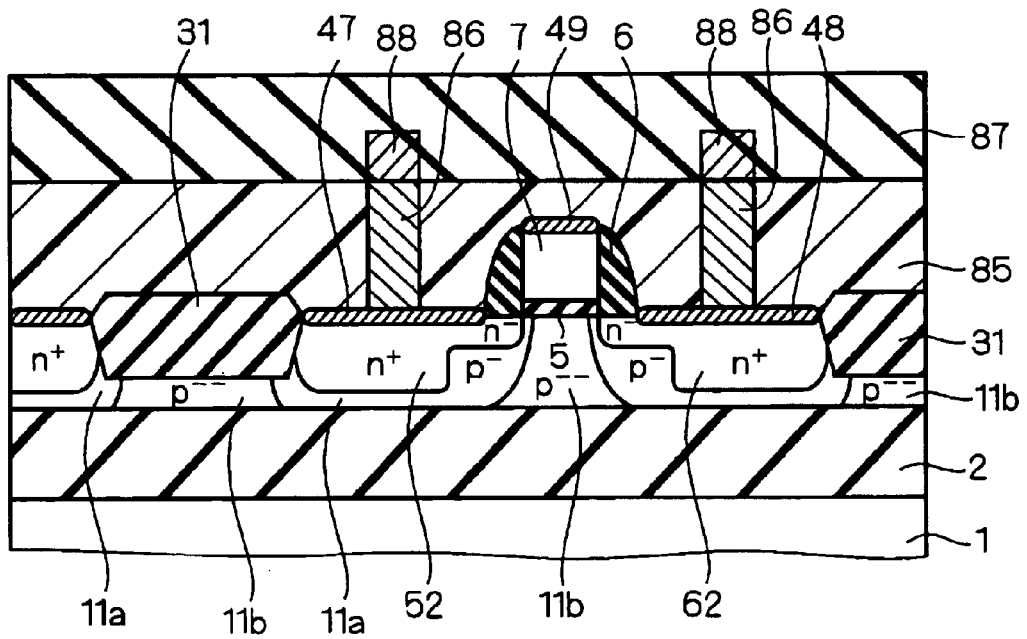

As shown in FIG. 52, next, an aluminum wiring layer 88 to be a first metal is deposited. As a matter of course, AlCuSi, Cu or the D-polysilicon layer may be used for a material of the aluminum wring layer 88. After the lithography, the aluminum wiring layer 88 is processed.

Then, an interlayer insulating film 87 is provided over the whole surface including the aluminum wiring layer 88, and is flattened to eliminate a concavo-convex step by using a CMP technique or the like.

Figure 53:
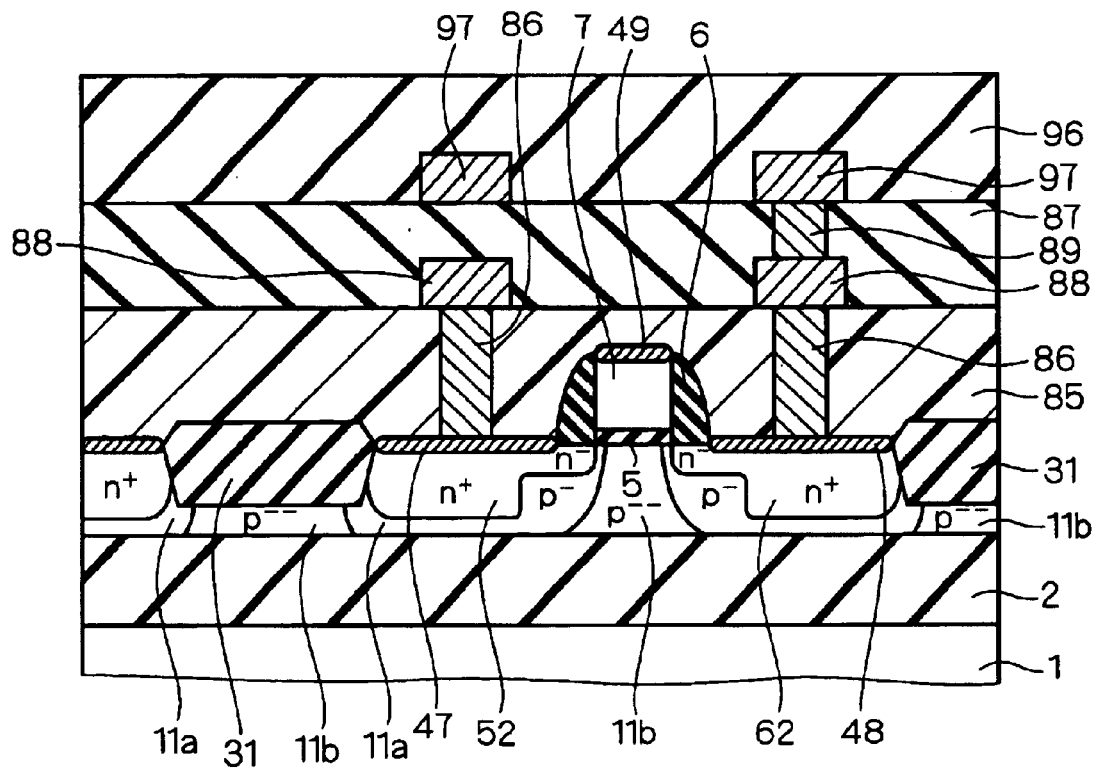
FIGS. 53 to 57 are sectional views showing a complete isolation flow.

As shown in FIG. 53, subsequently, a connecting hole (via hole) with a metal wiring to be a second metal is formed and a tungsten layer 89 is buried therein in the same manner as a contact. Then, an aluminum wiring layer 97 to be a second metal is formed in the same manner as the first metal. Thereafter, an interlayer insulating film 96 is provided over the whole surface and is flattened in the same manner as the interlayer insulating film 87.

Subsequently, in the case of a device requiring a metal wiring having a third metal or more, the step shown in FIG. 52 or 53 is repeated and a chip protective film (passivation film) is then provided and a window (pad) for bonding wire connection is opened. Thus, all the steps are completed.

While the Dual gate process using the n$^+$ gate and the p$^+$ gate has been described as the CMOS step, it is a matter of course that a Single gate process or a metal gate (W, Ta or the like) process may be used.

<Partial Isolation and Complete Isolation Combining Flow>

FIGS. 54 to 57 are sectional views showing a complete isolation region forming step in a method of manufacturing a semiconductor device for a partial isolation and complete isolation combination. With reference to these drawings, a partial isolation and complete isolation combination flow will be described.

Figure 54:
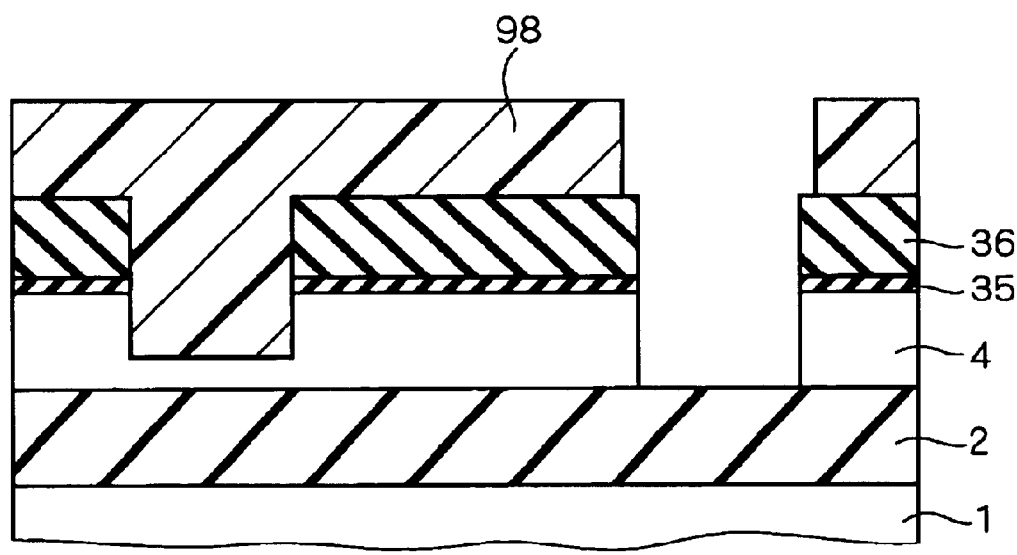

First of all, the partial isolation flow shown in FIGS. 38 to 40 is executed. As shown in FIG. 54, then, a trench 37 is additionally etched by using, as a mask, a resist 98 patterned by lithography and a portion to be completely isolated is etched through an SOI layer 4. Thus, a trench 57 reaching a buried oxide film 2 is formed.

Figure 55:
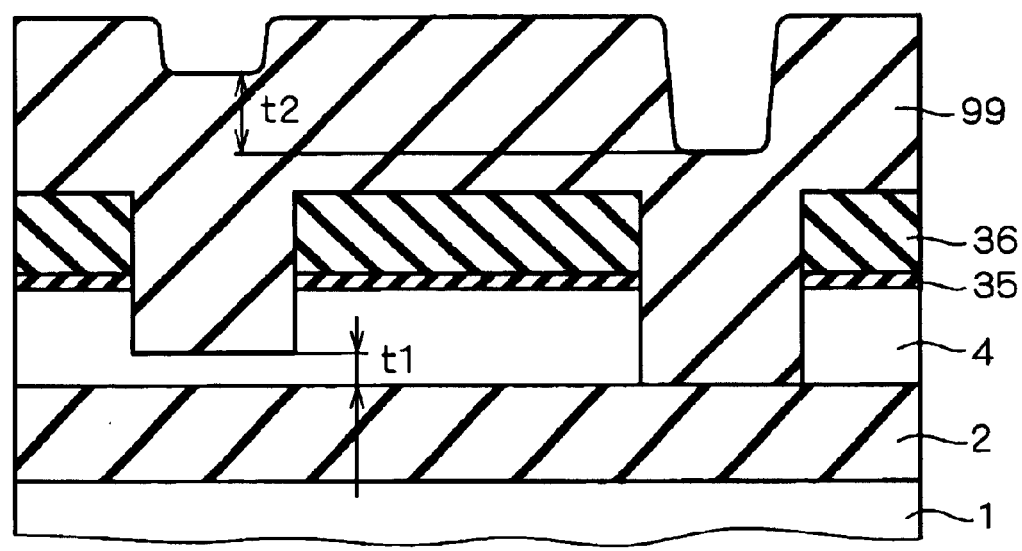
Figure 56:
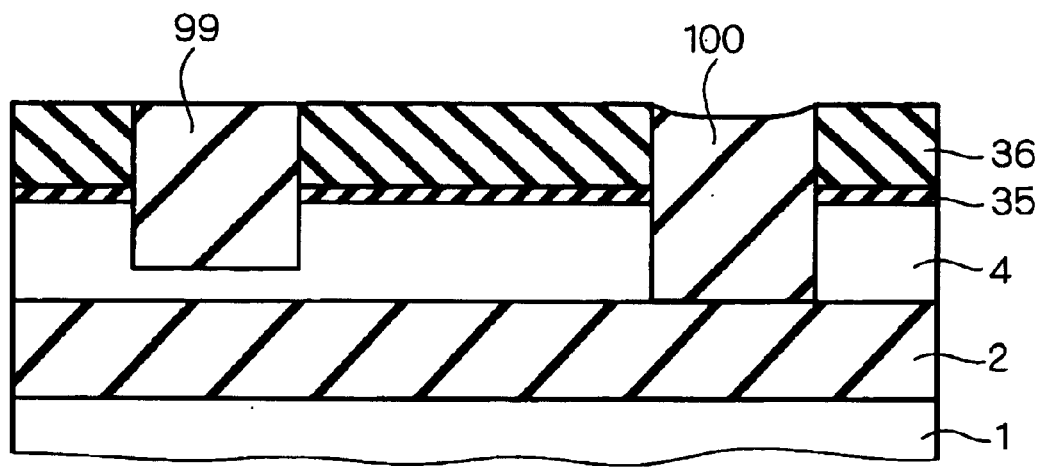

As shown in FIG. 55, next, the resist 98 is removed and an oxide film 99 is then provided over the whole surface. The oxide film 99 is deposited by using a plasma TEOS or HDP device or the like. The oxide film 99 has a thickness of approximately 100 to 500 nm. A depth of the trench 37 for a partial isolation and that of the trench 57 for a complete isolation make a difference t1. Therefore, a step t2 reflecting t1 is generated on a height of the oxide film 99 to be formed between the trench 37 and the trench 57 corresponding to t1 in the drawing.

As shown in FIG. 46, then, a surface is flattened by using a CMP device, the oxide film 99 is buried in the trench 37, and an oxide film 100 is buried in the trench 57. In a partial isolation region and a complete isolation region, however, the step t2 is generated on the oxide film 99. Therefore, dishing is generated on the complete isolation portion (oxide film 100). Thereafter, a heat treatment is carried out at a temperature of 1000° C. to 1100° C. to enhance the quality of the deposited film. Before the oxide film is provided, moreover, it is effective that an internal wall of the trench is subjected to high temperature thermal oxidation at a temperature of 900° C. to 1000° C. to round corner portions of the SOI layer 4 in upper and bottom parts of the trench because a stress can be relieved.

Figure 57:
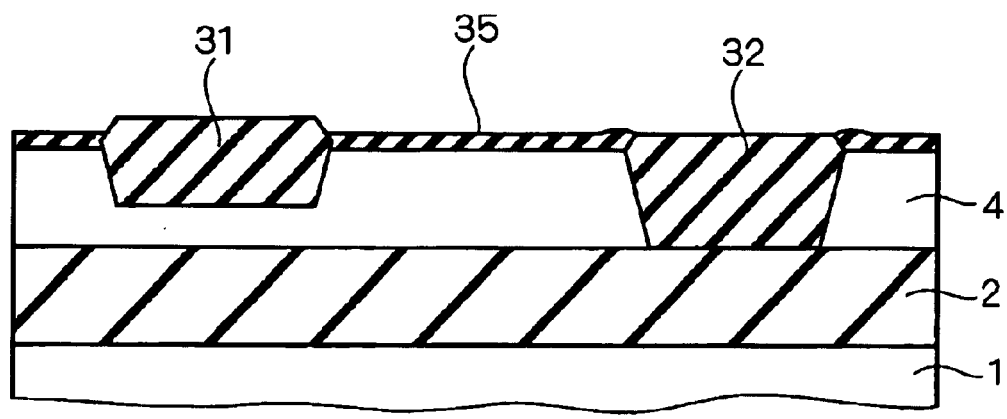

As shown in FIG. 57, next, the oxide films 99 and 100 are etched back through the RIE, the ECR or wet etching. Then, the oxide film 35 is removed by using hot phosphoric acid. As a result, the partial oxide film 31 and the complete oxide film 32 are finished, respectively. Consequently, a first element formation region isolated from the periphery through the partial oxide film 31 and a second element formation region isolated from the periphery through the complete oxide film 32 are formed. At this time, the oxide film 35 remaining on the surface (active) of the SOI layer 4 may be removed completely and a thermal oxide film or an oxide film may be provided again.

Figure 58:
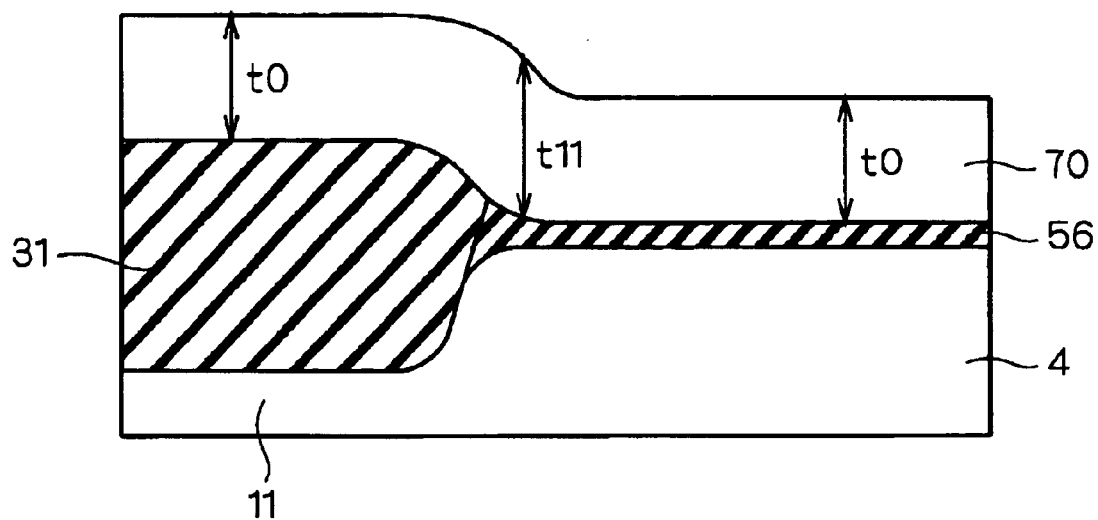
FIG. 58 is a sectional view showing a peripheral region of a partial isolation region in formation of a polysilicon layer for a gate electrode.

FIG. 58 is a sectional view showing a peripheral region of the partial isolation region in the formation of a polysilicon film 70 for the gate electrode 7. As shown in FIG. 58, in the case in which the polysilicon layer 70 is formed with a thickness t0, a vicinity region of an edge of the partial oxide film 31 has a thickness t11 (>t0) reflecting a comparatively great step generated between the partial oxide film 31 and the oxide film 56.

Figure 59:
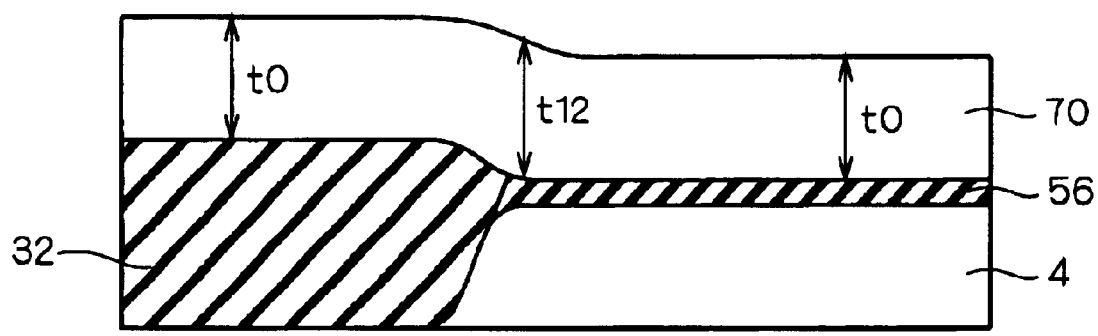
FIG. 59 is a sectional view showing a peripheral region of a complete isolation region in the formation of the polysilicon layer for the gate electrode.

FIG. 59 is a sectional view showing a peripheral region of the complete isolation region in the formation of the polysilicon film 70 for the gate electrode 7. As shown in FIG. 59, in the case in which the polysilicon layer 70 is formed with the thickness t0, a vicinity region of an edge of the partial oxide film 32 has a thickness t12 (>t0) reflecting a comparatively small step generated between the complete oxide film 32 and the oxide film 56.

In the partial oxide film 31 for a partial isolation and the complete oxide film 32 for a complete isolation, thus, respective isolation edge shapes are different from each other so that the step generated between the partial oxide film 31 and the oxide film 56 is greater than the step generated between the complete oxide film 32 and the oxide film 56. Consequently, t11>t12 is established.

Accordingly, when the polysilicon layer 70 is to be etched in order to obtain the gate electrode 7 shown in FIG. 45, an etching parameter such as a time required for the etching is determined such that a maximum thickness t11 portion in the polysilicon layer 70 can be removed reliably.

For this reason, a thickness t12 portion is subjected to over-etching corresponding to (t11–t12) so that an etching damage (plasma damage) is increased. As a result, there is a possibility that the reliability of the oxide film 56 to be a gate oxide film in the vicinity region of the edge of the complete oxide film 32 might be deteriorated.

In the H gate electrode, more isolation edge portions than in a normal gate are covered with the "I" portion. Therefore, it is possible to prevent the reliability of the gate oxide film in the isolation edge portion from being deteriorated.

More specifically, the isolation edge portion to be easily damaged is effectively reduced through the formation of the H gate electrode. In a transistor fabricated in the complete isolation region having the low isolation edge shape, moreover, there is a possibility that an increase in a leakage current generated by a local parasitic MOS might be caused by a drop in a threshold voltage due to a reduction in the thickness of the gate oxide film. This problem can also be solved through the H gate electrode according to the present invention.

At subsequent steps, for example, any of PDSOI-MOSFETs of types 1 to 7 is formed on a first element formation region isolated by a partial isolation region and any of PDSOI-MOSFETs of types A to F is formed on a second element isolation region isolated by a complete isolation region in the same manner as in the steps shown in FIGS. 42 to 54 of the partial isolation flow. Thus, the semiconductor device according to the sixth embodiment is finished.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device having an SOI structure including a semiconductor substrate, a buried insulating layer and an SOI layer, comprising:

a MOS transistor provided in an element formation region of said SOI layer; and a partial isolation region provided in said SOI layer and serving to isolate said element formation region, said partial isolation region including a partial insulating film provided in an upper layer portion of said SOI layer and a partial insulating film lower semiconductor region to be a part of said SOI layer present in a lower layer portion of said SOI layer, said MOS transistor including:

source and drain regions of a first conductivity type selectively formed in said SOI layer, respectively;

a gate electrode having a gate electrode main part formed through a gate oxide film on a region of said SOI layer between said source and drain regions; and a body region having a body region main part to be a region of a second conductivity type of said SOI layer between said source and drain regions and a body region potential setting portion electrically connected from said body region main part in said element formation region and capable of externally fixing an electric potential, wherein said body region potential setting section includes a body region source/drain adjacent portion which is adjacent to said source and drain regions in a gate width direction and which extends from said body region main part in a gate length direction, said gate electrode further includes a gate extension region extended in said gate length direction from an end of said gate electrode main part and formed on a part of said body region source/drain adjacent portion, and serving to electrically block said body region source/drain adjacent portion and said source and drain regions through said gate extension region, and a thickness of said partial insulating film lower semiconductor region is thinner than a thickness of said source and drain regions.

2. The semiconductor device according to claim 1, wherein said body region source/drain adjacent portion includes a first body region source/drain adjacent portion extended in a first direction from said body region main part and a second body region source/drain adjacent portion extended in a second direction opposite to said first direction from said body region main part, and said gate extension region includes a first gate extension region fanned on a vicinity of said first body region source/drain adjacent portion and a second gate extension region extended on a vicinity of said second body region source/drain adjacent portion.

3. The semiconductor device according to claim 1, wherein said body region source/drain adjacent portion includes one body region source/drain adjacent portion, and said gate extension region includes one gate extension region formed on a vicinity of said body region source/drain adjacent portion.

4. The semiconductor device according to claim 1, wherein said body region source/drain adjacent portion has a high concentration region having a higher impurity concentration of a second conductivity type than that in other regions over a region provided apart from said gate extension region by a predetermined distance.

5. The semiconductor device according to claim 1, wherein said gate extension region includes a gate extension region having an impurity concentration of the second conductivity type of $5 \times 10^{18}$ cm$^{-3}$ or less.

6. The semiconductor device according to claim 1, wherein said body region potential setting portion includes a semiconductor region for body fixation of the second conductivity type formed together with said source region.

7. The semiconductor device according to claim 1, wherein said partial isolation film lower semiconductor region has the second conductivity type and is formed in contact with said body region, said semiconductor device further comprising:

an element formation region outside body region of a first conductivity type provided outside said clement formation region of said SOI layer and being capable of externally fixing an electric potential, said element formation region outside body region being formed in contact with said partial insulating film lower semiconductor region.

8. The semiconductor device according to claim 1, wherein said source and drain regions have such depths as to reach said buried insulating layer.

9. The semiconductor device according to claim 1, wherein said source and drain regions have such depths that a depletion layer extended from said source and drain regions does not reach said buried insulating layer during a normal operation.

10. The semiconductor device according to claim 1, wherein said source and drain regions have such depths that said buried insulating layer is not reached and a depletion layer extended from said drain region reaches said buried insulating layer during a normal operation.

11. The semiconductor device according to claim 1, wherein said drain region has a greater depth than that of said source region and has such a depth that a depletion layer extended from said drain region reaches said buried insulating layer during a normal operation.

* * * * *